(12) United States Patent
Ringer et al.

(10) Patent No.: US 9,045,039 B2
(45) Date of Patent: Jun. 2, 2015

(54) HYDRAULIC RESERVOIR ASSEMBLY FOR A CROP SPRAYER

(75) Inventors: Chad A Ringer, Trafalgar, IN (US); Justin Honegger, Plainfield, IN (US); Ryan Larsh, Bargersville, IN (US); Jarrett Waters, Camby, IN (US)

(73) Assignee: ET Works, LLC, Mooresville, IN (US)

( * ) Notice: Subject to any disclaimer, the term of this patent is extended or adjusted under 35 U.S.C. 154(b) by 906 days.

(21) Appl. No.: 13/189,494

(22) Filed: Jul. 23, 2011

(65) Prior Publication Data
US 2012/0266981 A1    Oct. 25, 2012

Related U.S. Application Data

(60) Provisional application No. 61/477,990, filed on Apr. 21, 2011, provisional application No. 61/507,885, filed on Jul. 14, 2011.

(51) Int. Cl.
| | | |
|---|---|---|
| A01G 25/09 | (2006.01) | |
| B60K 13/04 | (2006.01) | |
| F16J 12/00 | (2006.01) | |
| A01M 7/00 | (2006.01) | |
| B60K 5/12 | (2006.01) | |
| B60K 11/00 | (2006.01) | |
| B60R 3/00 | (2006.01) | |
| B62D 33/06 | (2006.01) | |
| B60G 9/02 | (2006.01) | |
| F01N 13/08 | (2010.01) | |
| B60G 5/02 | (2006.01) | |

(52) U.S. Cl.
CPC ............... *B60K 13/04* (2013.01); *F16J 12/00* (2013.01); *A01M 7/00* (2013.01); *A01M 7/0042* (2013.01); *B60K 5/12* (2013.01); *B60K 11/00* (2013.01); *B60G 5/02* (2013.01); *B60R 3/00* (2013.01); *B62D 33/0617* (2013.01); *B60G 9/02* (2013.01); *B60G 2300/08* (2013.01); *F01N 13/08* (2013.01); *F01N 2340/04* (2013.01); *H01L 2924/0002* (2013.01)

(58) Field of Classification Search
CPC ............................. A01G 25/092; A01G 25/09
USPC ................ 239/159, 163, 172, 650–651, 653, 239/722–723, 726–727
See application file for complete search history.

(56) References Cited

U.S. PATENT DOCUMENTS

| | | | |
|---|---|---|---|
| 3,976,302 A | | 8/1976 | Hammarstrand |
| 4,441,655 A | | 4/1984 | Blumhardt |
| 4,512,589 A | | 4/1985 | Ambrose et al. |
| 4,683,684 A | * | 8/1987 | Yie .................................. 451/92 |
| 5,098,018 A | * | 3/1992 | Hadar et al. .................... 239/77 |
| 5,180,190 A | * | 1/1993 | Kersey et al. ................. 280/838 |
| 5,267,696 A | * | 12/1993 | Balmer .......................... 239/662 |
| 5,284,349 A | | 2/1994 | Bruns et al. |
| 5,368,332 A | * | 11/1994 | Dittrich et al. ............... 280/838 |
| 5,597,172 A | | 1/1997 | Maiwald |
| 5,918,808 A | | 7/1999 | Weddle |
| 6,056,210 A | | 5/2000 | Weddle |

(Continued)

*Primary Examiner* — Davis Hwu

(74) *Attorney, Agent, or Firm* — Maginot, Moore & Beck LLP

(57) ABSTRACT

A crop sprayer includes a main frame. A product tank is supported by the main frame that is configured to contain a first quantity of fluid therein. A cab is supported by the main frame that includes a trailing wall structure positioned in relation to the product tank so as to define a reservoir space therebetween A hydraulic reservoir assembly is positioned in the reservoir space.

10 Claims, 54 Drawing Sheets

(56) References Cited

U.S. PATENT DOCUMENTS

| | | |
|---|---|---|
| 6,382,554 B1 | 5/2002 | Weddle |
| 6,454,294 B1 | 9/2002 | Bittner et al. |
| 7,150,419 B1 * | 12/2006 | Tomlonovic et al. ......... 239/722 |
| 7,237,636 B2 | 7/2007 | Ruppert et al. |
| 7,293,723 B2 * | 11/2007 | Niemela et al. ............... 239/672 |
| 7,438,305 B2 * | 10/2008 | Schulz .......................... 280/166 |
| 7,563,199 B2 | 7/2009 | Ringer |
| 7,775,168 B2 * | 8/2010 | Sidhwa et al. ................ 111/118 |
| 7,837,207 B2 | 11/2010 | Kremin et al. |
| 7,896,062 B2 | 3/2011 | Adamson et al. |
| 2004/0195357 A1 * | 10/2004 | Doherty et al. ............... 239/172 |
| 2006/0144970 A1 * | 7/2006 | Hagie ........................... 239/664 |
| 2009/0167057 A1 | 7/2009 | Walter et al. |
| 2010/0019060 A1 * | 1/2010 | Bittner ......................... 239/172 |
| 2010/0326755 A1 | 12/2010 | Husson et al. |

* cited by examiner

HYDRAULIC RESERVOIR ASSEMBLY FOR A CROP SPRAYER

CROSS-REFERENCE TO RELATED APPLICATIONS

This application claims priority to U.S. Provisional Application Ser. No. 61/477,990 entitled "Crop Sprayer" by Ringer et al., filed Apr. 21, 2011, and to U.S. Provisional Application Ser. No. 61/507,885 entitled "Crop Sprayer" by Ringer et al., filed Jul. 14, 2011. The disclosures of the two above-identified provisional patent applications are herein incorporated by reference in their entirety.

Cross-reference is also made to related co-pending U.S. Patent Applications entitled: (i) "Cab Entry System for A Crop Sprayer" by Ringer et al. Ser. No. 13/189,491, (ii) "Consolidated Ground Level Control System for A Crop Sprayer" by Ringer et al. Ser. No. 13/189,492, (iii) "Exhaust System Outrigger Assembly for A Crop Sprayer" by Ringer et al. Ser. No. 13/189,493, (iv) "Tank Support Assembly for A Crop Sprayer" by Ringer et al. Ser. No. 13/189,495, (v) "Cab Mounting Assembly for A Crop Sprayer" by Ringer et al. Ser. No. 13/189,496, (vi) "Pivoting Axle Suspension Assembly for A Crop Sprayer" by Ringer et al. Ser. No. 13/189,497, and (vii) "Cooling System Assembly for A Crop Sprayer" by Ringer et al., Ser. No. 13/189,499. Each of the seven above-identified patent applications is being filed concurrently herewith. The disclosures of the seven above-identified patent applications are herein incorporated by reference in their entirety.

TECHNICAL FIELD

The present invention relates generally to hydraulic drive systems of crop sprayers, and more particularly to hydraulic reservoir assemblies for hydraulic drive systems of crop sprayers.

BACKGROUND

In general, self-propelled row crop sprayers, referred to herein as crop sprayers, are a type of agricultural vehicle used to distribute chemicals, such as herbicides, pesticides, and fertilizer, over rows of crops in a field. The various systems and components of the crop sprayer, such as a cab, engine, fluid storage tanks, pumping systems, and boom spraying systems are mounted on top of a longitudinal main frame. The main frame in turn is supported a predetermined distance above the ground by wheels to provide sufficient ground clearance for the crop sprayer to pass over crops, such as corn and soybeans, during spraying.

Crop sprayers typically include a hydraulic drive system that is used to power various hydraulic systems of the crop sprayer, such as the steering system, the boom arm positioning system of the sprayer assembly, and the sprayer pump. The hydraulic drive system comprises a hydraulic circuit that includes, inter alia, a hydraulic pump, hydraulic actuators, and a hydraulic reservoir fluidly coupled by piping. The hydraulic pump is driven by the engine of the crop sprayer to generate hydraulic pressure in the circuit. The hydraulic actuators convert the hydraulic pressure and flow into torque and angular displacement for powering the various hydraulic systems.

The hydraulic reservoir contains hydraulic fluid for the hydraulic drive system. The hydraulic reservoir may be equipped with filters for filtering the hydraulic fluid, openings for filling and draining the reservoir, and a sight glass that enables the interior of the reservoir to be observed by the operator. Various factors must be taken into consideration in the design of hydraulic reservoirs for use on crop sprayers. For example, the hydraulic reservoir must be capable of holding a sufficient volume of hydraulic fluid for powering the various hydraulic systems. The reservoir must be located at a position that enables the sight glass, filters, and the openings for filling and draining the reservoir to be accessible by the operator. The hydraulic reservoir must also be capable of withstanding the vibrations and impacts associated with the operation of the crop sprayer.

The spaces available for mounting and supporting a sufficiently sized large hydraulic reservoir on the crop sprayer and that also allow access to the sight glass, filters, and fill and drain openings of the reservoir, however, are limited due to the arrangement and mounting requirements of the other systems and components of the crop sprayer. Accordingly, there is a need for a hydraulic reservoir that is capable of holding sufficient hydraulic fluid for powering all of the hydraulic systems of a crop sprayer, that is capable of being mounted to the main frame of a crop sprayer that allows access to the filter, sight glass, and fill and drain openings of the reservoir, and that is capable of withstanding the impacts and vibrations associated with the use of a crop sprayer.

SUMMARY

In accordance with one embodiment, a crop sprayer comprises a main frame. A product tank is supported by the main frame that is configured to contain a first quantity of fluid therein. A cab is supported by the main frame that includes a leading wall structure including a window, a trailing wall structure positioned in relation to the product tank so as to define a reservoir space therebetween, a left lateral wall structure including a first door, and a right lateral wall structure including a second door. The leading wall structure, trailing wall structure, left lateral wall structure, and right lateral wall structure collectively define an operator space. A first platform having a first generally horizontally oriented foot support is positioned adjacent to the first door. A second platform having a second generally horizontally oriented foot support is positioned adjacent to the second door. A hydraulic reservoir assembly contain a second quantity of fluid therein is positioned in the reservoir space.

DETAILED DESCRIPTION

Figure 1:
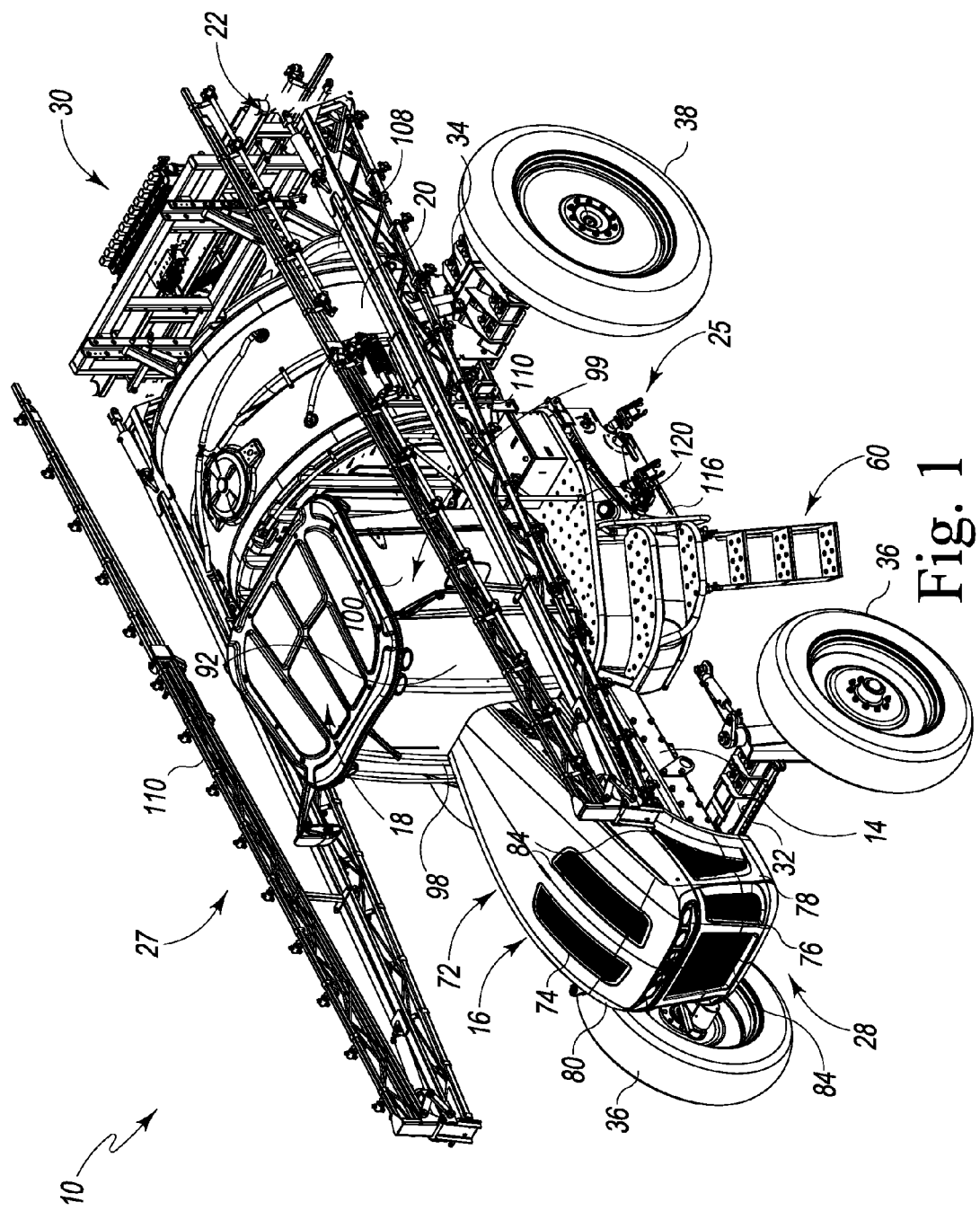
FIG. 1 depicts a perspective view of an embodiment of a crop sprayer.

For the purposes of promoting an understanding of the principles of the invention, reference will now be made to the embodiments illustrated in the drawings and described in the following written specification. It is understood that no limitation to the scope of the invention is thereby intended. It is further understood that the present invention includes any alterations and modifications to the illustrated embodiments and includes further applications of the principles of the invention as would normally occur to one of ordinary skill in the art to which this invention pertains.

Referring to FIGS. 1-6, a crop sprayer 10 in accordance with the present disclosure includes a main frame 14 that supports an engine compartment 16, a cab 18, a fluid storage tank 20, and a boom spraying system 22. The main frame 14 (FIG. 4) of the crop sprayer 10 defines a central longitudinal axis L (FIG. 3) that extends between a front portion 28 and rear portion 30 of the crop sprayer. The front portion 28 faces in a forward direction F, and the rear portion 30 faces in a rearward direction B. The crop sprayer 10 also includes a left lateral side 25 that faces in a first lateral direction Y and a right lateral side 27 that faces in a second lateral direction R.

Figure 4:
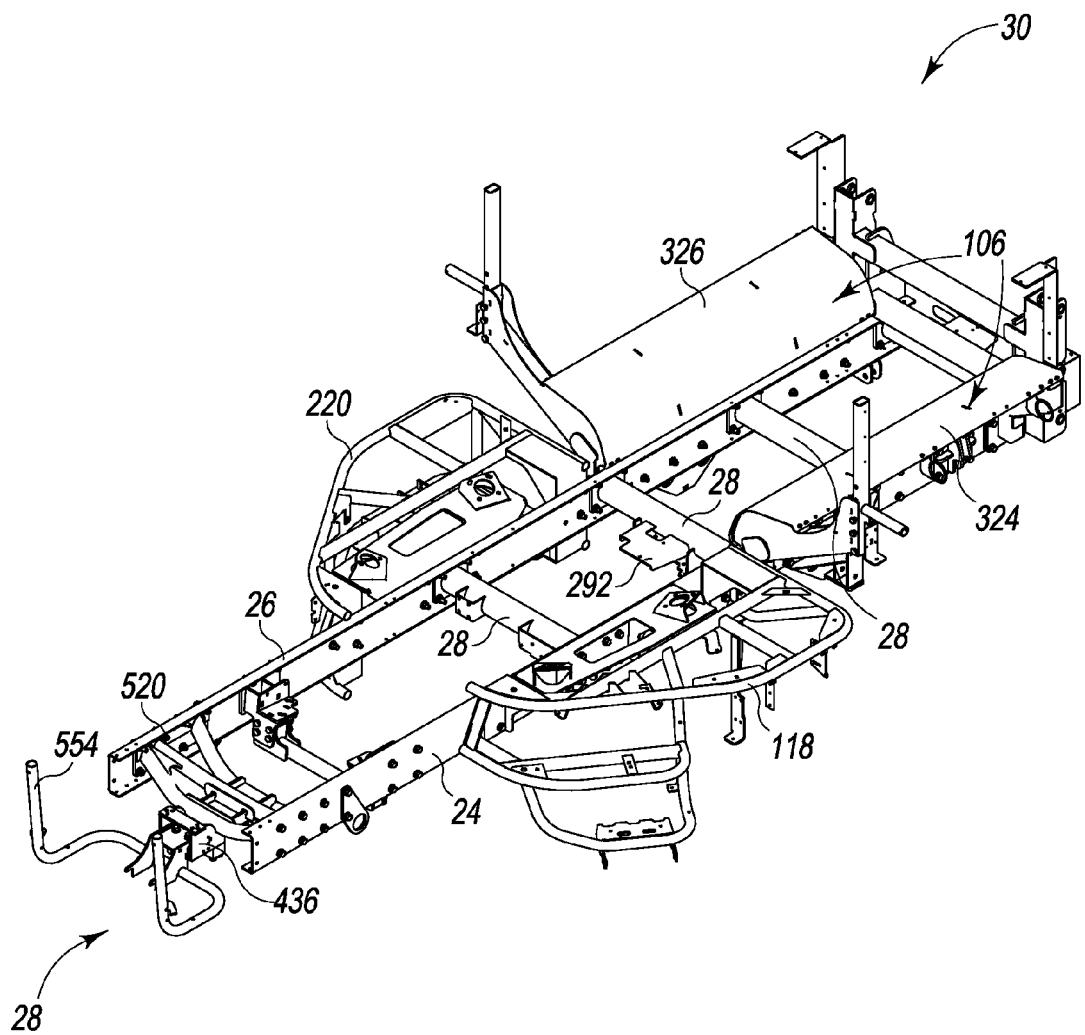
FIG. 4 is a perspective view of the main frame of the crop sprayer of FIG. 1.

As depicted in FIG. 4, the main frame 14 includes a pair of spaced-apart main frame rails 24, 26 connected to each other along their length by a plurality of cross-beams 28. The main frame rails 24, 26 extend longitudinally between the front portion 28 and rear portion 30 of the crop sprayer 10. The main frame 14 is supported on a front axle assembly 32 (e.g., FIG. 1) and a rear axle assembly 34 (e.g., FIG. 1). The front axle assembly 32 includes a pair of front wheels 36, and the rear axle assembly 34 includes a pair of rear wheels 38. The wheels 36, 38 are sized to position the axles 32, 34 and main frame 14 of the crop sprayer 10 a predetermined distance 39 (FIG. 2) above ground level 40 to allow the crop sprayer 10 to pass over crops during spraying. The predetermined distance 39, also referred to as ground clearance, is typically 3'-6'.

The rear axle assembly 34 includes a rear differential (not shown) configured to transmit driving torque from the engine 44 to the rear wheels 38. The front axle assembly 32 includes a hydraulic steering mechanism (not shown) configured to provide mechanical assistance to steer the front wheels 36 and control the direction of travel. The hydraulic steering mechanism is fluidly coupled to receive pressurized hydraulic fluid from the hydraulic drive system 54 (FIG. 6) of the crop sprayer 10.

The engine compartment 16 is mounted at the front portion 28 of the main frame. The engine compartment 16 houses the engine 44 and transmission 48 of the crop sprayer. In one embodiment, the engine 44 comprises a diesel engine which is commercially available from Cummins Engine Co. Inc., of Columbus, Ind. The engine 54 includes a crankshaft 55 (e.g., FIG. 6). The transmission 48 is configured to couple the rotational energy from the crankshaft to the rear differential (not shown) via a driveshaft 46 to drive the rear wheels 38.

Figure 6:
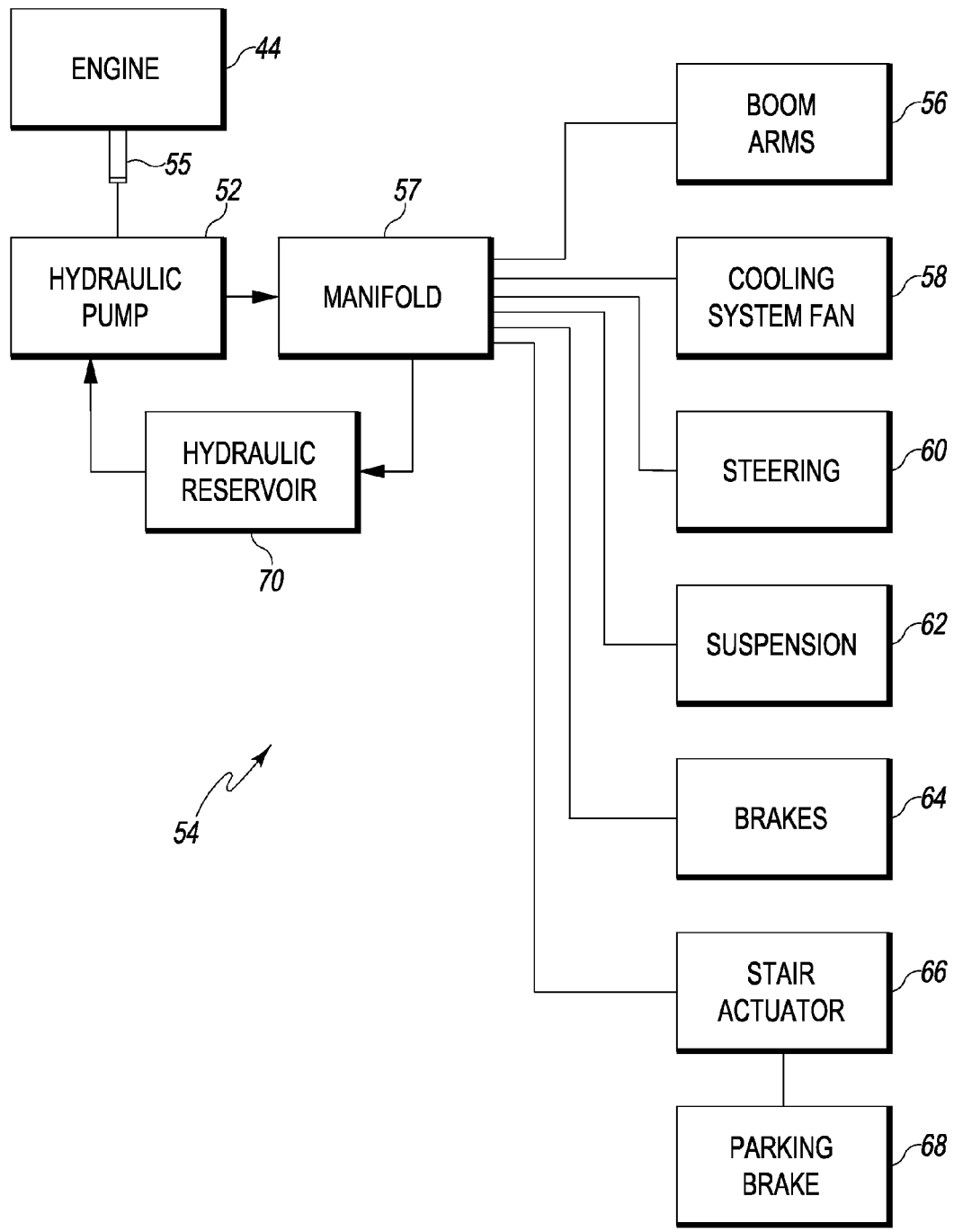
FIG. 6 is a schematic view of the hydraulic drive system of the crop sprayer of FIG. 1.
Figure 7:
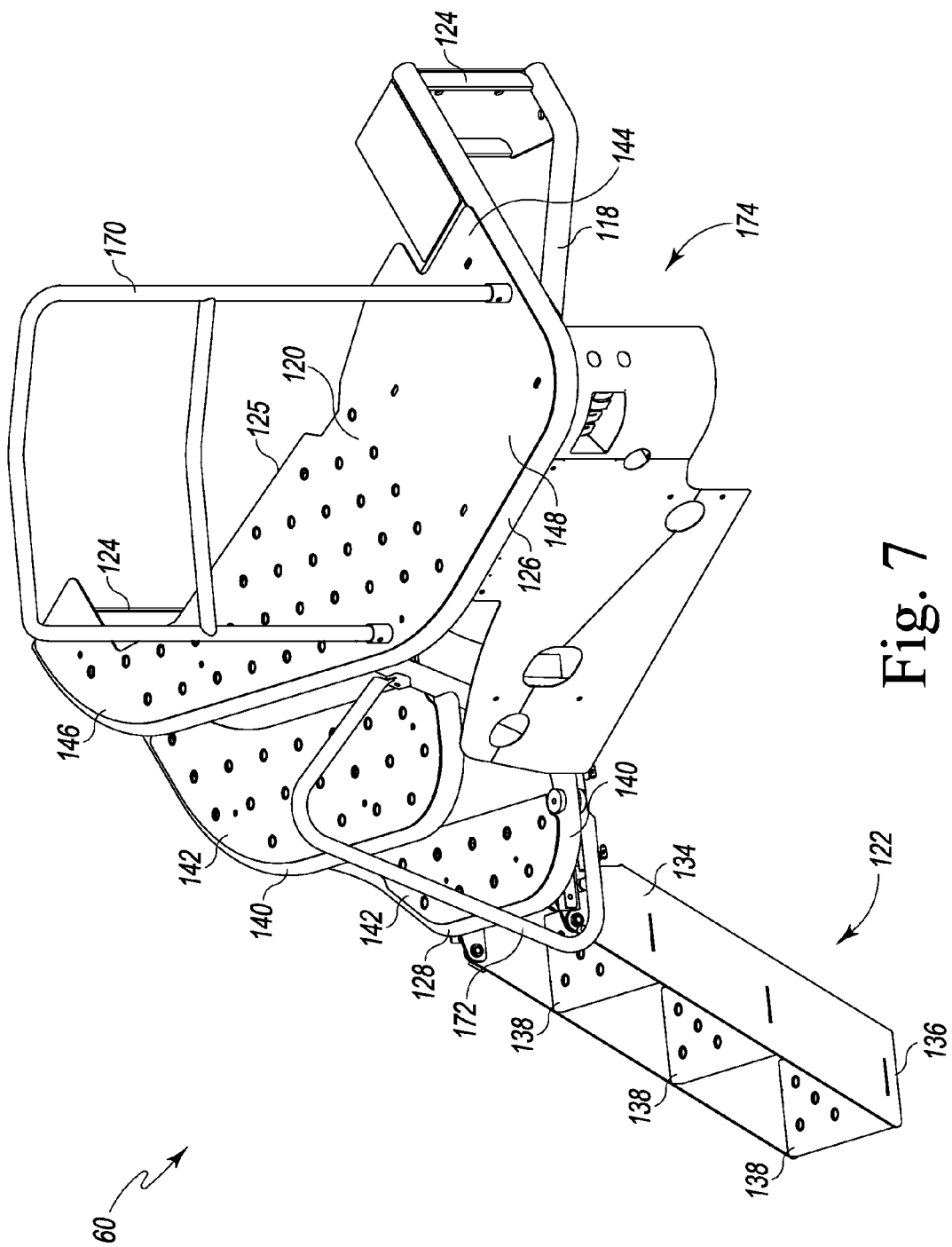
FIG. 7 is a perspective view of the cab entry assembly of the crop sprayer of FIG. 1.
Figure 8:
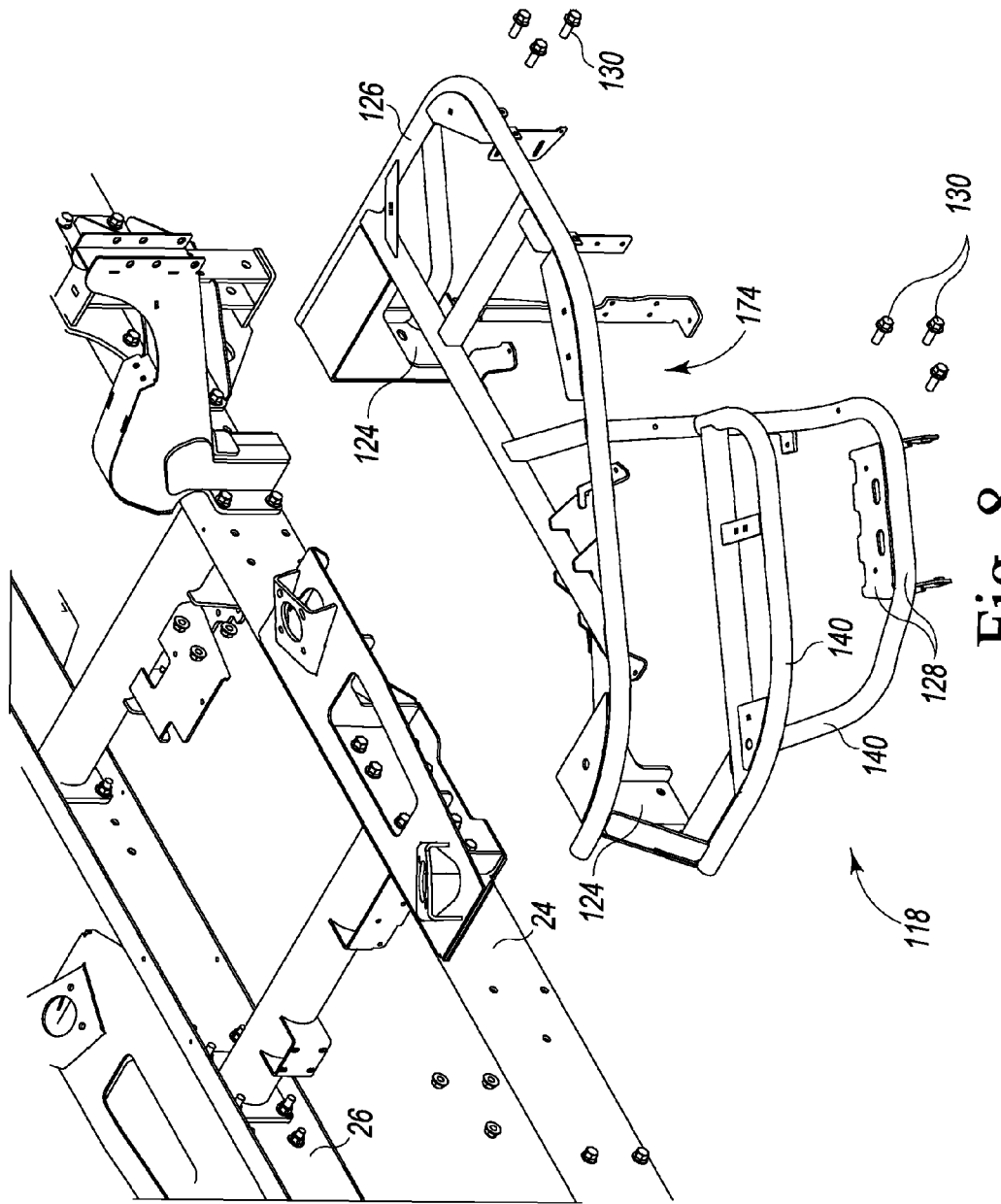
FIG. 8 is perspective view of the support framework of the cab entry assembly of FIG. 7.

The engine compartment 16 also houses a hydraulic pump 52 that is used to pressurize hydraulic fluid contained in the hydraulic drive system. As depicted in FIG. 6, the hydraulic drive system 54 provides hydraulic power for various hydraulic systems, including boom arms 56, cooling system fan 58, steering 60, suspensions 62, brakes 64, and stair actuation 66. Each hydraulic system includes at least one hydraulic actuator (not shown), such as a hydraulic cylinder, that is configured to use pressurized hydraulic fluid to perform work for the system. The hydraulic systems 56, 58, 60, 62, 64, 66 and pump 52 are fluidly coupled to each other by a system of tubes, pipes, and hoses to form a hydraulic circuit. A manifold 57 controls the supply of hydraulic fluid to the various hydraulic systems. A hydraulic reservoir 70 is fluidly coupled to the hydraulic circuit to store and supply hydraulic fluid for the hydraulic drive system 54.

Figure 5:
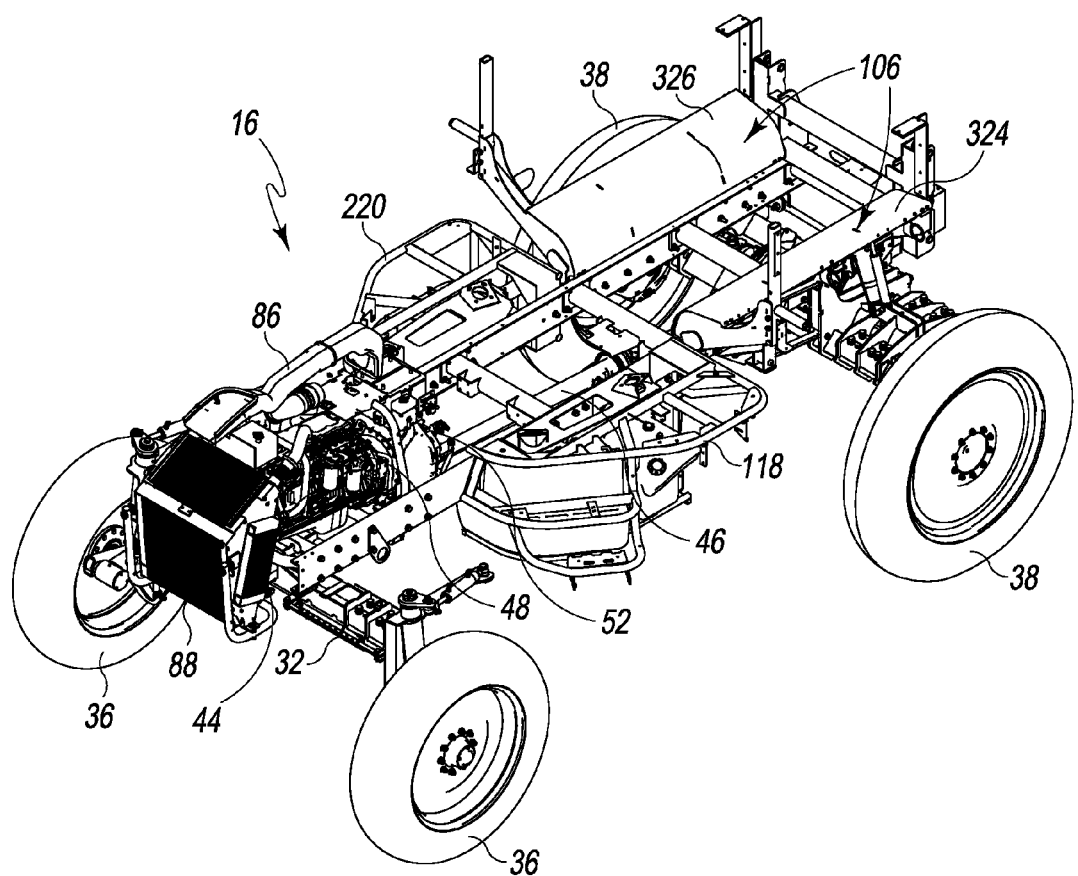
FIG. 5 is a perspective view of main frame of FIG. 4 showing the engine compartment components and front and rear axle assemblies mounted onto the main frame.

A hood assembly 72 is attached to the main frame 14 over the engine compartment 16. The hood assembly 72 includes a plurality of hood panels 74, 76, 78, 80 attached to a skeletal support frame 82. The hood panels 74, 76, 78, 80 include grills 84 that allow air to pass into the engine compartment 16. Referring to FIG. 5, an air intake assembly 86 is mounted on top of the engine 44 to direct air to the engine 44. A cooling system 88 for the crop sprayer 10 is located in the engine compartment 16 in front of the engine 44. The cooling system 88 includes a plurality of heat exchange units for cooling various fluids or gases utilized by the systems of the crop sprayer.

The controls for driving and operating the crop sprayer 10 are provided in the cab 18. The cab 18 is mounted to the main frame 14 behind the engine compartment 16. The cab includes a leading wall structure 96 that faces in the forward direction F, a trailing wall structure 98 that faces in the rearward direction B, a left lateral wall structure 92 that faces in the direction Y, and a right lateral wall structure 94 that faces in the direction R. The leading wall structure 96 includes a window or windshield. In one embodiment, the leading wall structure 96 is substantially fully glassed such that entire leading wall structure serves as the window or windshield. The trailing wall structure of the cab includes a rear window.

Figure 12:
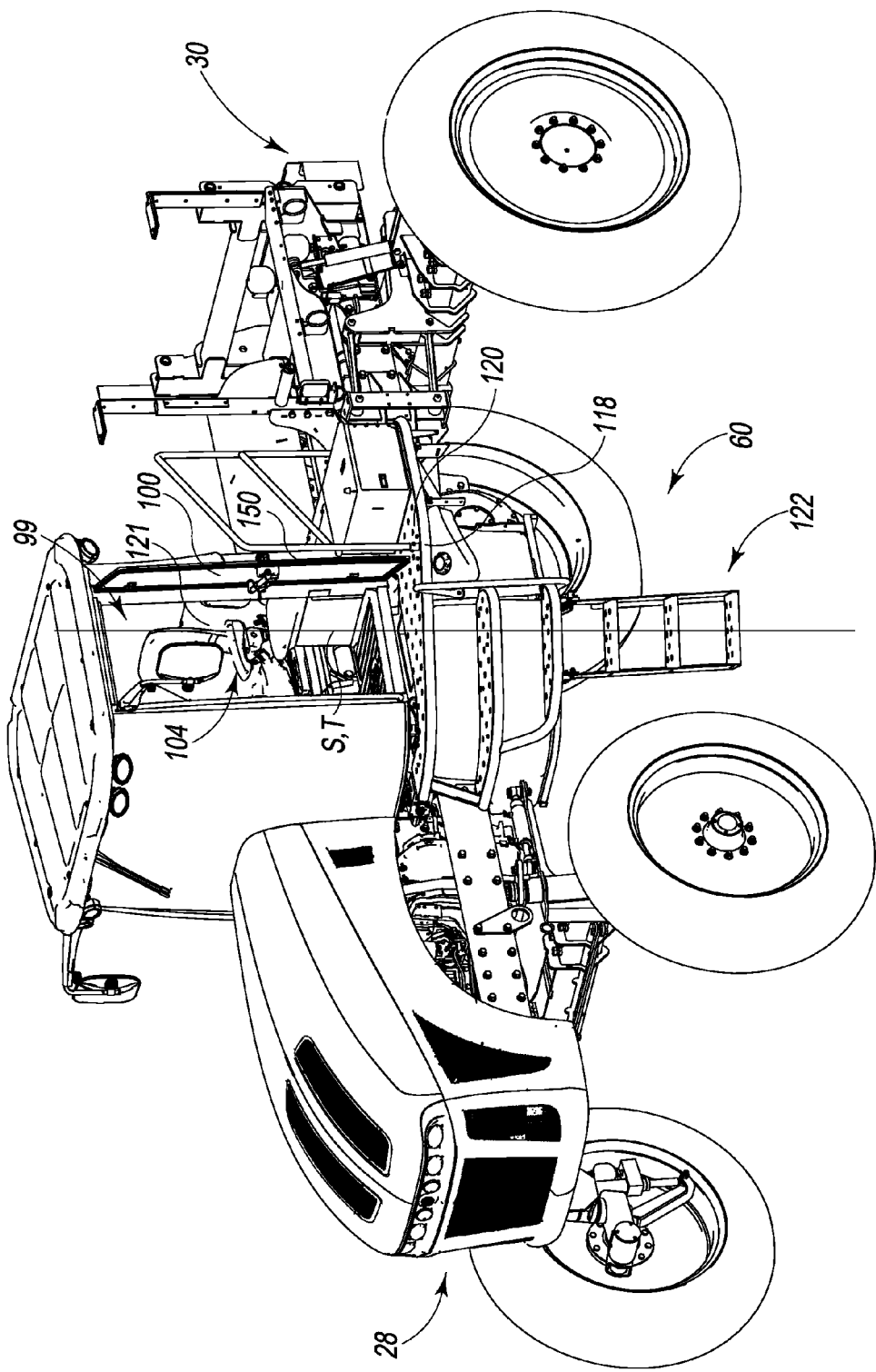
FIG. 12 is a perspective view of the crop sprayer of FIG. 11 showing the orientation of the ladder assembly in relation to the cab with the cab door open.
Figure 26:
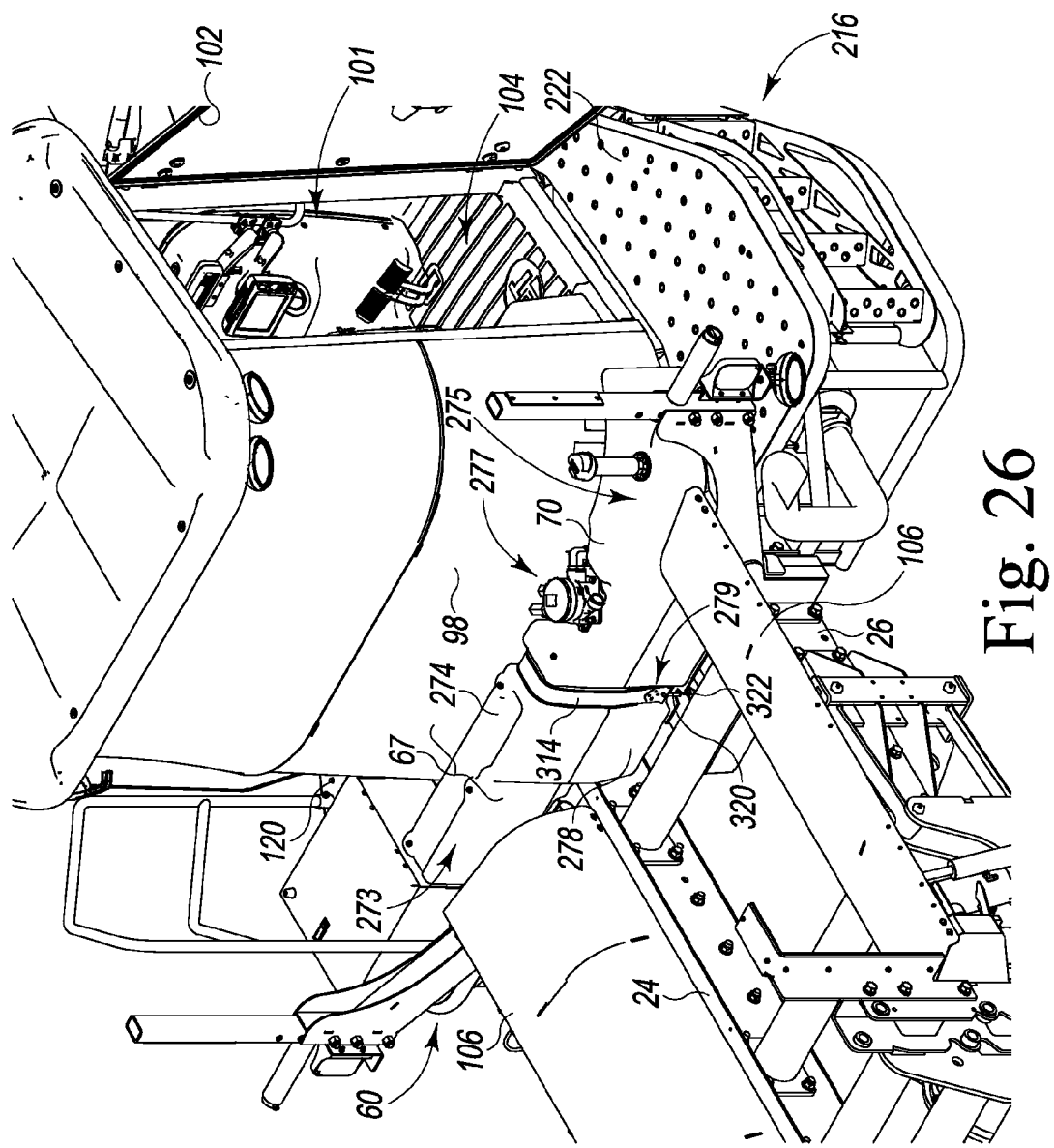
FIG. 26 is a perspective view of the crop sprayer of FIG. 1 with a portion of the crop sprayer removed to show the hydraulic reservoir assembly of FIG. 25.
Figure 27:
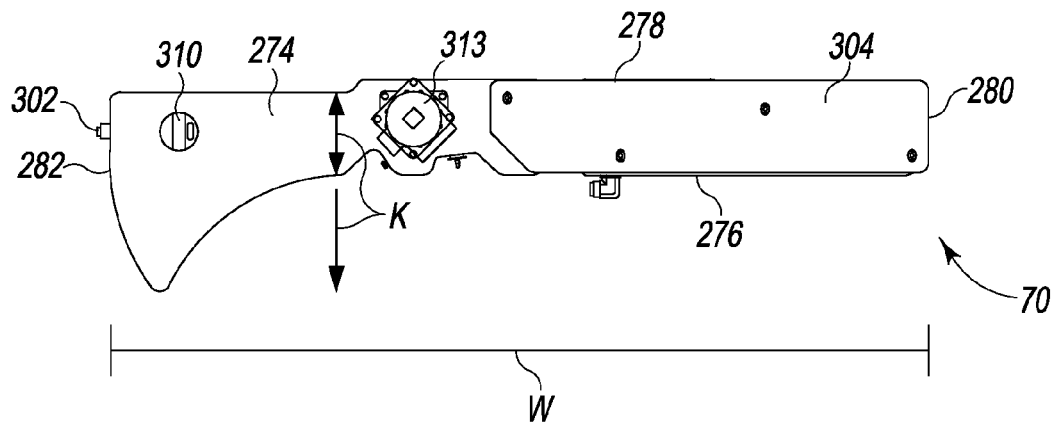
FIG. 27 is a top elevational view of the hydraulic reservoir assembly of FIG. 25.
Figure 28:
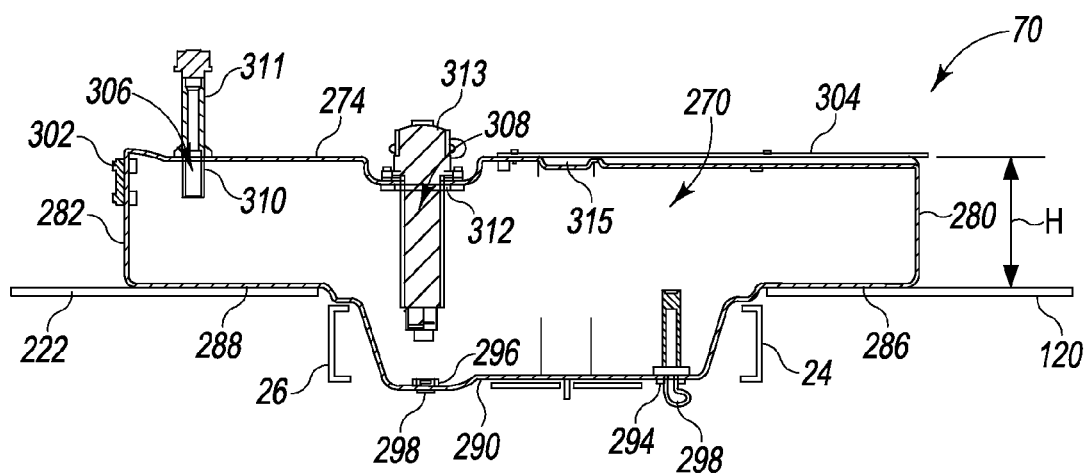
FIG. 28 is a cross-sectional view of the hydraulic reservoir of FIG. 25 taken along lines C-C of FIG. 27.
Figure 29:
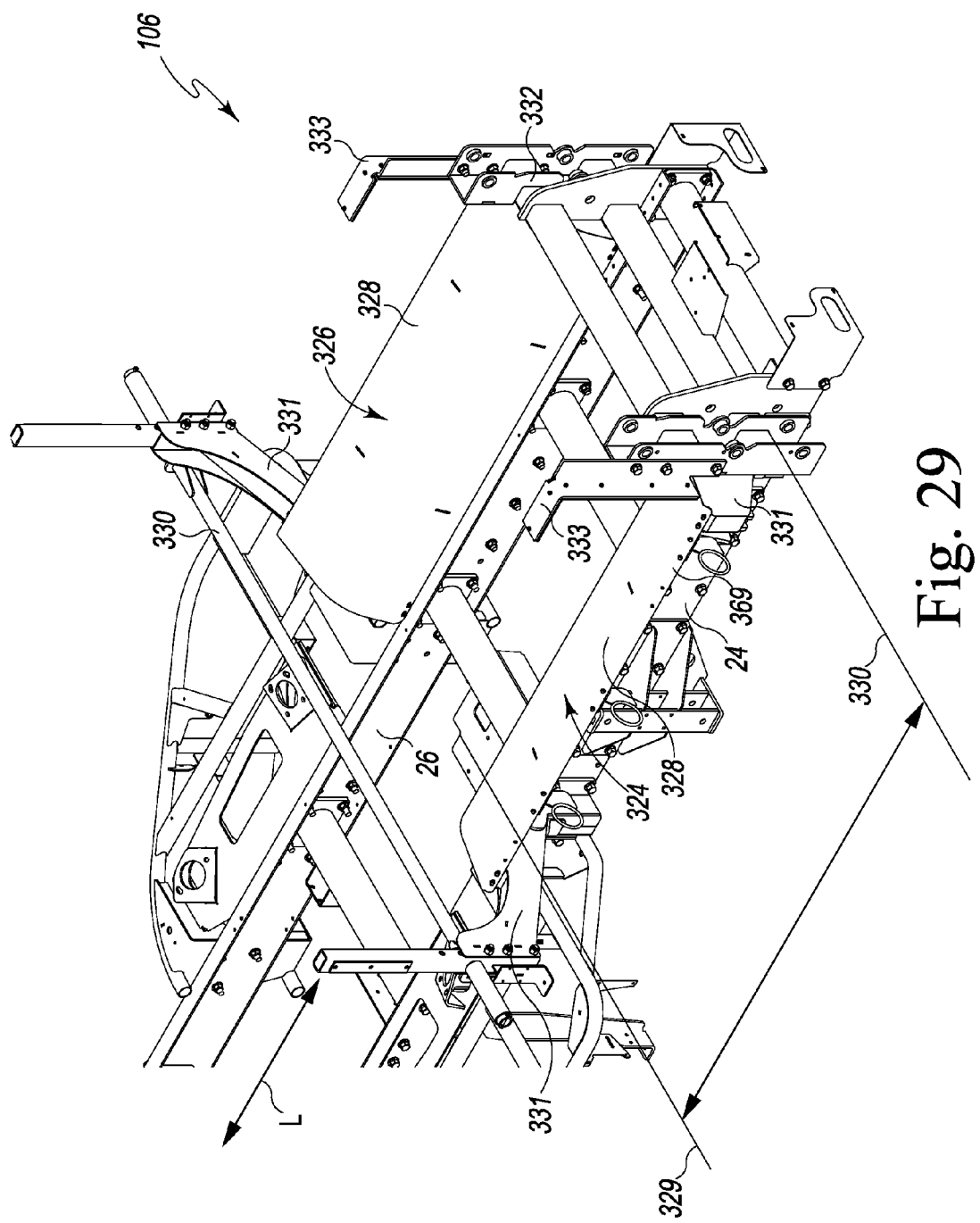
FIG. 29 is a perspective view of the tank support assembly of the crop sprayer of FIG. 1.
Figure 30:
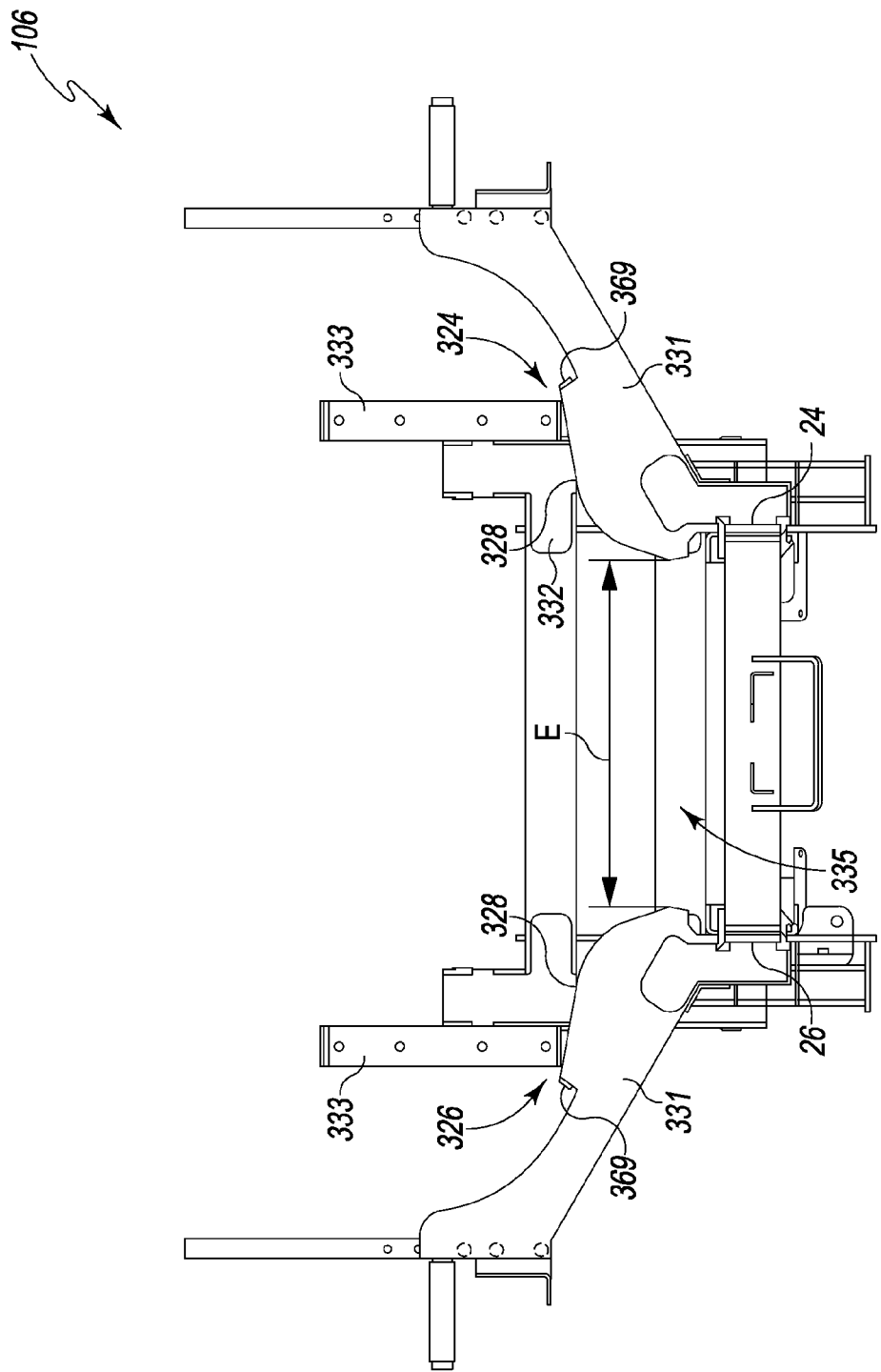
FIG. 30 is an end view of the tank support assembly of FIG. 29.

The left lateral wall structure 92 defines a first door opening 99, or first doorway (FIG. 12). A first door 100 is pivotably attached to the left lateral wall structure 92 over the doorway 99. The right lateral wall structure 94 defines a second door opening 100, or second doorway (FIG. 26). A second door 102 is pivotably attached to the right lateral wall structure 94 over the second door opening 101. The leading wall structure 96, trailing wall structure 98, left lateral wall structure 92, and right lateral wall structure 94 collectively define the cab interior, or operator space 104 (FIG. 26).

The crop sprayer 10 includes a first outrigger platform assembly mounted to the main frame 14 proximate the left lateral wall structure 92 of the cab 18. The first platform assembly includes a first generally horizontally oriented foot support, or platform member, 120 positioned adjacent the first door 100. The crop sprayer also includes a second outrigger platform assembly mounted to the main frame 14 proximate the right lateral wall structure 94 of the cab 18. The exhaust outrigger assembly 216 includes a second generally horizontally oriented foot support, or platform member, 222, positioned adjacent the second door 102.

Figure 2:
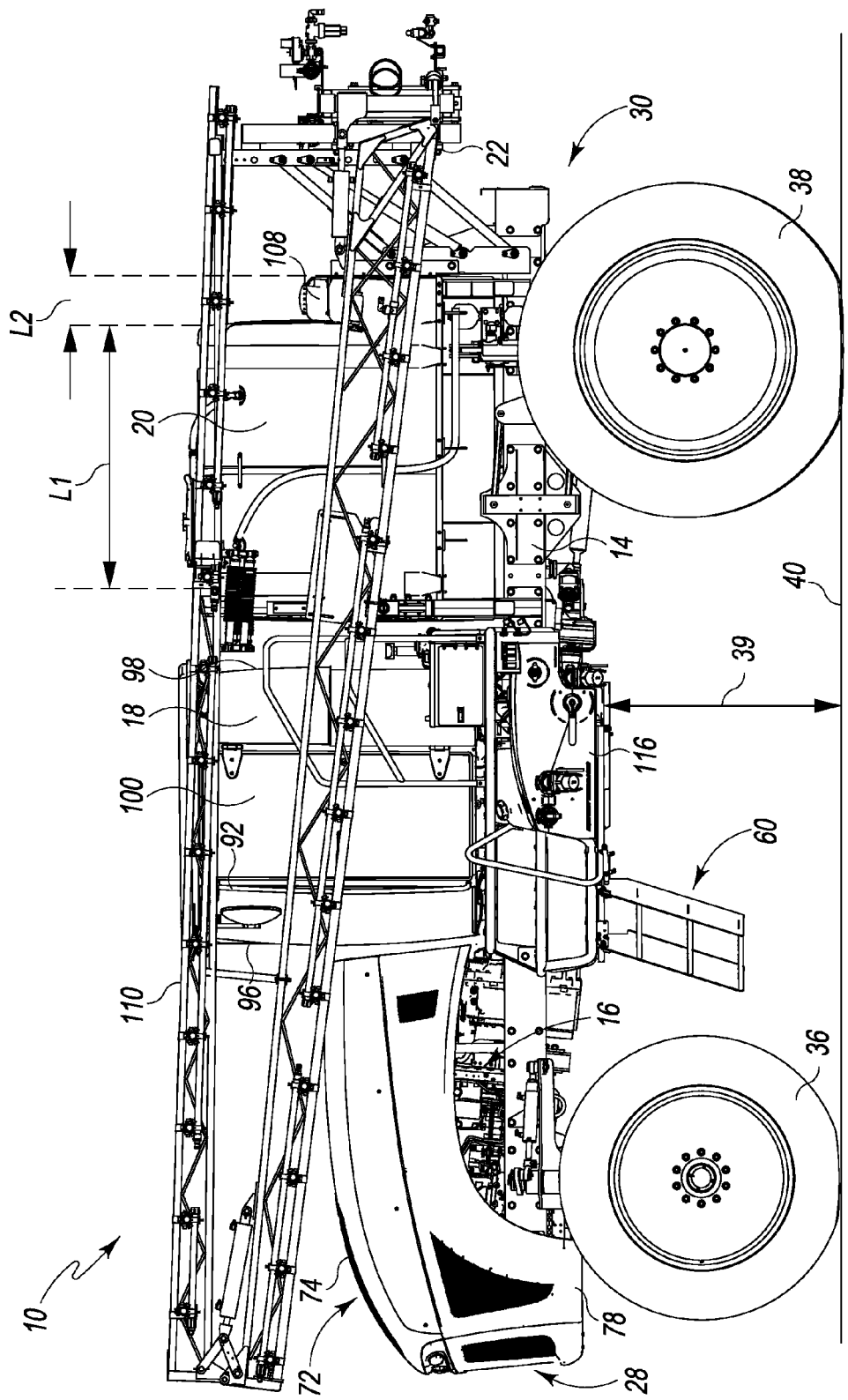
FIG. 2 depicts a right side elevational view of the crop sprayer of FIG. 1.
Figure 3:
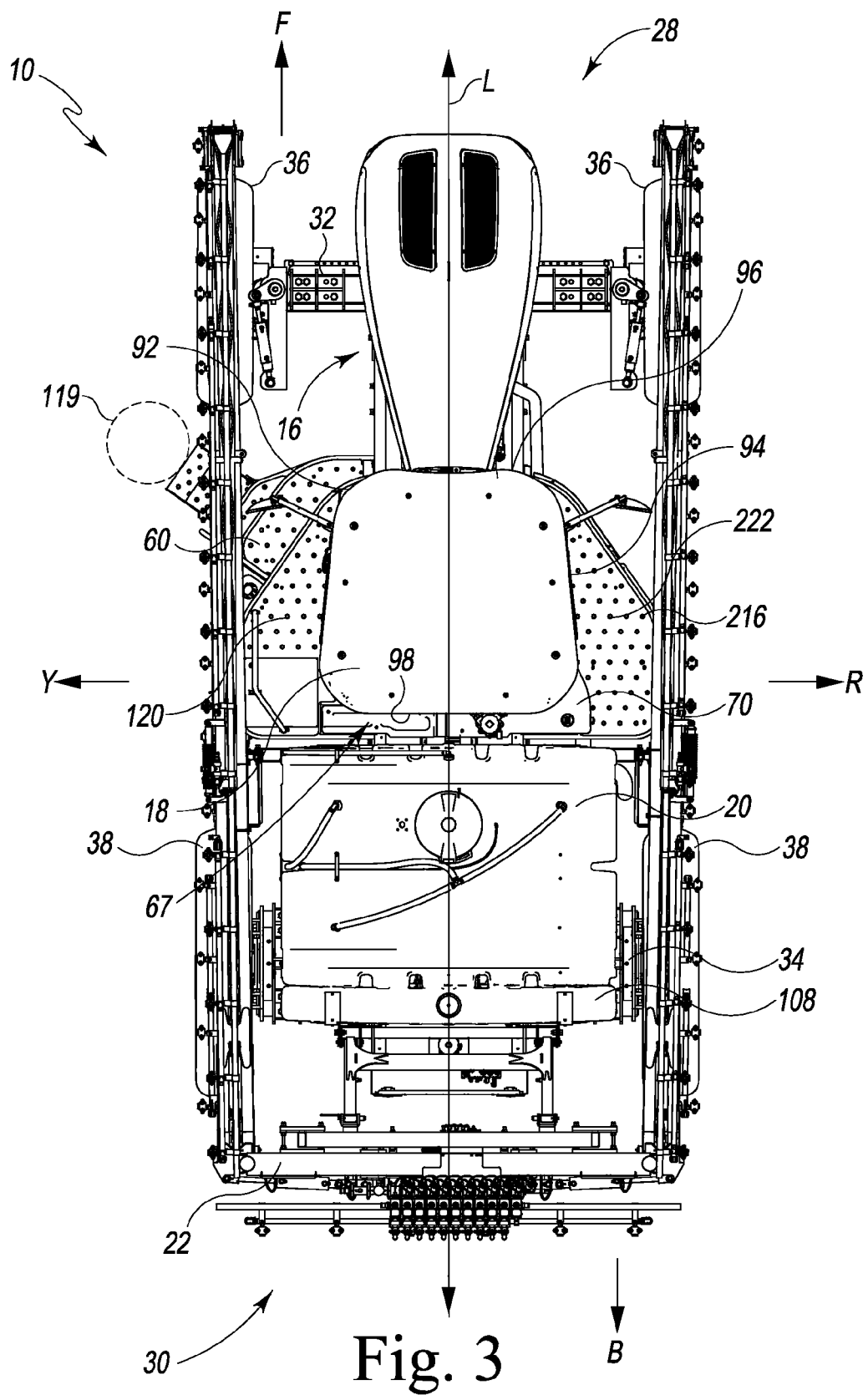
FIG. 3 is a top elevational view of the crop sprayer of FIG. 1.

The fluid storage tank 20, also referred to as a product tank, is mounted to the main frame 14 behind the cab 18 by a tank support assembly 106. The product tank 20 defines an interior cavity that is configured to contain a quantity of fluid, e.g., 700-1200 gallons, to be sprayed by the boom spraying system 22. The tank support assembly 106 is also configured to support and retain a rinse tank 108. The rinse tank 108 defines an interior cavity that is configured to contain a quantity of water, e.g., 50-200 gallons, for rinsing out the fluid lines and nozzles of the spraying system 22 as may be required. As depicted in FIG. 2, the trailing wall structure 98 of the cab 18 is positioned in relation to the tank support assembly 106 and product tank 20 to define a reservoir space 67 for receiving and mounting the hydraulic reservoir 70 to the main frame 14.

The boom spraying system 22 is mounted to the main frame 14 at the rear portion 30 of the crop sprayer. The boom spraying system 22 includes a pair of boom arms 110 that are pivotably mounted to the main frame 14. The boom arms 110 pivot between a folded position and an extended position (not shown). When the boom arms 110 are in the folded position, the boom arms 110 extend generally toward the front portion 28 of the crop sprayer 10 and are arranged adjacent each side 25, 27 of the crop sprayer. The boom arms 110 are typically placed in the folded position when not being used. In the extended position, the arms 110 extend outwardly from the main frame 14 and are arranged generally perpendicular to the longitudinal axis L of the crop sprayer. Each boom arm 110 supports a plurality of spray nozzles (not shown). The spray nozzles are fluidly coupled to the product tank 20 and the rinse tank 108 by a fluid pumping system of the crop sprayer.

Cab Entry Assembly

Referring now to FIGS. 7-13, the crop sprayer 10 includes a cab entry assembly 60 that enables an operator of the crop sprayer 10 to gain access to the cab 18 from ground level. As explained below, the cab entry assembly 60 is configured to allow an operator to travel between the cab 18 and ground level without having to change direction or maneuver around the cab door 100 when entering and exiting the cab 18. The cab entry assembly 60 creates a straight path into the cab interior that approaches the cab at an angle from the front. The cab door 100 is attached to the cab 18 so that it opens from the front and pivots toward the rear of the crop sprayer to provide an unobstructed entry into the cab.

Figure 13:
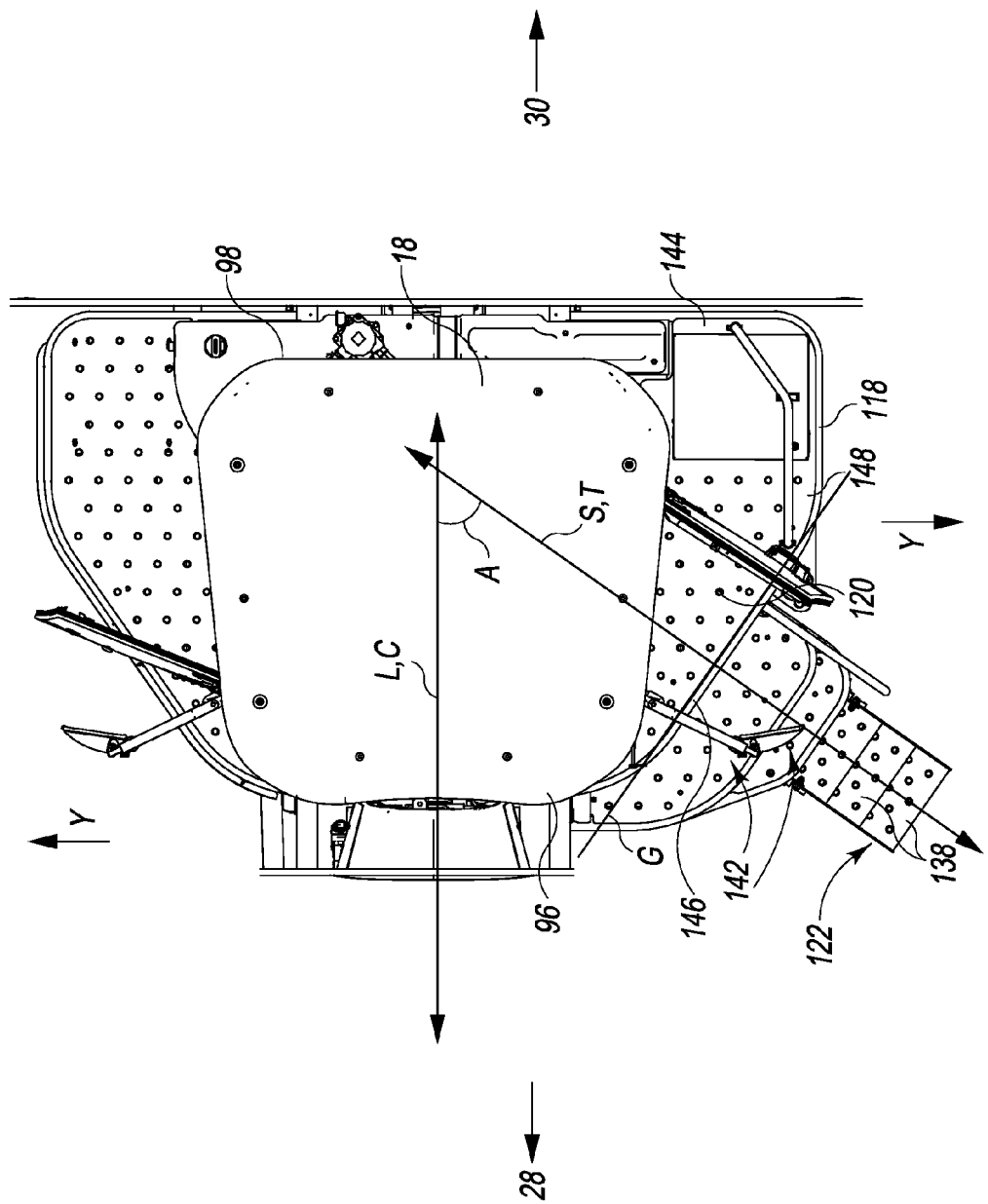
FIG. 13 is a partial top elevational view showing the angle of the ladder assembly in relation to the cab and cab door.
Figure 14:
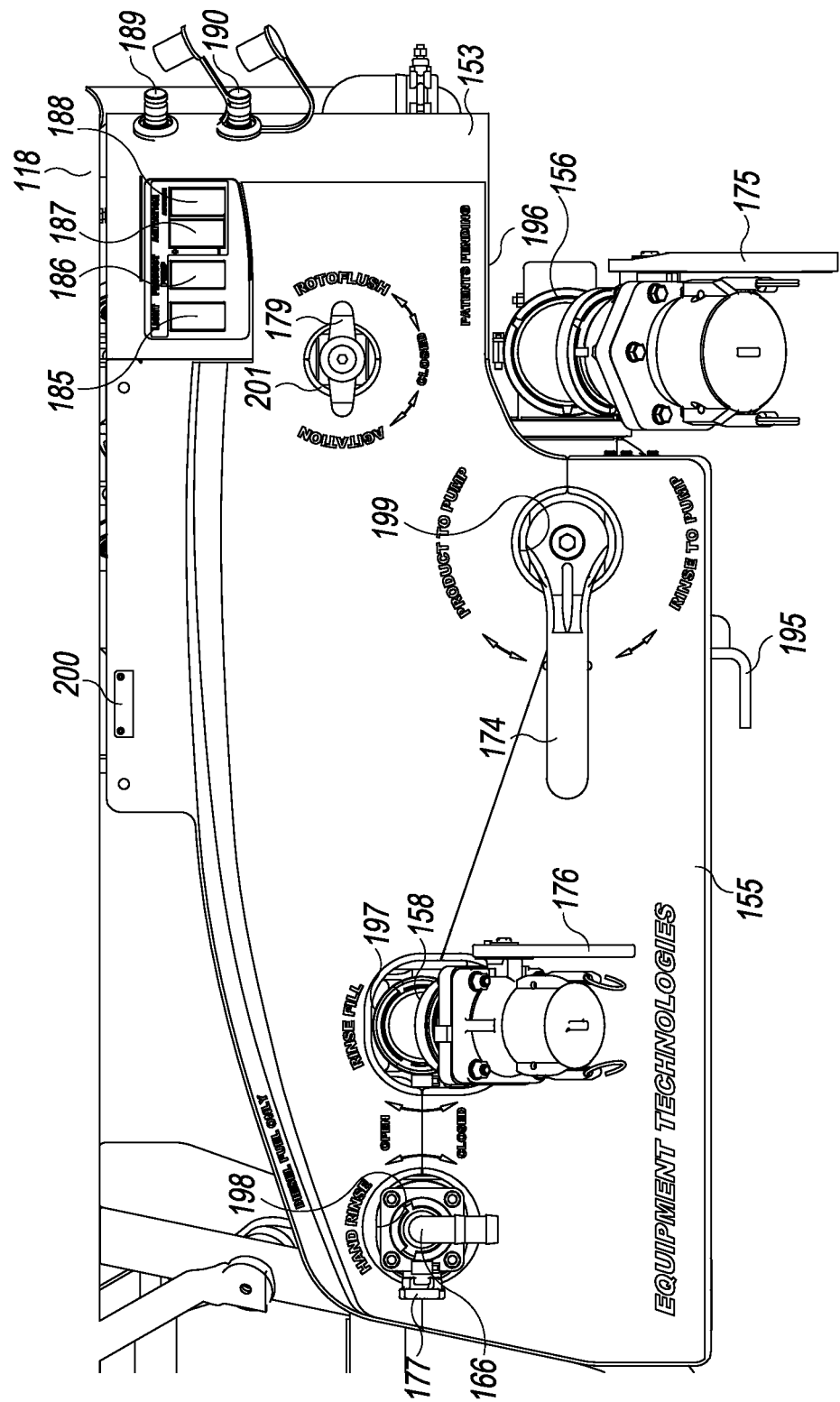
FIG. 14 is a front view of the fill station panel of the crop sprayer of FIG. 1.
Figure 15:
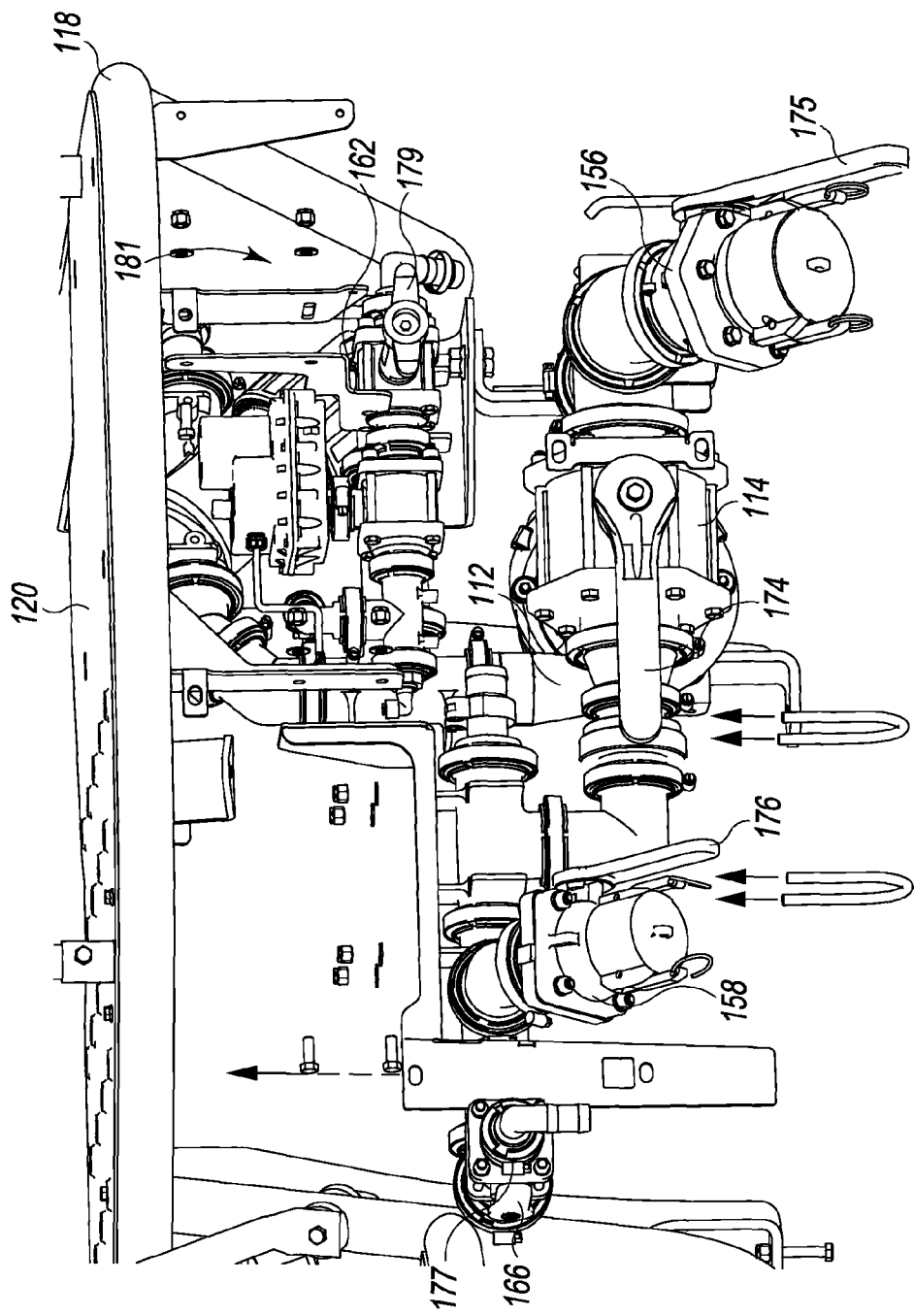
FIG. 15 is a front view of the mounting space behind the fill station panel of FIG. 14 showing the plumbing and electrical components supported by the support frame of the fill station.
Figure 16A:
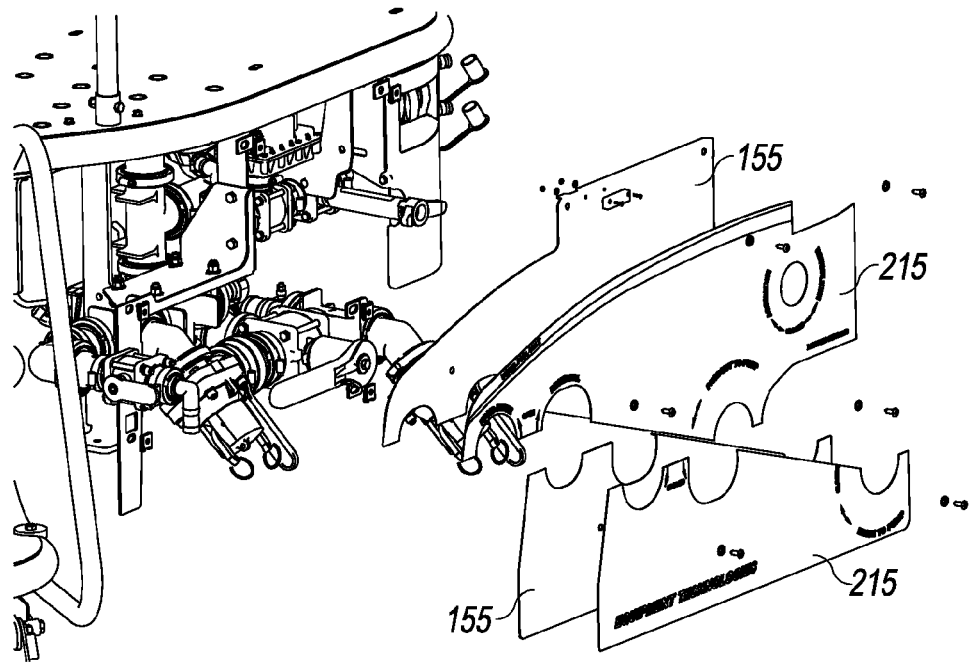
FIG. 16A is an exploded view of the fill station front panel.
Figure 16B:
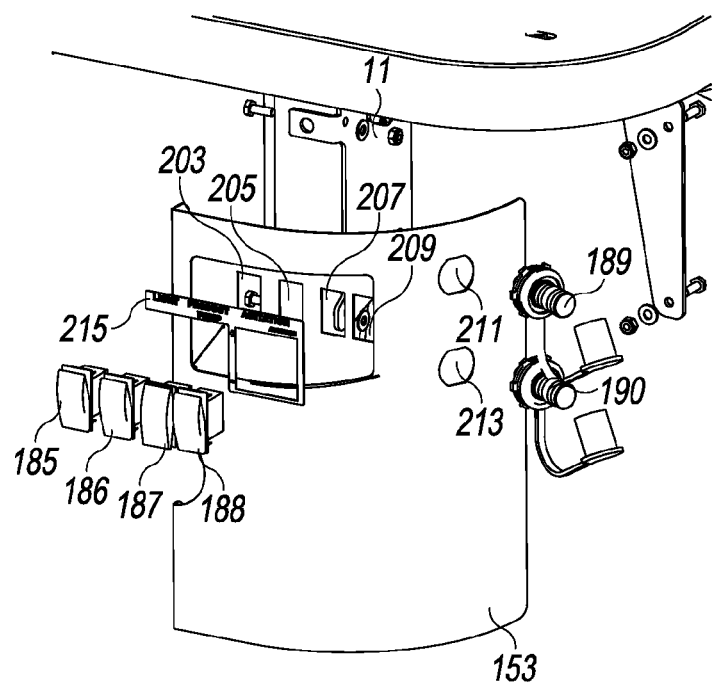
FIG. 16B is an exploded view of the fill station switch panel.

The cab entry assembly 60 includes the outrigger platform assembly 118 and a stair assembly 122. The outrigger platform assembly includes a support framework 118 and an upper platform foot support 120. As depicted in FIG. 13, the support framework 118 is secured to the main frame 14 adjacent to the cab. When the support framework 118 is secured to the main frame 14, the upper platform foot support 120 is positioned at the base of the cab 18 extending beyond the cab 18 in the lateral direction Y.

The outrigger support framework 118 comprises a skeletal structure that includes frame attachment portions 124, an upper support portion 126, and a stair support portion 128. The frame attachment portions 124 comprise plates secured to the main rail 24 of the main frame 14 by fasteners 130, such as bolts. The upper platform foot support 120 is secured to the upper support portion 126 of the support framework 118. The stair support portion 128 of the framework 118 is offset laterally and below the upper support portion 126 and includes fixed stair supports 140 arranged between the upper stair portion 134 and the upper support portion 126. Step members 142 are attached to the fixed stair supports 140 to enable an operator to climb to the upper platform foot support 120 from the upper portion 134 of the stair assembly 122.

The stair assembly 122 is attached to the stair support portion 128 of the support framework 118 extending longitudinally from the support framework 118 toward a landing position 119 (FIG. 3) at ground level. The landing position 119 is located substantially between the front and rear wheels 36, 38 relative to the longitudinal axis L and outside of the wheel path on the left side 25 of the crop sprayer. The stair assembly 122 includes an upper stair portion 134, a lower stair portion 136, and a plurality of stair members 138 arranged between the upper stair portion 134 and lower stair portion 136.

Figure 9:
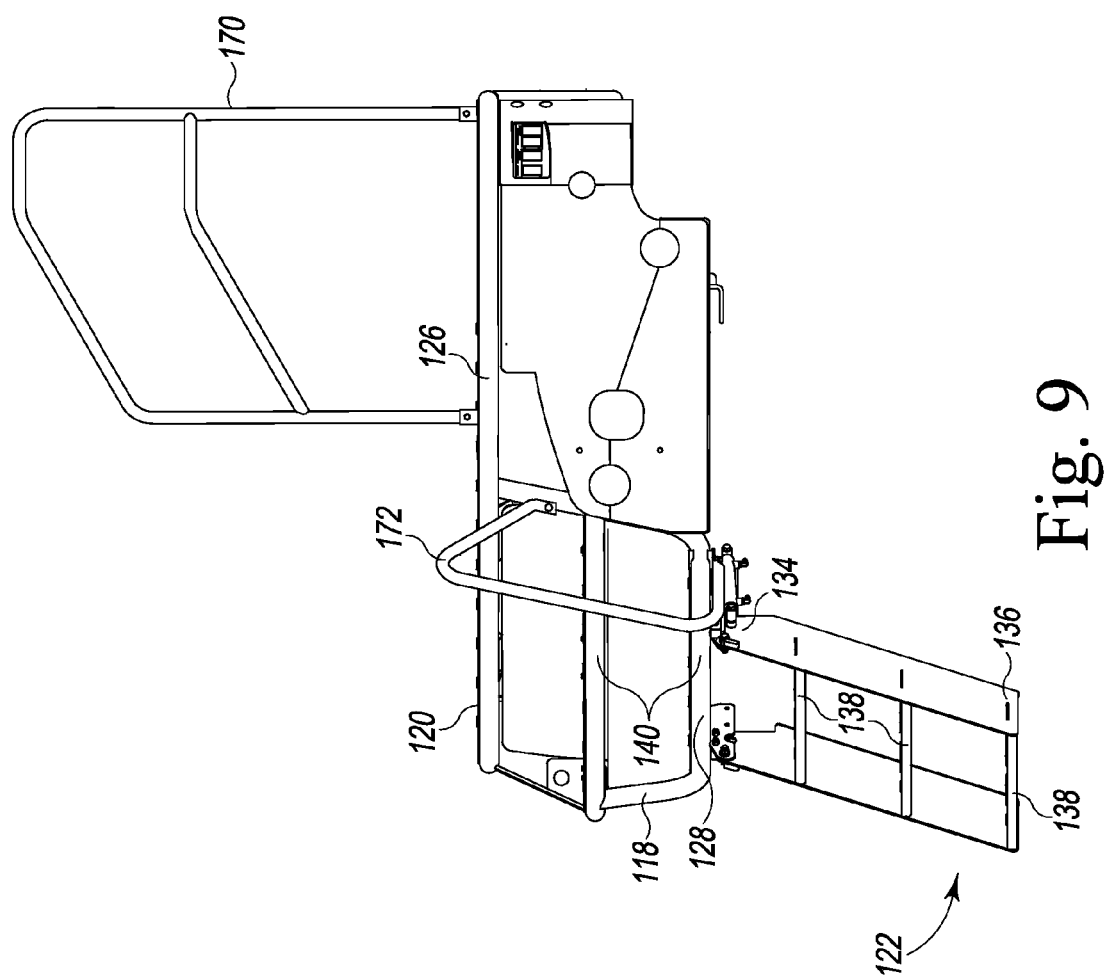
FIG. 9 is an elevational view of the cab entry assembly of FIG. 7 with the ladder assembly in the extended position.
Figure 10:
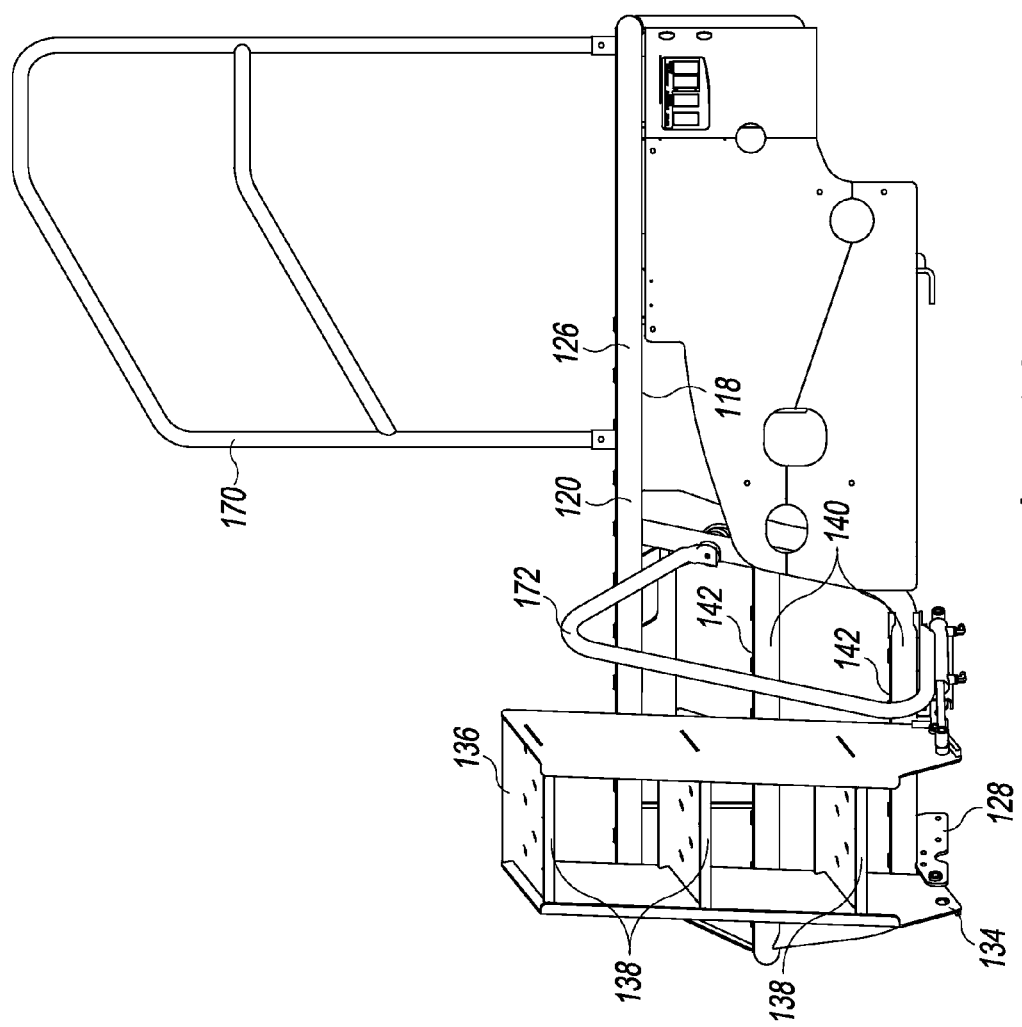
FIG. 10 is an elevational view of the cab entry assembly of FIG. 7 with the ladder assembly in the upright position.

The upper stair portion 134 of the stair assembly 122 is pivotably attached to the stair support portion 128 of the support framework 118. The stair assembly 134 is pivotable between an upright position (FIG. 10) and an extended position (FIG. 9). In the upright position, the lower stair portion 136 is positioned a sufficient distance away from ground level to clear crops during spraying. In the extended position, the lower stair portion 136 is positioned proximate ground level to allow an operator to mount the steps 138.

Referring to FIG. 13, the upper platform foot support 120 includes a trailing end portion 144, a leading end portion 146, an inner lateral side portion 125, and an outer lateral side portion 148. The trailing end portion 144 is oriented toward the rear portion 30 of the crop sprayer, and the leading end portion 146 is oriented toward a front portion 28 of the crop sprayer 10. The inner lateral side portion 125 is arranged proximate the main frame 14, and the outer lateral side portion 148 is arranged distally with respect to the main frame 14. The stair assembly 122 and the fixed stair members 142 are aligned with the leading edge portion 146 of the upper platform foot support 120.

The leading end portion 146 is positioned forward of the leading wall structure 96 of the cab in relation to the longitudinal axis L. The trailing end portion 144 is positioned rearward of the trailing wall structure 98 of the cab 18. The inner lateral side portion 125 has a shape that conforms generally to the shape of the first lateral side 92 of the cab 18.

The upper platform foot support 120, fixed stair members 142, and movable stair members 138 define a stairway that leads to and from the door opening 99. As can be seen in FIG. 13, the stairway is arranged at an angle with respect to the longitudinal axis L of the crop sprayer. In particular, the stairway defines a longitudinal stair axis S. The stair assembly 122 and fixed stair members 142 are arranged so that the stair axis S is oriented toward the front portion 28 of the crop sprayer 10. The leading edge portion 146 of the upper platform foot support 120 is arranged generally perpendicular to the stair axis S to facilitate access to the upper platform foot support 120. As depicted in FIG. 13, the leading edge portion 146 defines a line G that is substantially perpendicular to the stair axis S.

The upper platform foot support 120, fixed stair members 142, and stair assembly 122 of the cab entry assembly 60 are configured to provide a straight path to the cab 18 that approaches the cab 18 at an angle from the front. The stair axis S resides in a plane T that intersects the upper platform foot support 120, the fixed stair members 142, and the movable stair members 138. As depicted in FIG. 13, the plane T also intersects the operator seat 121 located in the operator space 104. The longitudinal axis L of the main frame 14 lies in a plane C (FIG. 13). As depicted in FIG. 13, the plane T intersects the plane C to define an acute angle A relative to the front portion 28 of the crop sprayer 10.

Figure 11:
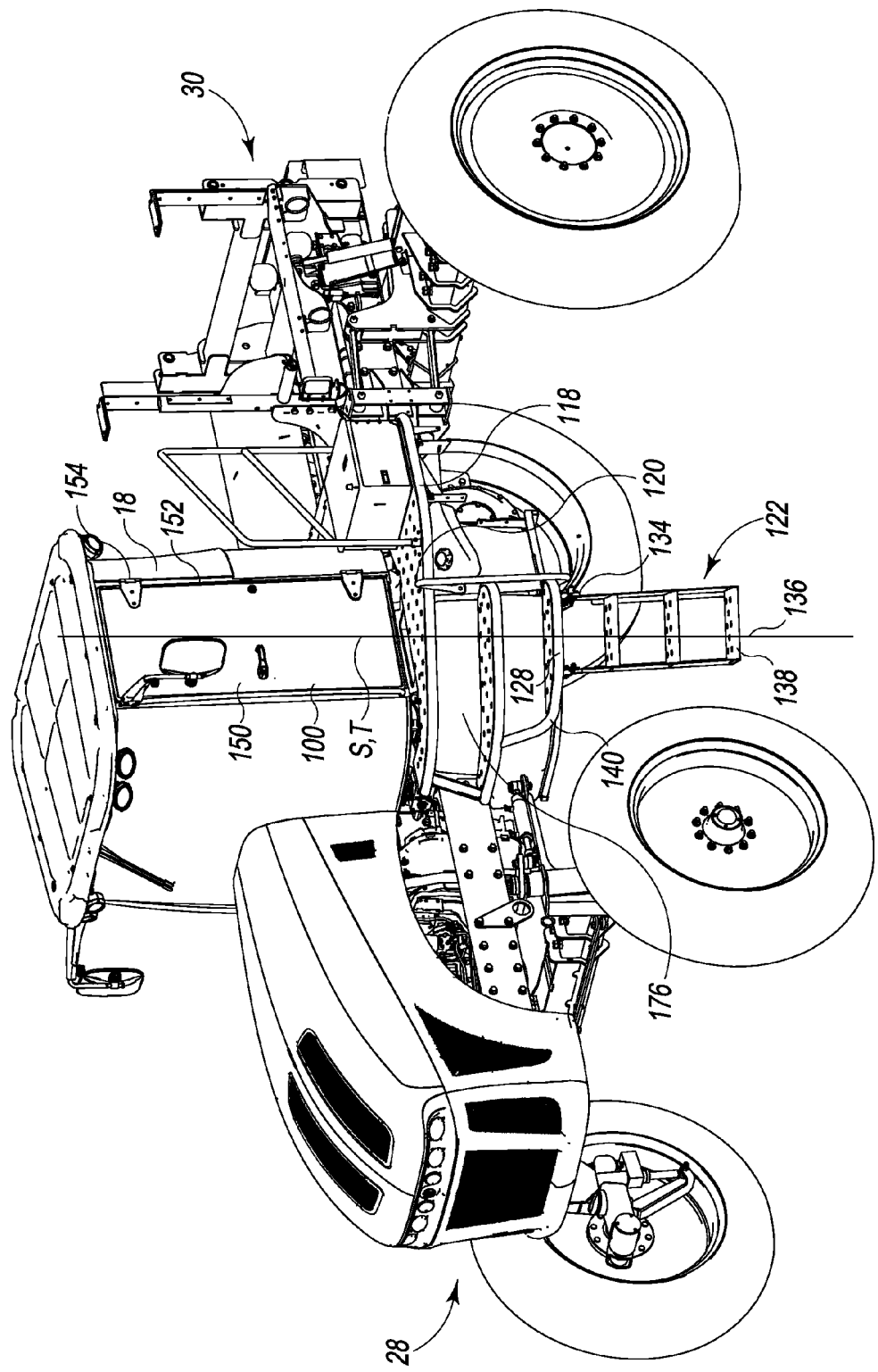
FIG. 11 is a perspective view of a crop sprayer showing the orientation of the ladder assembly in relation to the cab with the cab door closed.

To facilitate entry into the cab interior 104 from the front, the first side door 100 comprises a rear-hinged door. As depicted in FIG. 11, the first side door 100 includes a front edge portion 150 oriented toward the front portion 28 of the crop sprayer, and a rear edge portion 152 oriented toward the rear portion 30 of the crop sprayer. The rear edge portion 152 is pivotably connected to the cab frame 54 along a trailing side 154 of the door opening 99. Thus, the first side door 100 opens from the front and pivots toward the rear portion 30 of the crop sprayer 10 as depicted in FIGS. 12 and 13.

The door 100 is configured to pivot between a first position and a second position in relation to the door opening. In the first position, the door 100 is positioned to cover the door opening 99 so as to block entry into the operator space 104 through the door opening 99 (FIG. 11). In the second position, the door 100 is spaced apart from the door 100 so as to enable entry into the operator space 104 of the cab through the door opening 99 (FIG. 12).

The rear-hinged door 100 in conjunction with the angled straight-shot approach from the front facilitates an unobstructed entry into the cab interior 104. The plane T intersects the side door 100 of the cab 100 when the door 100 is closed as depicted in FIG. 11. When the door is opened as depicted in FIG. 12, the plane T intersects the door opening 99 and is spaced apart from the door 100. The door 100 is interposed between the plane T and the trailing edge portion 144 of the upper platform foot support 120.

The upper platform foot support, fixed stair members 142, and movable stair members 138 each include tread plates having surface features that enhance traction. The cab entry assembly 60 also includes hand rails 170, 172 for the convenience and safety of the operator. For example, a first hand rail 170 extends vertically from the outer edge portion and trailing edge portions of the platform member. A second hand rail 172 is mounted to the outrigger support framework 118 proximate the fixed stair members 142.

In addition to providing a support structure for the upper platform foot support and stair assembly, the outrigger support framework 118 defines a mounting space 174 below the upper support portion 126 of the support framework 118 in which other components of the crop sprayer 10 may be positioned. For example, as depicted in FIG. 11, the mounting space 174 provides a location for receiving a portion of a gas tank 176 for the crop sprayer that holds a quantity of gas for the engine 44 of the crop sprayer. As explained below, the mounting space 174 may also be used for routing and attaching plumbing components for the fill station 116 of the crop sprayer.

The cab entry assembly 60 includes a stair actuation system 66 (FIG. 6) for powering the pivotal movement of the stair assembly between the upright and extended positions. In one embodiment, the stair actuation system 66 comprises a hydraulic actuator fluidly coupled to the hydraulic drive system 54 of the crop sprayer. In this embodiment, the hydraulic stair actuation system is coupled to the parking brake 68 of the crop sprayer in order to be activated and deactivated based on the position of the parking brake. When the parking brake is engaged, the hydraulic stair actuator is activated to move the stair from the upright to the extended position automatically. When the parking brake is disengaged, the hydraulic stair actuator moves the stair assembly to the upright position.

Fill Station Assembly

Referring to FIGS. 14-17, the crop sprayer includes a fill station assembly 116 that enables an operator to fill or empty the product and rinse tanks, rinse hands, and mix solution at a single ground level position. The fill station assembly 116 includes a support framework 118 and a front control panel member 155 that provides a consolidated location for mounting and accessing plumbing components and controls, such as a fill/empty nozzle assembly for the product tank 156, a fill/empty nozzle assembly for the rinse tank 158, a flow selection valve 160, an agitate/flush valve 162, a hand rinse station nozzle assembly 166, and a product pump 112.

The support framework 118 comprises the outrigger support framework 118 of the cab entry assembly 60. Incorporating the fill station assembly 116 into the outrigger support framework 118 of the cab entry assembly 60 places the ground level controls close to the area where the operator arrives when climbing down from the cab 10 which minimizes the amount of time required to reach the fill station 116 from the cab 18. In alternative embodiments, however, the fill station support framework may be a separate component from the outrigger support framework 118 and may be positioned at other locations on the crop sprayer.

Figure 17:
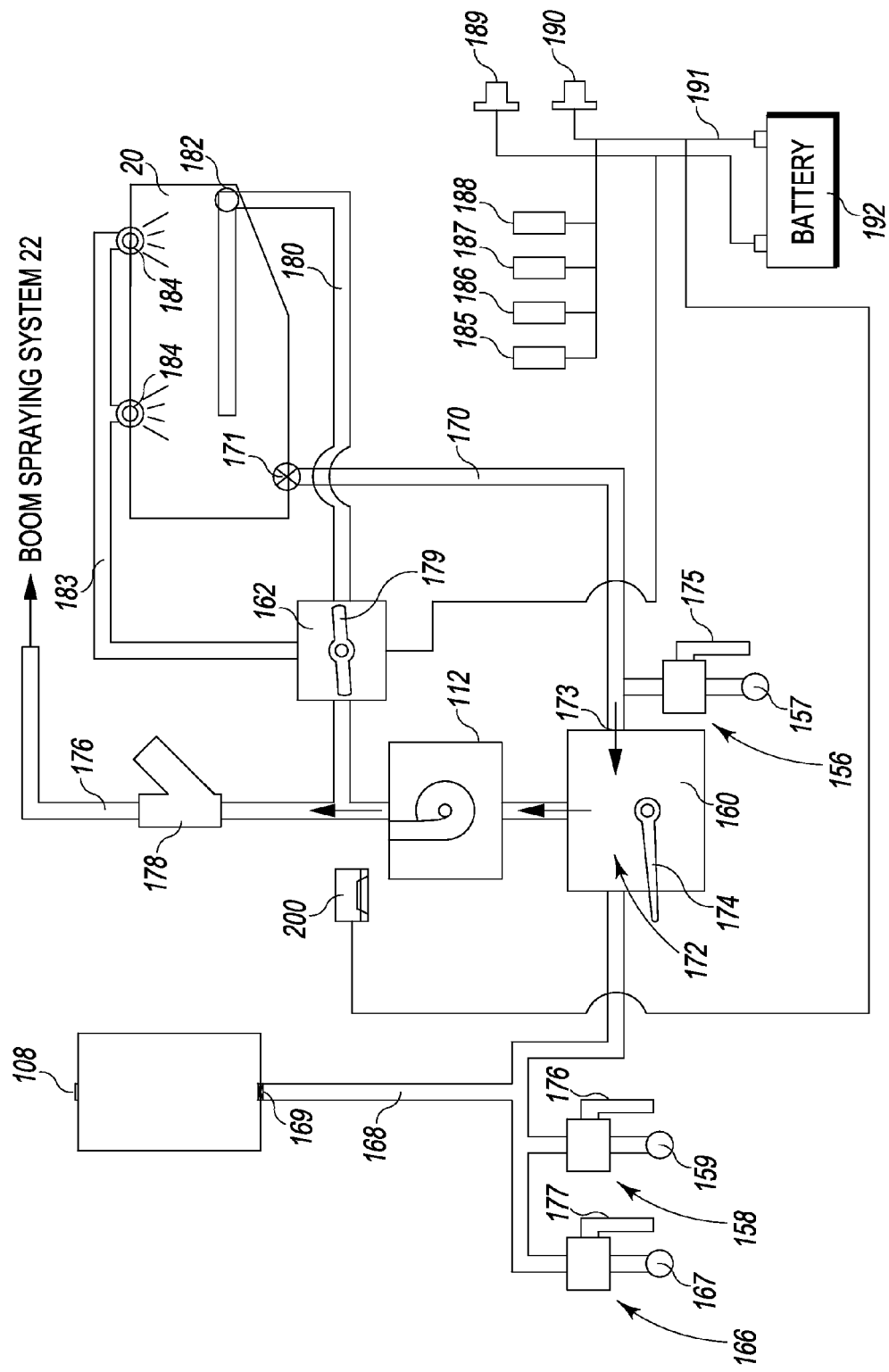
FIG. 17 is a schematic view of the plumbing and electrical components of the fill station assembly.
Figure 18:
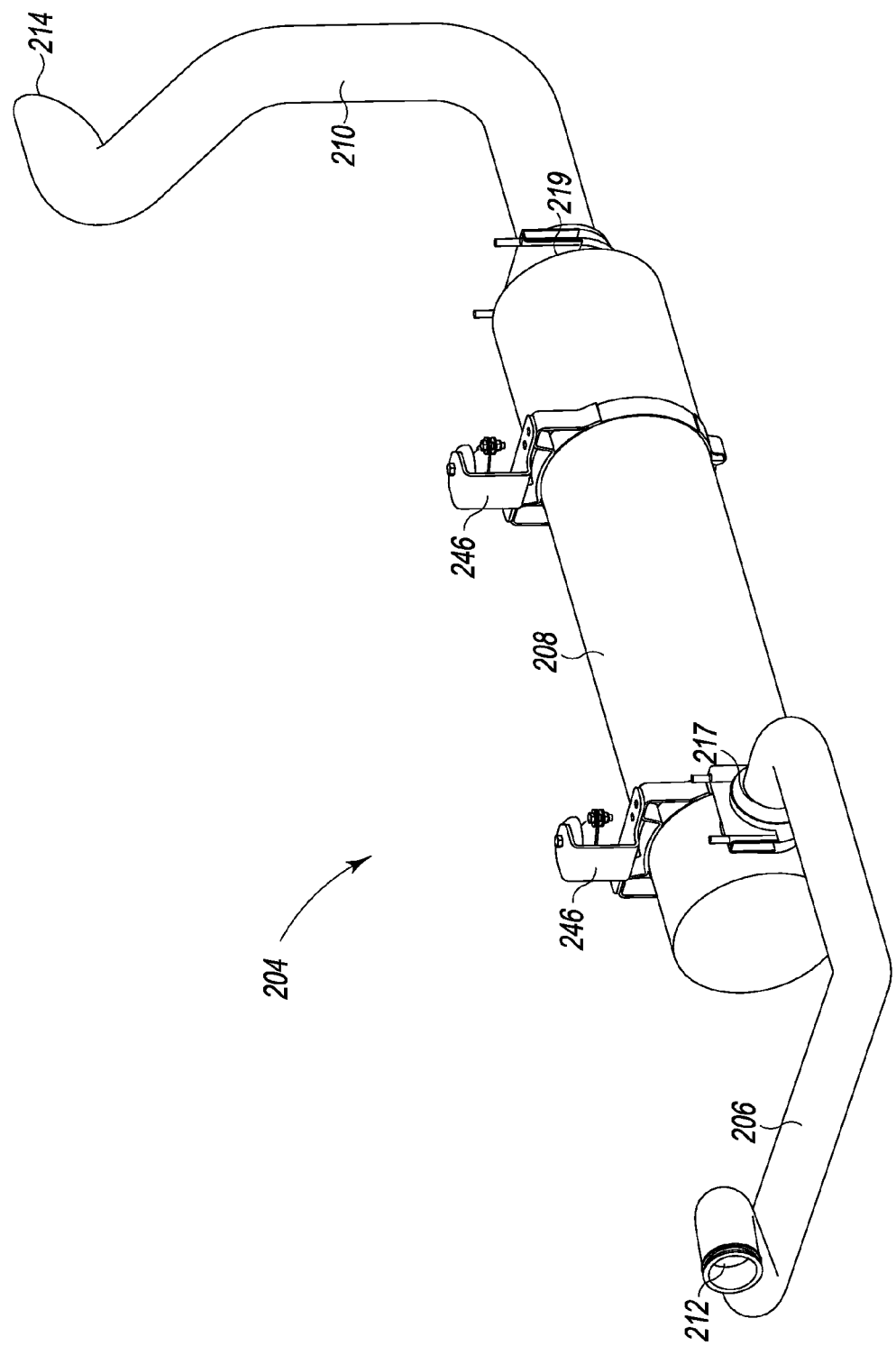
FIG. 18 is a perspective view of the exhaust system piping of the crop sprayer of FIG. 1.
Figure 19:
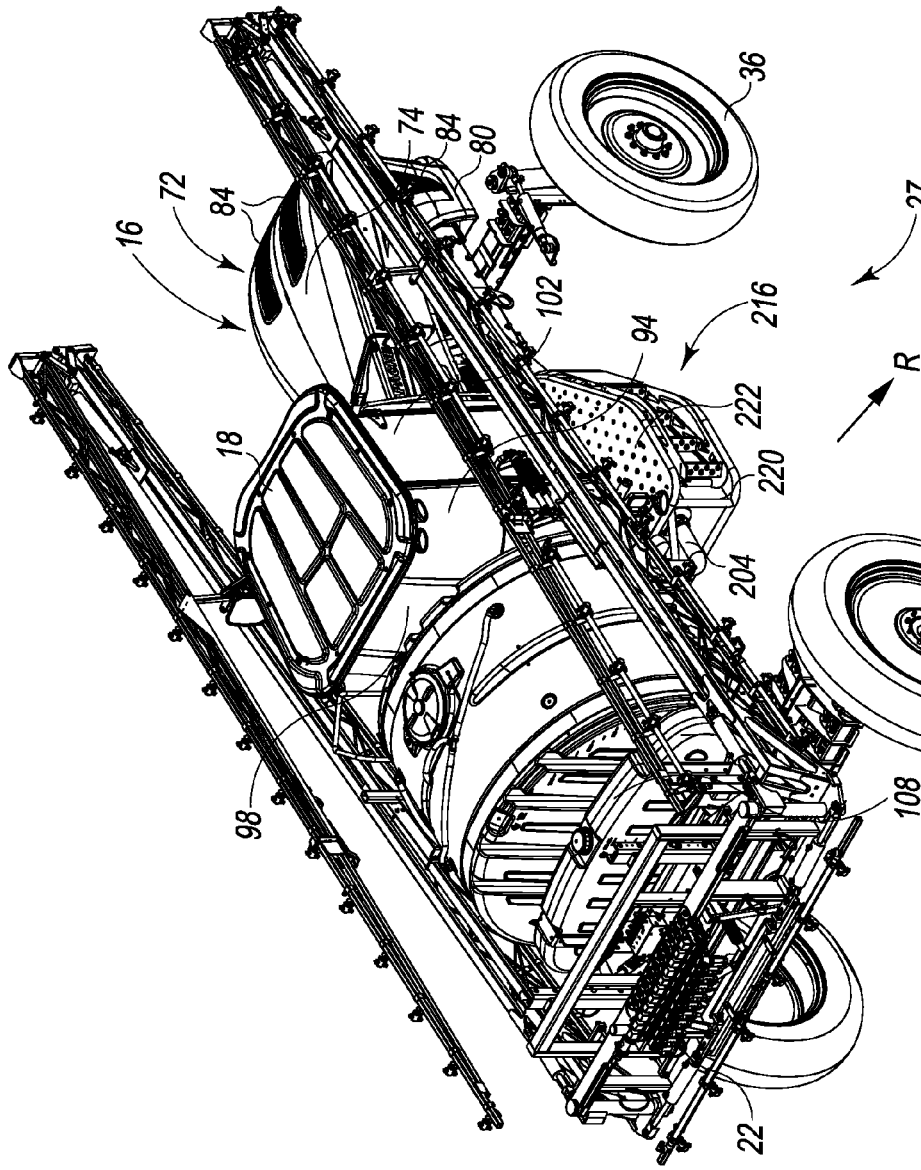
FIG. 19 is a perspective view of the crop sprayer of FIG. 1 showing the exhaust outrigger and ladder assembly of FIG. 18.

As depicted in FIG. 17, the rinse tank nozzle assembly 158 and the hand rinse nozzle assembly 166 each include a fluid outlet 159, 167 that is fluidly coupled a rinse tank fluid line 168. The rinse tank fluid line is in turn fluidly coupled to a fluid outlet 169, or drain, of the rinse tank 108. The product tank nozzle assembly 156 includes a fluid outlet 157 that is fluidly coupled to a product tank fluid line 170. The product tank fluid line 170 is in turn fluidly coupled to a fluid outlet 171, or drain, of the product tank 20. The product tank nozzle assembly 156, rinse tank nozzle assembly 158, and hand rinse nozzle assembly 166 each include a valve operated by a lever 175, 176, 177. The valves are opened to enable fluid flow through the fluid outlets, and closed to prevent fluid flow through the fluid outlets.

The flow selection valve 160 includes e first fluid inlet 172 that is fluidly coupled to the rinse tank fluid line, and a second fluid inlet 173 that is fluidly coupled to the product tank fluid line 170. The flow selection valve 160 is a three position valve operated by a lever 174. A first valve position couples the rinse tank fluid line 168 to the product pump 112, a second valve position couples the product tank fluid line 170 to the product pump 112, and a third valve position closes the selection valve 160. The product pump 112 is fluidly coupled to a fluid supply line 176 that directs fluid to the boom spraying system 22. A filter/strainer assembly 178 is included in the fill station assembly 116 that is fluidly coupled to the fluid supply line to filter fluid prior to reaching the spray nozzles of the boom spraying system 22.

The agitation valve 162 includes a fluid inlet coupled to the fluid supply line 176. The agitation valve 162 is a three position valve that is operated by a knob 179. A first valve position fluidly couples the fluid supply line 176 to an agitation fluid line 180 that directs fluid to the agitation assembly 182 mounted in the product tank 20. A second valve position fluidly couples the fluid supply line 176 to a 183 fluid line that directs fluid to flush/rinse nozzles 184 mounted to the product tank 20.

The fill station assembly 16 also includes electrical controls, such as product pump activation switch 186, agitation activation switch 188, an agitation rate increase/decrease switch 187, remote battery access terminals 189, 190, and a light switch 185 for controlling a light generating device 200, such as an LED light. The switches 185, 186, 187, 188 and battery terminals 189, 190 are electrically coupled to electrical wiring 191 that is extended from the terminals of the battery 192 of the crop sprayer.

The support framework 118 includes a plurality of tubular frame members that collectively define a mounting and routing space 181. Brackets 193 and attachment structures 194 are attached to the framework for supporting and retaining the front panel 155, plumbing, and electrical components. The rinse tank nozzle assembly 158, product tank nozzle assembly 156, hand rinse nozzle assembly 166, flow selection valve 114, agitate/flush valve 162, product pump 112, strainer assembly 178, and associated conduits and piping are each mounted to the support framework 118 and supported within the mounting and routing space 181. The support framework 118 also receives and retains electrical wiring that is extended through the mounting and routing space 184 from the positive and negative battery terminals of the battery 192 to provide remote battery access. Electrical wiring is extended from the battery 192 through the mounting and routing space 181 to provide power to the switches, light generating device, and agitation valve. In addition, the support framework 118 includes a hose retainer 195 that extends from the mounting space to provide a place to support hoses used to fill the product tank 20 and/or rinse tank 108 with the corresponding fluid.

The front panel 155 is mounted to brackets 193 attached to the support framework 118 extending below the support framework in front of the mounting space 181. Thus, the front panel 155 at least partially shields the mounting space 181 from view and provides some protection for the plumbing and electrical components in the mounting space 181. A plurality of openings is defined in the panel 155 through which the components are extended from the mounting space 181. The plurality of openings include a first opening 196 through which the fill/empty nozzle 156 for the product tank 20 is extended, a second opening 197 through which the fill/empty nozzle 158 for the rinse tank 108 is extended, a third opening 198 through which a nozzle for the hand rinse station 166 is extended, a fourth opening 199 through which a flow selection valve lever 174 is extended, and a fifth opening 201 through which the agitation/flush valve knob 179 is extended.

The front panel 178 includes a switch panel portion 153. The switch panel portion 153 defines openings through which the electrical wiring is extended and coupled to the electrical switches 185, 186, 187, 188 and remote battery terminals 188, 189. In particular, the fill station panel includes a first switch opening 203 through which wiring for the light switch 185 is extended, a second switch opening 205 through which wiring for the pump activation switch 186 is extended, a third switch opening 209 through which wiring for the agitation activation switch 188 is extended, and a fourth switch opening 207 through which wiring for the agitation rate increase/decrease switch 187 is extended. The panel 153 also defines a first battery terminal opening 211 through which wiring from the positive terminal of the battery 192 is extended and a second battery terminal 213 through which wiring from the negative terminal of the battery 192 is extended.

As depicted, the switch panel portion 153 comprises a curved panel that extends below the curved portion of the support framework 118. The curved switch panel portion 153 extends from the front panel 155 generally toward the main frame 14 thus partially enclosing the trailing portion of the mounting space 181. As depicted, the switch panel portion 153 is a separate panel that may be installed and removed independently from the front control panel 178. The front panel 155 and switch panel portion 153 of the fill station assembly 116 are also provided with decals 215 that provide identification and/or instructions for the plumbing and electrical components received at the panels 155, 153. To facilitate the use of the fill station 116 in low-light conditions, the light generating device 200 is mounted to an upper portion of the front panel 155 to direct light downwardly toward the controls. The light 200 is controlled by the light switch 185.

Exhaust Outrigger and Ladder Assembly

Referring to FIGS. 18-24, the crop sprayer 10 includes an exhaust system 204 for discharging exhaust from the engine of the crop sprayer. The exhaust system 204 includes an inlet exhaust pipe member 206, a muffler 208, and an outlet exhaust pipe member 210. The inlet exhaust pipe member 206 includes an intake end portion 212 that is fluidly coupled to an exhaust discharge, e.g., a turbo outlet (not shown), in the engine compartment 16. The outlet exhaust pipe member 210 includes a terminal end portion 214 defining an exhaust exit orifice for discharging the exhaust. The muffler includes a muffler inlet 217 that is in fluid communication with the inlet exhaust pipe member 206, and a muffler outlet 219 that is in fluid communication with the outlet exhaust pipe member 210.

The crop sprayer 10 includes an exhaust outrigger and ladder assembly 216 that provides a location to route, mount, and conceal the exhaust system 204 along the second side 27 of the crop sprayer. The exhaust outrigger assembly retains the exhaust system in a horizontal orientation while concealing and shielding the exhaust piping. This configuration frees the second side 27 of the crop sprayer to be used to access the cab 18.

The exhaust system and ladder support assembly 216 includes an outrigger support framework 220, a foot support 222, and a ladder assembly 224. The outrigger support framework 220 comprises a skeletal structure that includes frame attachment portions 226, an upper frame member 228, a lower frame member 230, and a ladder mounting structure 232. The frame attachment portions 226 comprise plates secured to the main rail 26 of the main frame 14 by fasteners, such as bolts.

The lower support frame portion 230 is positioned below the upper frame member 228 and spaced apart from the upper frame member 228 to define a routing space 235. The upper and lower frame members 228, 230 each include a leading edge portion 234, 236 that is oriented toward the front portion 28 of the crop sprayer, a trailing edge portion 238, 240 that is oriented toward the rear portion 30 of the crop sprayer. The leading edge portions 234, 236 of the upper and lower frame members 228, 230 define a first access opening 242 that communicates with the routing space 235, and the trailing edge portions 238, 240 of the upper and lower frame members 228, 230 define a second access opening 244 that communicates with the routing space 235.

Figure 20:
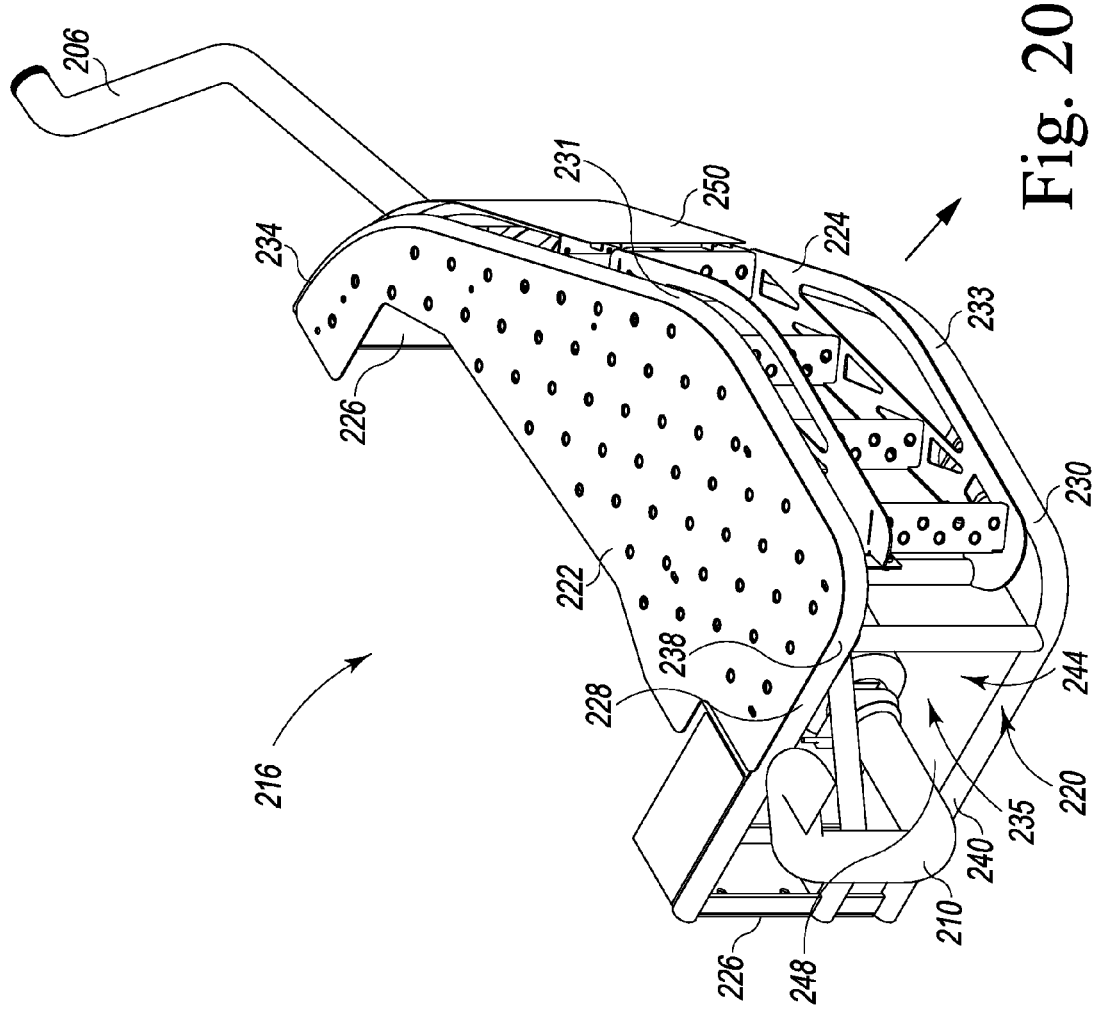
FIG. 20 is perspective view of the exhaust outrigger and ladder assembly of the crop sprayer of FIG. 1 with the exhaust system piping of FIG. 18 contained therein.

The outrigger support framework 220 supports muffler mounting structures 246 (FIG. 18) for mounting the muffler 208 in a horizontal orientation in the routing space 235 as depicted in FIG. 20. In one embodiment, the mounting structures 246 comprise vibration dampening hangers to reduce the amount of noise generated by the exhaust system. The vibration dampening hangers allow the exhaust to flex and move with the vibrations of the engine thereby decoupling the exhaust from the rigid outrigger framework which prolongs exhaust system and turbo life. The inlet exhaust pipe 206 is extended generally horizontally from the engine compartment 16 into the routing space 235 via the first opening 242 defined by the leading edge portions 234, 236 of the upper and lower support frame portions.

The outlet exhaust pipe 210 extends generally horizontally from the muffler 208 through the second opening 244 defined at the rear of the outrigger support framework 220. The exhaust fumes and the noise from the exhaust system are therefore discharged at a location that is substantially behind the operator and away from crops.

The foot support member 222 is secured to the upper frame member 228. When the outrigger support framework is secured to the main frame 14, the foot support member 222 is positioned at the base of the cab 18 extending beyond the cab in the lateral direction R to provide a surface that the operator can stand and walk on when entering and exiting the cab via the right side door 102. The foot support 222 also serves as a shield that prevents operator contact with the exhaust system beneath the platform.

The exhaust outrigger and ladder assembly 216 also includes a lower panel member 248 that is secured to the lower support frame member to shield the routing space 235 from below the support framework 228. A heat shield panel 250 is positioned over the first opening 242 extending between the leading edge portions 234, 236 of the upper and lower frame members. The heat shield 250 defines an opening 252 through which the inlet exhaust pipe 206 is extended. The opening 252 in the heat shield 250 is sized complementary to the diameter of the inlet exhaust pipe 206.

Figure 21:
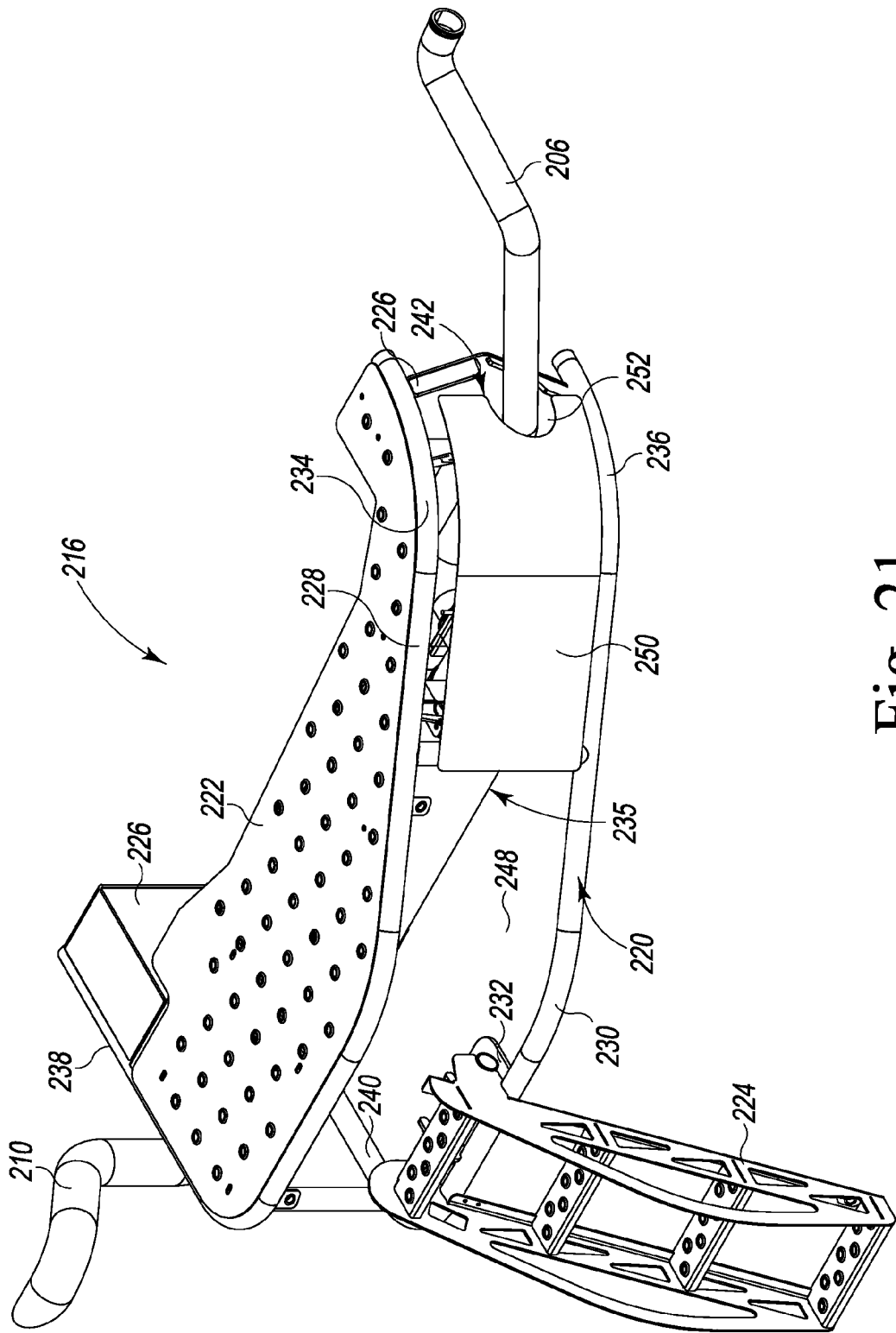
FIG. 21 is perspective view of the exhaust outrigger and ladder assembly of FIG. 19 with the ladder deployed.
Figure 22:
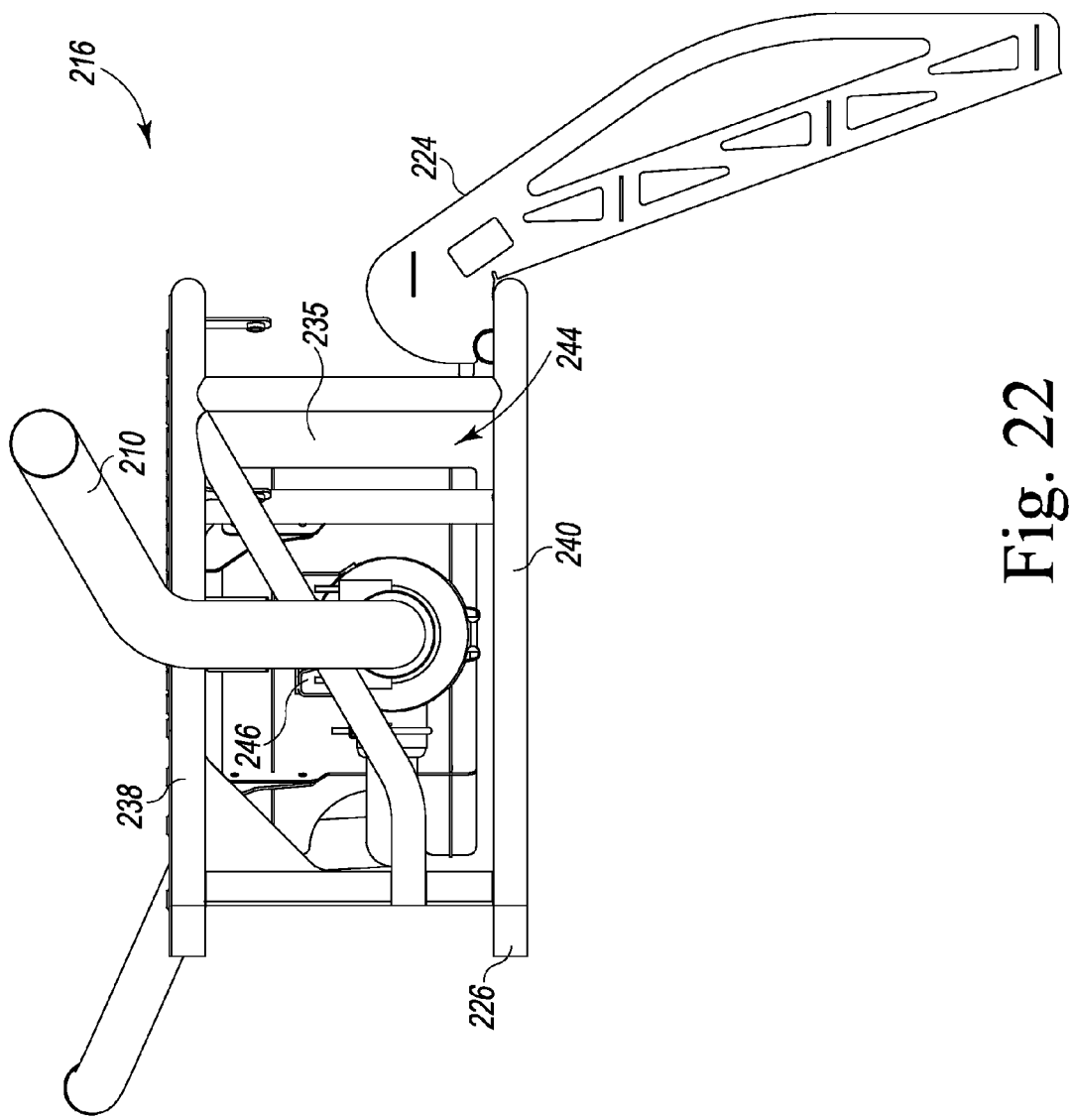
FIG. 22 is an end view of the exhaust outrigger and ladder assembly of FIG. 19 with the ladder deployed.
Figure 23:
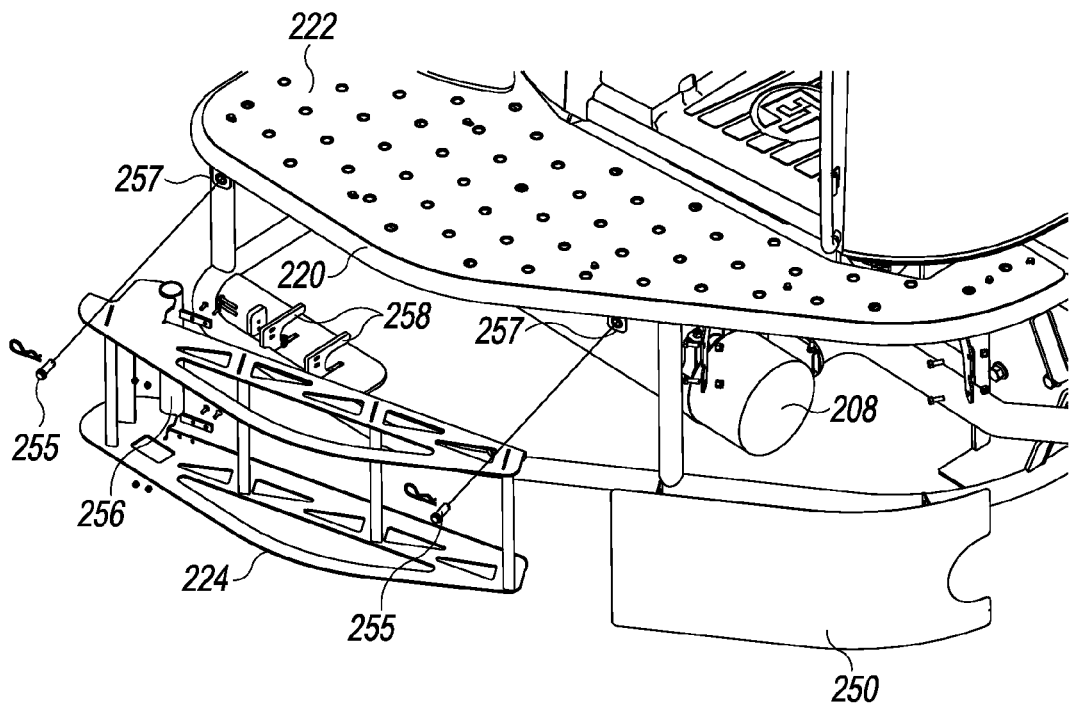
FIG. 23 is a partially exploded view of the exhaust outrigger and ladder assembly of FIG. 19 showing the attachment structures for attaching the ladder in the stowed position.
Figure 24:
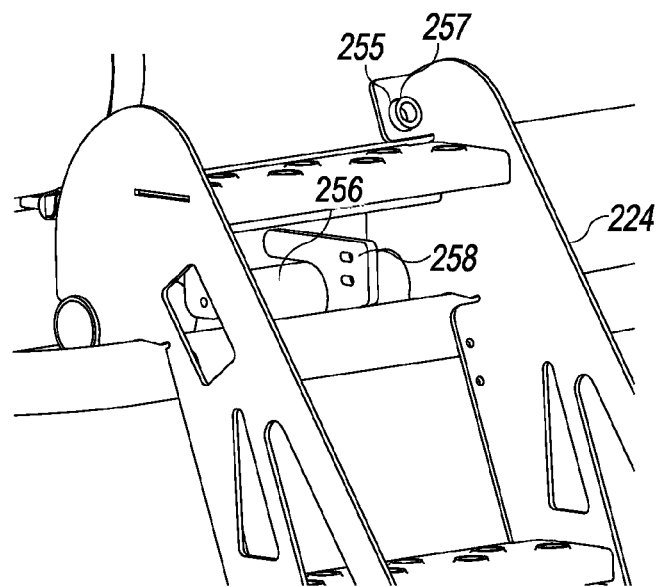
FIG. 24 is a view of the attachment structures for securing the ladder assembly of the exhaust outrigger in the deployed position.
Figure 25:
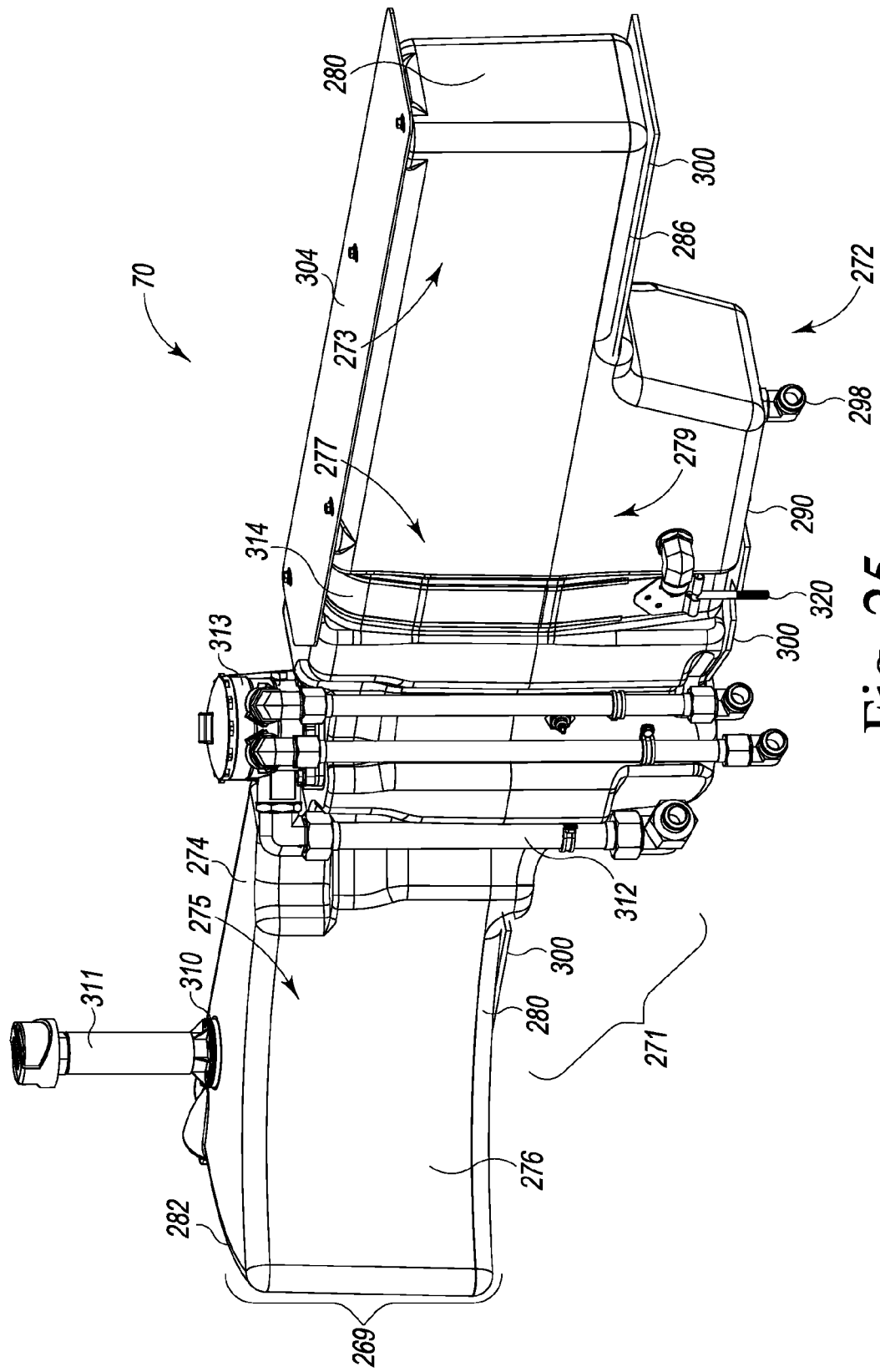
FIG. 25 is a perspective view of the hydraulic reservoir assembly of the crop sprayer of FIG. 1.

The ladder assembly 224 enables the foot support 222 to be accessed from ground level. The ladder assembly 224 includes frame attachment structures 255, 256 that enable the ladder assembly 224 to be supported by the outrigger support framework 220 in either a stowed position (FIG. 20) or a deployed position (FIG. 21). In the stowed position, the ladder 224 is oriented horizontally and is positioned substantially between the upper frame member 228 portion and the lower frame member 230 proximate the outer edge portions 231, 233 of the upper and lower frame members 228, 230. The ladder 224 provides further shielding and/or concealment for the exhaust system 204 when the ladder is in the stowed position. The frame attachment structures 255 for mounting the ladder assembly 224 in the stowed position comprise retaining pins. The ladder assembly 224 and the support framework 220 define bores 257 that align to receive the retaining pins 225 in order to secure the ladder assembly to the support frame.

In the deployed position, the ladder assembly 224 is attached to the lower support frame portion 230 at an angle to simulate stairs for ease of traversal. The outrigger support framework 220 includes a ladder attachment structure 258 in the form of catches or hooks for attaching the ladder 224 to the framework 220. The ladder assembly 224 includes a frame attachment structure 256 in the form of a bar or tube that is held by the catches or hooks 258.

Hydraulic Reservoir Assembly

Referring to FIGS. 25-28, an embodiment of a hydraulic reservoir assembly 70 for the hydraulic drive system 54 of the crop sprayer 10 is depicted. The hydraulic reservoir assembly 70 comprises a container that is configured to contain a quantity of hydraulic fluid for the hydraulic drive system. The container is formed of a molded plastic material, such as cross-linked polyethylene, and includes an upper container portion 269 and a lower container portion 271. Molded inserts are incorporated into the reservoir that allow for ease of assembly, increase serviceability and allow for the attachment of a sight glass 302, fill spout 310, hydraulic filter assembly 313, as well as other components such as a temperature sender, insulated clamps, hydraulic plugs and fittings.

The upper container portion 269 includes an upper left lateral part 273 and an upper right lateral part 275 with an upper central part 277 interposed therebetween. The lower container portion 271 includes a lower central part 279 extending from the upper central part 277 so as to be located below the upper central part 277. As depicted in FIG. 26, when the hydraulic reservoir 70 is mounted to the main frame 14 in the reservoir space 67, the upper left lateral part 273 of the container is positioned above the first main rail 24, the upper right lateral part 275 of the container is positioned above the second main rail 26, and the lower central part 279 is interposed between the first main rail 24 and the second main rail 26.

The first foot support 120 and the second foot support 222 are each positioned at a vertical height in relation to the main frame that locates the foot supports 120, 122 at the base of the first door and second door, respectively. The vertical height of the first foot support 120 in relation to the main frame 14 is approximately equal to the vertical height of the second foot support 222 in relation to the main frame 14. The vertical height of the first and second foot supports enables the foot supports to be used as surfaces for an operator to stand and walk on when entering and exiting the operator space via the first and second doors 100, 102. As depicted, the first foot support 120 and the second foot support 222 comprise tread plates having surface features that enhance traction.

The reservoir 70 includes a plurality of walls that collectively define the upper and lower portions of the container having an interior space 270 (FIG. 28) capable of containing the quantity of hydraulic fluid. The plurality of walls includes a lower wall 272, an upper wall 274, a leading wall 276, a trailing wall 278, a first lateral wall 280, and a second lateral wall 282. The walls of the reservoir 70 define a shape having a depth K that conforms to a narrow reservoir space 67 provided between the cab 18 and the tank support assembly 106 on the crop sprayer with a width W that extends from the foot support 120, on the first side 25 to the foot support 222 on the second side 27.

The leading wall 276 of the reservoir is oriented toward the front portion 28 of the crop sprayer 10 and is shaped complementary to the trailing wall structure 98 of the cab. As depicted, the leading wall 276 has a curved shape that enables the reservoir 70 to wrap at least partially around the curved rear wall panel 284 of the cab. The trailing wall 278 of the reservoir 70 is oriented toward the rear portion 30 of the crop sprayer. The trailing wall 278 is substantially planar for arrangement proximate the leading end portion of the tank support assembly 106.

The lower wall 272 of the reservoir is oriented toward the main frame 14. The lower wall 272 has a first lower support surface 286 arranged proximate the first lateral side wall 280 and a second lower support surface 288 arranged proximate the second lateral side wall 282. When the reservoir is positioned on the crop sprayer, the first lower support surface 286 is supported on the upper platform foot support 120 of the left side outrigger support framework 118, and the second lower support portion 288 is supported on the foot support member 222 of the right side outrigger support framework 220.

The lower central part 279 of the lower container portion 271 comprises a sump 290 that extends below the first and second lower support surfaces 286, 288. When situated on the crop sprayer, the central sump portion 290 extends between the main frame rails 24, 26. As depicted in FIG. 4, the main frame 14 includes a hydraulic reservoir support plate 292 that is positioned to support the central sump portion 290. The central sump portion 290 defines a first opening 294 and a second opening 296. A suction strainer 298 is installed in the first opening 294. The second opening 296 comprises a drain opening. A drain plug 298 is attached to the central sump portion 290 over the drain opening. Rubber pads 300 are attached to the central sump portion 290 and the first and second lower support surfaces 286, 288 to protect the surfaces from damage due to abrasion.

The first lateral side wall 280 is oriented toward the left side 25 of crop sprayer, and the second lateral side wall 282 is oriented toward the right side 27 of the crop sprayer. The second lateral side wall includes a sight glass insert 302 that enables the operator to see inside the reservoir to check the level of hydraulic fluid contained in the interior space 270 of the reservoir.

The upper wall 274 also defines a fill opening 306 and a filter opening 308. A fill insert 310 is attached to the upper wall 274 extending through the opening 306 that removably retains a fill spout 311 for introducing hydraulic fluid into the interior space 270 of the reservoir. A filter insert 312 is installed in the filter opening 308 that removably retains a filter assembly 313 for the reservoir 70. The filter assembly 313 includes a hydraulic filter (not shown). The filter assembly 313 is fluidly coupled to a hydraulic fluid return line 312 in order to filter the hydraulic fluid as it is being returned to the reservoir 70.

The upper wall 274 of the reservoir is substantially flat and includes a foot support 304 that provides a surface for the operator to stand and walk on. The foot support 304 is generally horizontally oriented and extends over at least a portion of the upper wall 274. The upper wall 274 positions the foot support 304 a vertical distance H above the foot supports 120, 222 on either side of the cab 18. As a result, the foot support 304 has a vertical height in relation to the main frame that is greater than the vertical height of the foot supports 120, 122 to either side of the cab. The foot support 304 thus provides a raised surface, or step, for the operator to use to, for example, gain a higher vantage point, access fittings on top of the product tank 20, and traverse from one side of the cab to the other. As depicted, the foot support 304 comprises a tread plate having surface features for enhancing traction.

The reservoir assembly 70 includes a frame attachment member 314 for removably attaching the reservoir 70 to the main frame 14. The frame attachment member 314 comprises a strap that is looped over the upper wall 274 and attached to the support plate 292. The strap 314 includes a first end portion 316 and a second end portion 318. The first and second end portions 316, 318 each include a fastener structure 320 that is secured to the support plate 292. In one embodiment, the fastener structure 320 comprises a threaded rod or post. The support plate 292 defines bores (not shown) for receiving the threaded fasteners. The threaded fasteners 320 are inserted through the bores and secured on the other side of the plate by nuts 322.

An exterior groove 324 is defined in at least the upper wall 274 for receiving and locating the strap 314 in relation to the reservoir 70 and to limit lateral movement of the reservoir 70 and strap 314 with respect to each other. In the embodiment of FIGS. 25-28, the upper wall 274, leading wall 276, and trailing wall 278 define a continuous groove 324 in which the strap 314 is received. The foot support, or tread plate, 304 is supported on the upper wall so as to define a gap 315 between groove 324 and the tread plate 304 through which the strap is fed. Thus, the tread plate 304 is positioned over the strap on the upper wall 274 to protect the strap 314 from damage.

The configuration of the reservoir 70 enables the reservoir to be lifted off of the main frame when removing the reservoir 70 for service and/or replacement, and to be lowered into position when mounting the reservoir 70 onto the main frame 14. When installing or removing the reservoir 70, the support plate 292 and strap fastener structures 320 can be accessed from below the main frame 14.

Tank Support Assembly

Referring now to FIGS. 29-34, the crop sprayer 10 includes a tank support assembly 106 for supporting and retaining the product tank 20 and rinse tank 108 of the crop sprayer. Tank support assembly 106 includes a first elongated tank support member 324 and a second elongated tank support member 326. The first tank support member 324 and the second tank support member 326 are mounted to the first main rail 24 and the second main rail 26, respectively, extending between a first position 329 and a second position 330 relative to the longitudinal axis L of the crop sprayer. When mounted on the crop sprayer, the first tank support member 324 and the second tank support member 326 are arranged parallel to each other and the longitudinal axis L of the crop sprayer 10 and are spaced apart from each other by a distance E to define a sump space 335 therebetween. The sump portions 344, 360 of the product tank 20 and rinse tank 108 are received in the sump space 335 when the tanks are supported on the tank support assembly 106. The sump space is open and accessible from beneath the main frame of the crop sprayer thus allowing access to hose routings, plumbing, and fittings.

The first tank support member 324 and second tank support member 326 comprise contoured panels bolted to mounting structures 331, or braces, that are secured to the main rails 24, 26. Four mounting structures 331 are provided with a brace being secured to each main rail 24, 26 proximate the first position 329 and the second position 330. The first tank support member 324 and the second tank support member 326 each include an upper tank contact surface 328. The upper tank contact surfaces 328 have a uniform elongated convex cross-sectional shape taken in planes perpendicular to the longitudinal axis L for mating with inversely contoured support surfaces of the product tank 20 and rinse tank 108.

The first tank support member 324 and the second tank support member 326 serve as lateral supports for the product tank 20 and rinse tank 108 that work to substantially prevent side to side movement of the tanks. The tank support assembly 106 also includes a leading tank brace 330 and a trailing tank brace 332. The leading tank brace 330 comprises a rod that extends between the braces 331 located at the first position 328. The rod is positioned to prevent movement of the product tank 20 and rinse tank 108 toward the front portion 28 of the crop sprayer. The trailing tank brace 332 comprises brackets mounted to the main frame 14 proximate the second position 330 to prevent movement of the product tank 20 and rinse tank 108 toward the rear portion 30 of the crop sprayer. The distance Z between the first position and second position is sized to correspond to the combined length (L1+L2) of the product tank 20 and rinse tank 108 (FIG. 2).

Figure 31A:
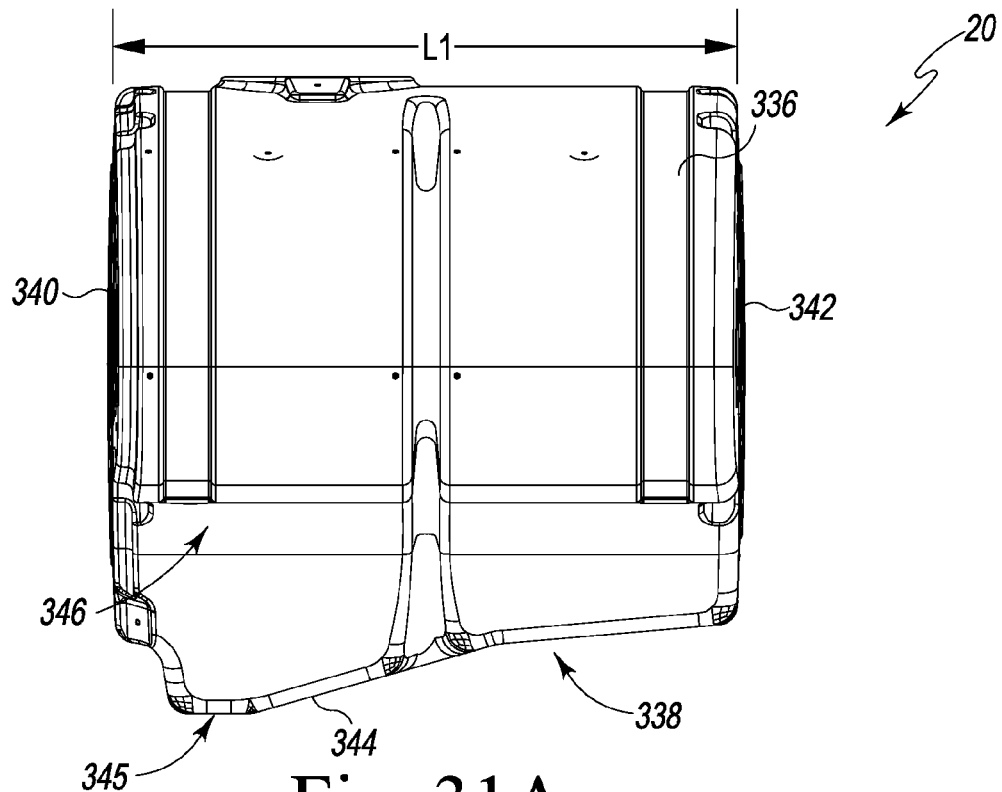
FIG. 31A is a side elevational view of the product tank of the crop sprayer of FIG. 1.
Figure 31B:
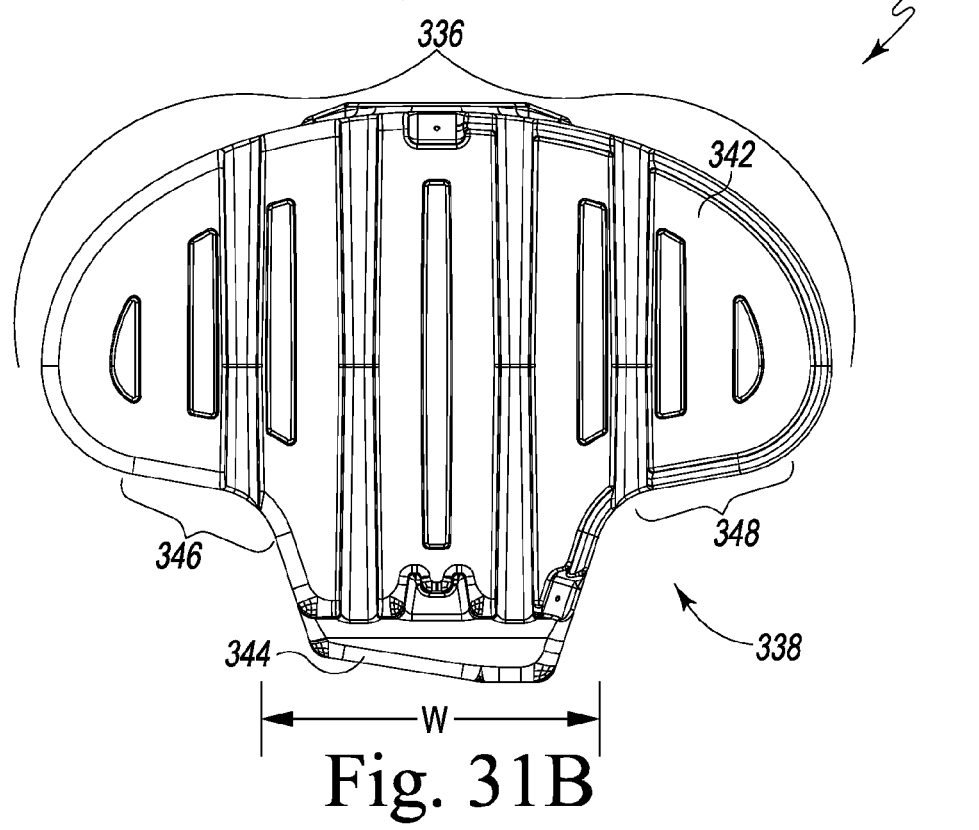
FIG. 31B is an end elevational view of the product tank of FIG. 31A.

Referring to FIGS. 31A and 31B, an embodiment of a product tank 20 is shown. As depicted, the product tank 20 includes an upper wall portion 336 and a lower wall portion 338 that extend between a leading end portion 340 and a trailing end portion 342 of the product tank. The leading end portion 340 and the trailing end portion 342 are generally planar and are oriented toward the front portion 28 and rear portion 30 of the crop sprayer, respectively, when supported by the tank support assembly 106.

The upper wall portion 336 has a generally cylindrical cross-sectional shape extending between the leading end portion 340 and trailing end portion 342 of the product tank 20. The lower wall portion 338 includes a central sump portion 344, a first lateral support portion 346, and second lateral support portion 348. The first lateral support portion 346 extends from the upper wall portion 336 to the central sump portion 344 on a first side of the product tank 20. The second lateral support portion 348 extends from the upper wall portion 336 to the central sump portion 344 on a second side of the product tank 20. The central sump portion 344 extends below the lateral support portions 336 and includes a drain structure 345 proximate the leading end portion of the tank that enables the product tank to be drained. The sump portion 344 tapers downwardly from the trailing end portion 342 to the leading end portion 340 of the product tank so that the center of gravity of the fluid in the tank moves forward in the tank as the tank empties.

Figure 32A:
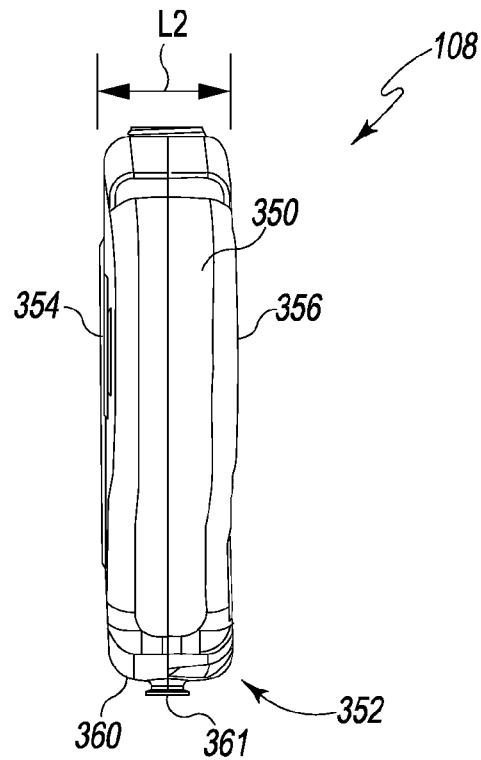
FIG. 32A is a side elevational view of the rinse tank of the crop sprayer of FIG. 1.
Figure 32B:
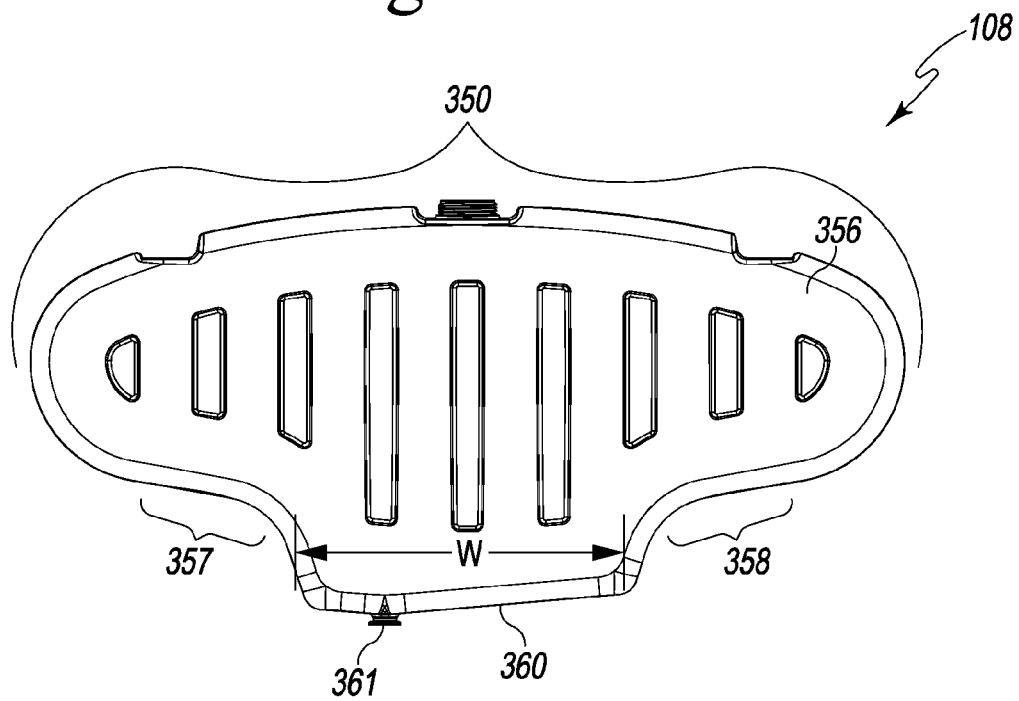
FIG. 32B is an end elevational view of the rinse tank of FIG. 32A.
Figure 33:
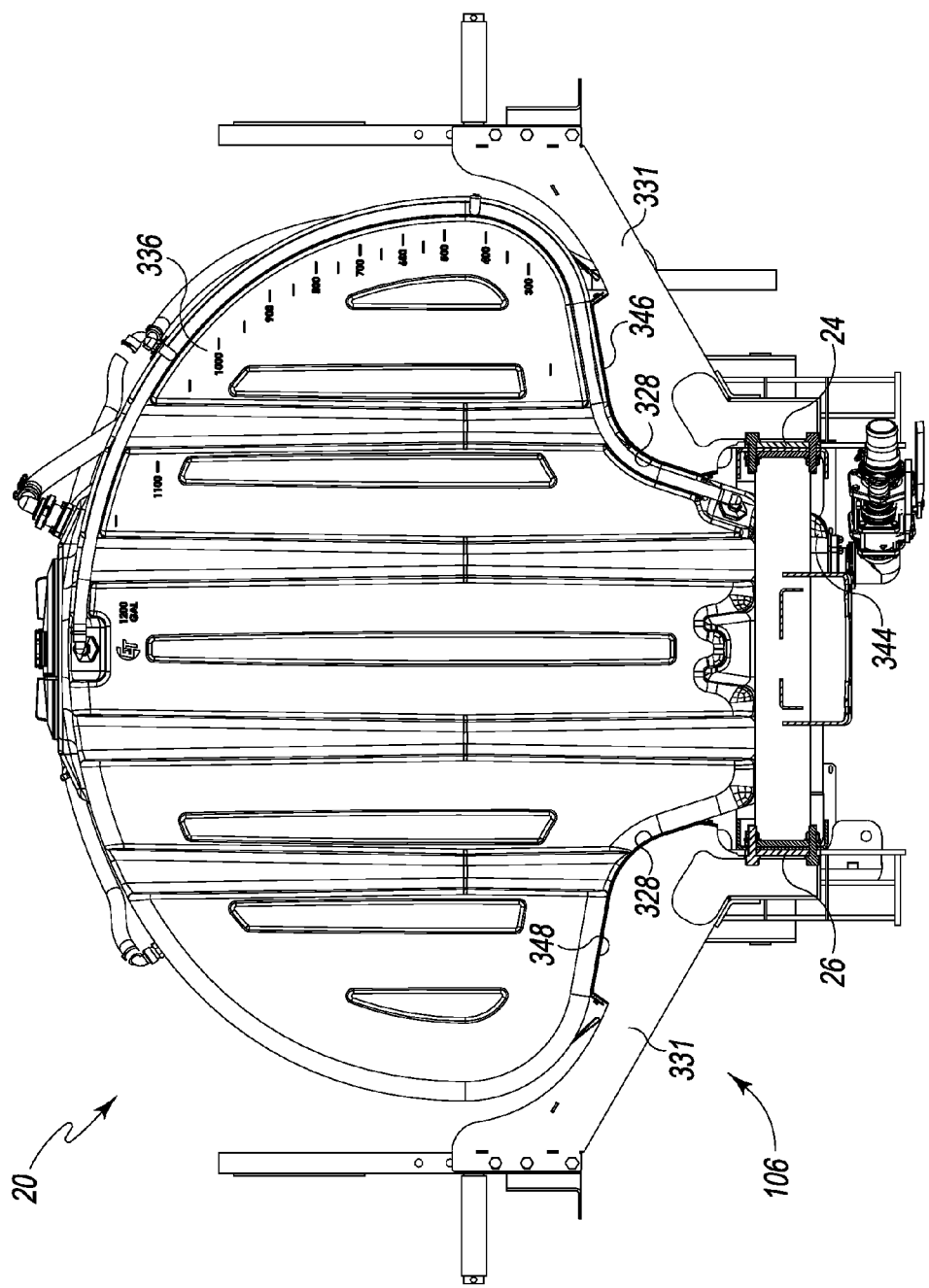
FIG. 33 is an end view of the tank support assembly of FIG. 29 showing the product tank of FIG. 31A supported thereon.
Figure 34:
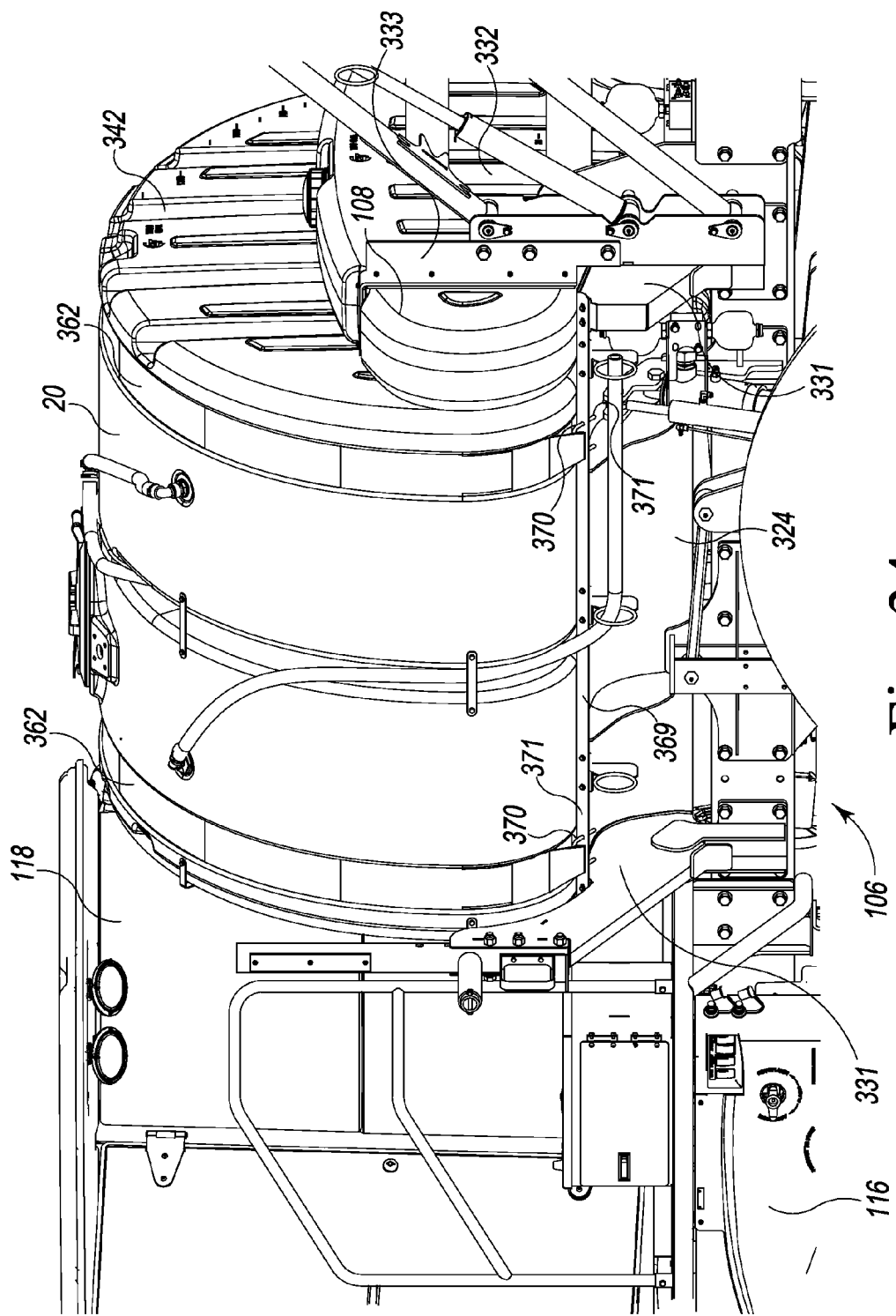
FIG. 34 is a perspective side view of the crop sprayer showing the product tank of FIG. 31A and rinse tank of FIG. 32A supported on the tank support assembly of FIG. 29.
Figure 35:
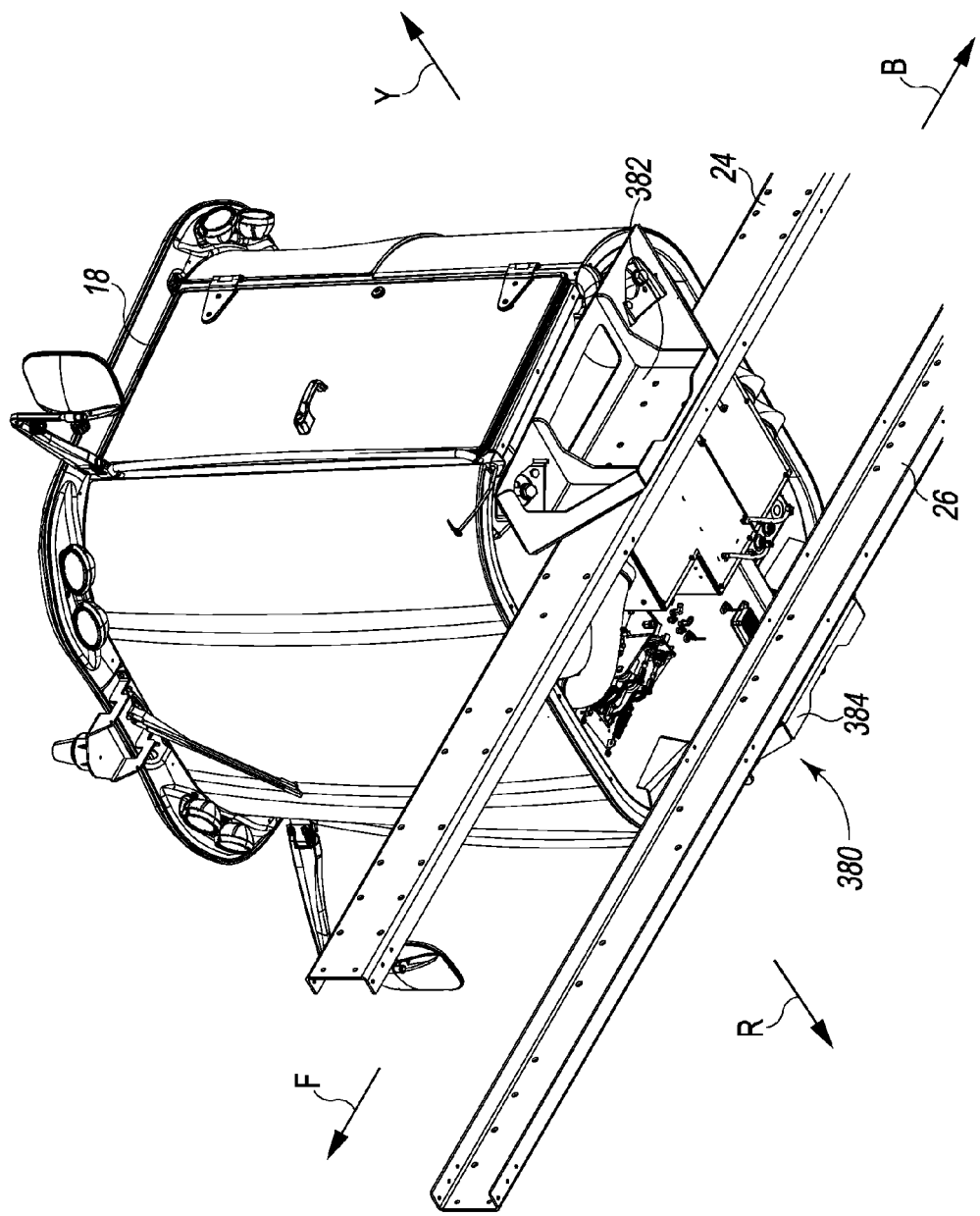
FIG. 35 is a partial view of the crop sprayer of FIG. 1 showing the cab attached to the main frame by a cab mounting assembly.
Figure 36:
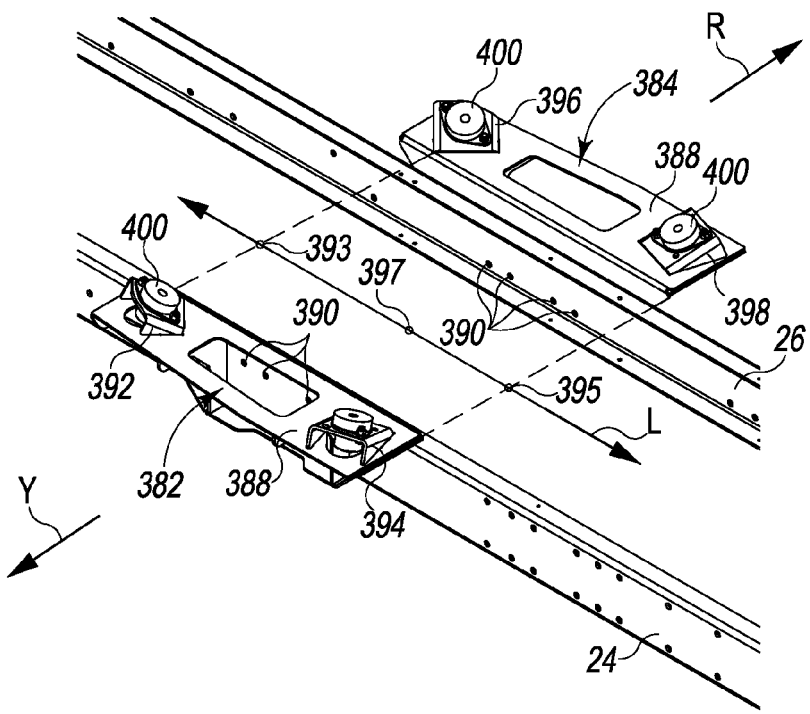
FIG. 36 is a perspective view of the cab supports of the cab mounting assembly of FIG. 35 shown secured to the main frame of the crop sprayer.
Figure 37:
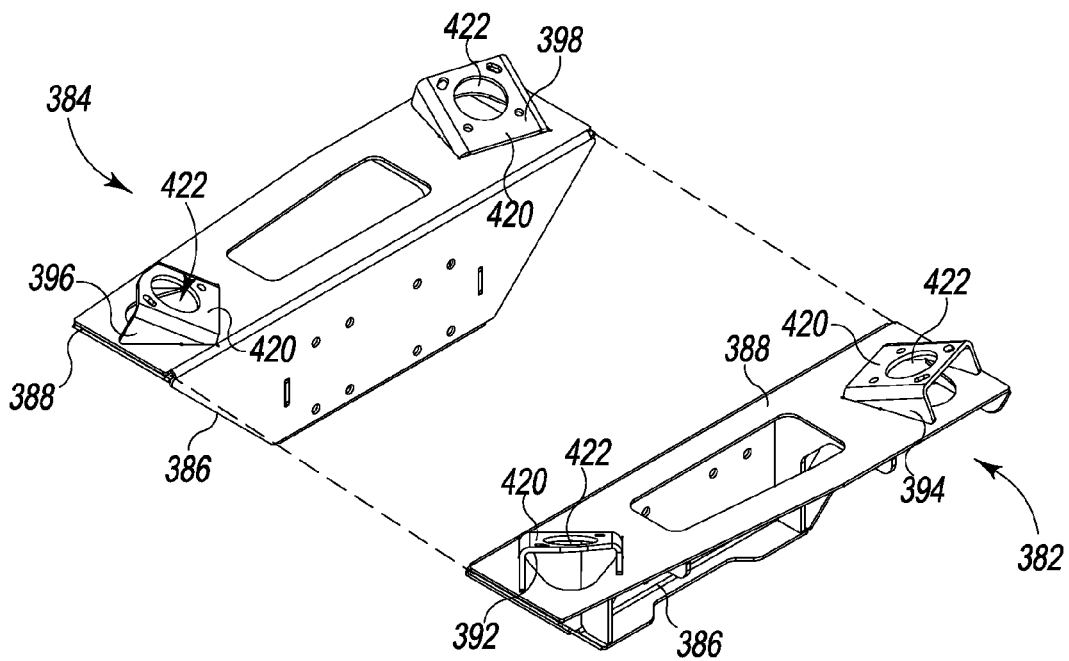
FIG. 37 is a perspective of the cab supports of FIG. 36.
Figure 38:
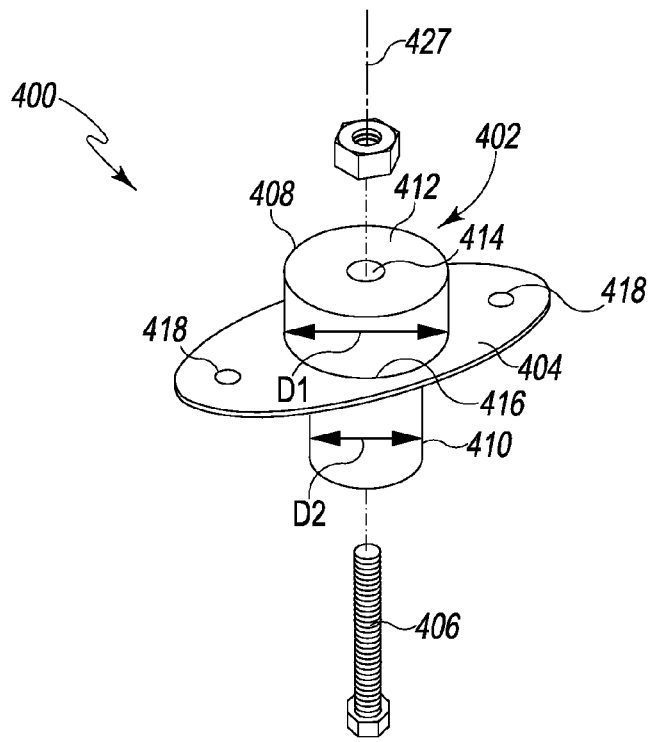
FIG. 38 is an exploded view of a vibration-isolation member of the cab mounting assembly of FIG. 35.
Figure 39:
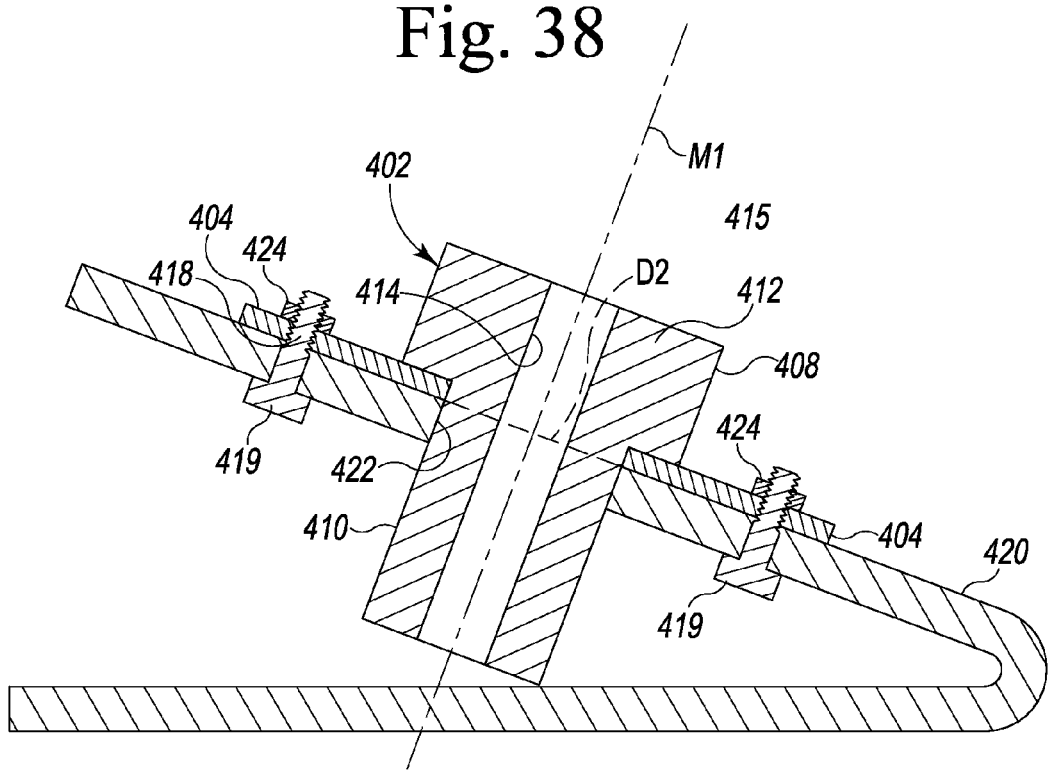
FIG. 39 is a cross-sectional view showing the vibration-isolation member of FIG. 38 secured to a support structure of a cab support.
Figure 40:
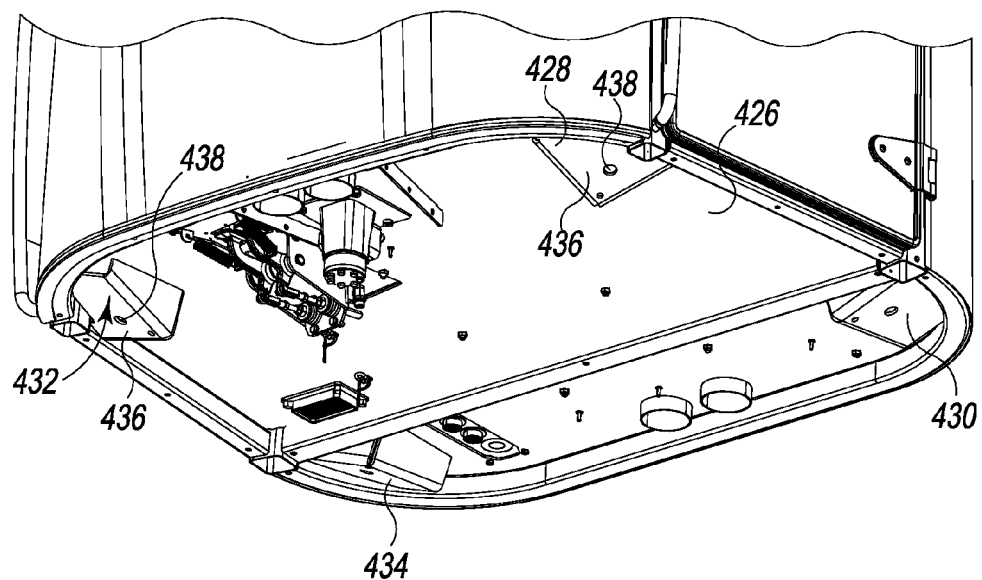
FIG. 40 is a perspective view of the base support member of the cab of the crop sprayer of FIG. 1 showing the frame mounting structures of the cab mounting assembly.
Figure 41:
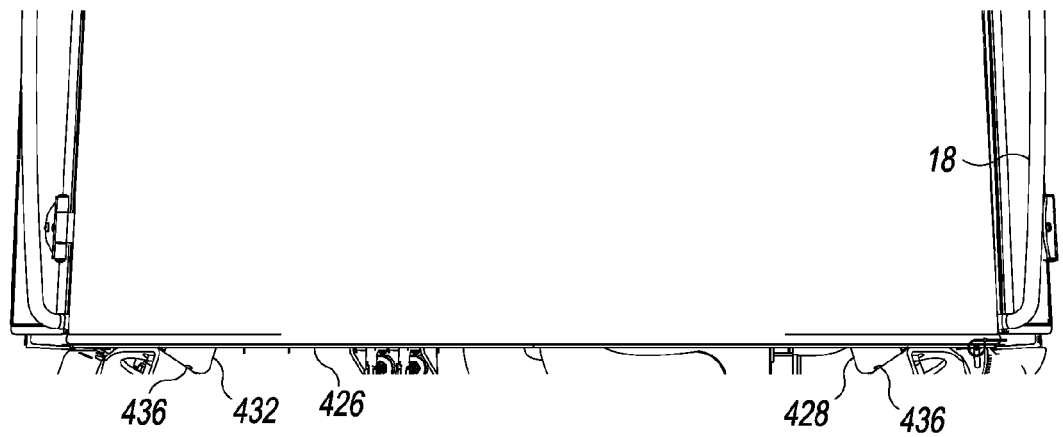
FIG. 41 is a front view of the cab showing the frame mounting structures of the cab mounting assembly of FIG. 35.
Figure 42:
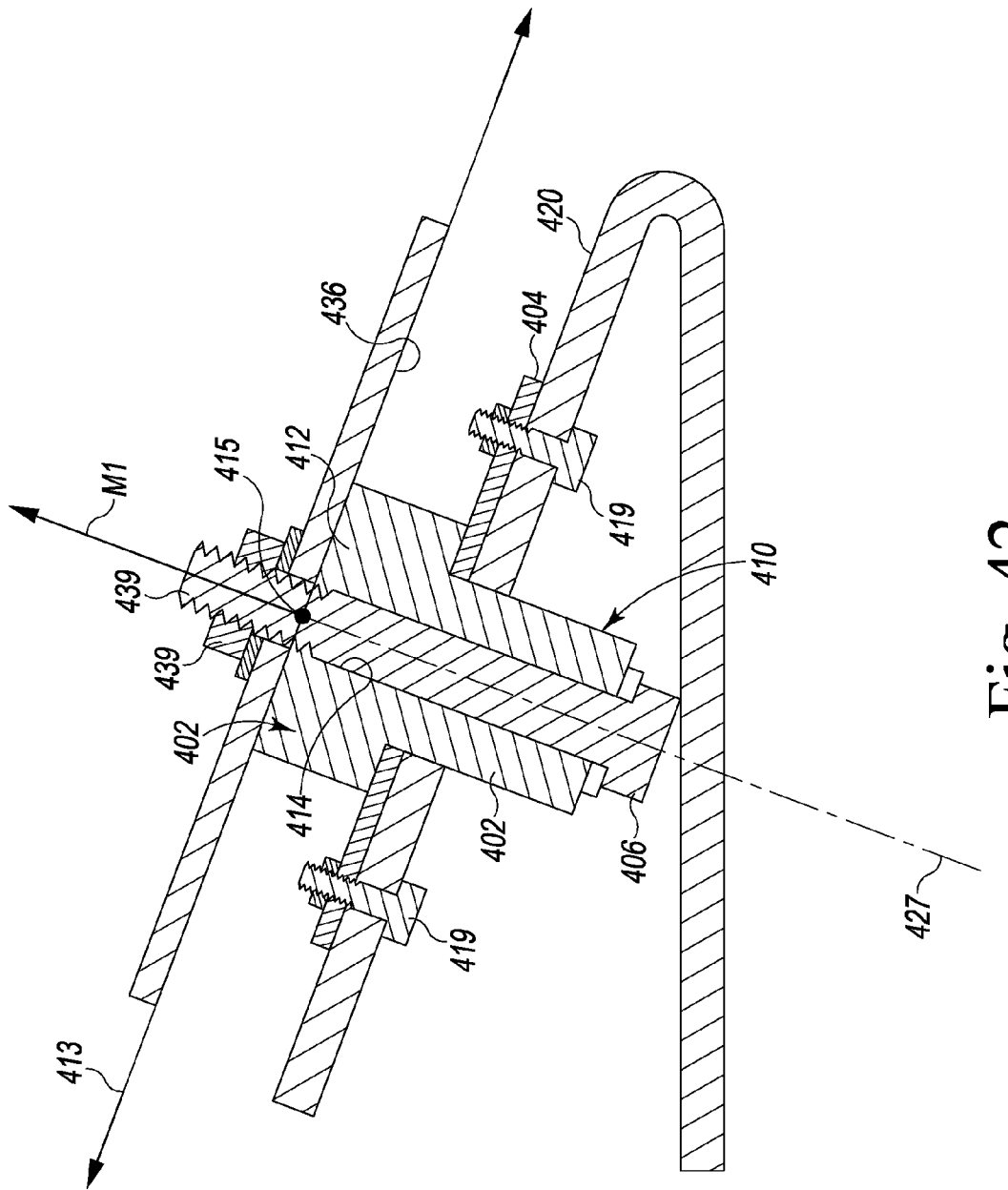
FIG. 42 is a cross-sectional view of the vibration-isolation member of FIG. 37 secured between a cab mounting structure and a frame mounting structure.

Referring now to FIGS. 32A and 32B, an embodiment of a rinse tank 108 for the crop sprayer 10 is depicted. The rinse tank 108 includes an upper wall portion 350 and a lower wall portion 352 that extend between a leading end portion 354 and a trailing end portion 356 of the rinse tank 108. The leading end portion 354 and the trailing end portion 356 are generally planar and are oriented toward the front portion 28 and rear portion 30 of the crop sprayer, respectively, when supported by the tank support assembly 106.

The lower wall portion 352 of the rinse tank 108 includes a central sump portion 360, a first lateral support portion 357 and a second lateral support portion 358. The first lateral support portion 358 extends from the upper wall portion 350 to the central sump portion 360 on a first side of the rinse tank. The second lateral support portion 358 extends from the upper wall portion 350 to the central sump portion 360 on a second side of the rinse tank. The sump portion 360 includes a drain structure 361 that enables the rinse tank to be drained.

The first and second lateral support portions 346, 348 of the product tank 20 and first and second lateral support portions 357, 358 of the rinse tank 108 each have a generally elongated concave cross-sectional shape in planes perpendicular to the longitudinal axis L. When the product tank 20 and rinse tank 108 are positioned on the tank support assembly 106, the first lateral support portions 346, 357 of the product tank and rinse tank are positioned in mating contact with the upper tank contact portion 328 of the first tank support member 324, and the second lateral support portions 348, 358 are positioned in mating contact with the upper tank contact portion 328 of the second tank support member 326. The convex upper contact surfaces 328 of the tank support members are contoured complementary to the concave lateral support surfaces 346, 348, 357, 358 of the product tank 20 and rinse tank 108 which provides a stable resting position for the product tank 20 and rinse tank 108.

The central sump portions 344, 360 of the product tank 20 and rinse tank 108 each have an approximate width W that is less than the distance E between the first and second tank support members 324, 326. As a result, the sump portions 344, 360 of the product tank 20 and rinse tank 108 extend below the tank support members 324, 326. The sump portion 344 extends to a position between the main rails 24, 26. When the product tank 20 and rinse tank 108 are positioned on the tank support assembly 106, hold down brackets 333 positioned over the rinse tank 108 to prevent the rinse tank from being bounced out of position when traveling over rough terrain.

The tank support assembly includes straps 362 for removably attaching the product tank 20 to the tank support assembly 106. The straps 362 are looped over the top of the product tank 20 and attached to an edge portion 369 of the tank support members 324, 326 on each side of the product tank. Each strap 362 includes fastener structures 370 at each end for securing the straps 362 to the tank supports 324, 326. The fastener structure 370 comprises threaded U-bolts. The edge portions of the tanks supports define bores 371 for receiving the threaded U-bolts.

Cab Mounting System

Referring to FIGS. 35-44, the crop sprayer 10 includes a cab mounting system 380 for securing the cab 18 to the main frame 14. The cab mounting system 380 includes a first cab support member 382 and a second cab support member 384 that are secured to the first main rail 24 and the second main rail 26, respectively. The support members 382, 384 comprise bracket structures that are secured to the rails 24, 26 at positions directly opposite from each other in relation to the longitudinal axis L.

Each support member 382, 384 includes a frame attachment portion, or bracket base, 386 and a cab mounting portion 388, also referred to as cantilevered portion. The frame attachment portions 386 are secured to a main rail 24, 26 by fasteners 390, such as bolts, with the cab mounting portions 388 cantilevered outwardly from the respective main rail 24, 26 relative to the longitudinal axis L. In particular, the cab mounting portion 388 of the first support plate 382 is cantilevered from the main rail 24 in direction Y, and the cab mounting portion 388 of the second support plate 384 is cantilevered from the main rail 26 in direction R.

The cab mounting portion 388 of the first support plate 382 includes a first cab mounting structure 392 and a second cab mounting structure 394. The first cab mounting structure 392 is located at a first position 393 in relation to the longitudinal axis L that is closer to the front portion 28 of the crop sprayer. The second cab mounting structure 394 is located at a second position 395 in relation to the longitudinal axis L that is closer to the rear portion 30 of the crop sprayer.

The cab mounting portion 388 of the second support plate 384 includes a third cab mounting structure 396 and a fourth cab mounting structure 398. The third cab mounting structure 396 is located at the first position 393 in relation to the longitudinal axis L across from the first mounting structure 392. The fourth cab mounting structure 398 is located at the second position 395 in relation to the longitudinal axis L across from the second cab support structure 394. The cab mounting structures are positioned generally radially about a central point 397 on the longitudinal axis L of the crop sprayer.

A vibration-isolation member 400 is secured to each of the cab support structures. The vibration-isolation members 400 each comprise a cylindrically-shaped resilient member 402, a mounting plate 404, and a threaded fastener 406, or bolt. The resilient member 402 is formed of resilient material, such as hard or high durometer rubber.

The resilient member 402 includes a first cylindrical portion 408 having a first diameter D1, and a second cylindrical portion 410 that extends axially from the first portion 408 having a diameter D2 that is less than the diameter D1. The first portion includes a planar end portion 412 for contacting a mounting surface of the cab. The resilient member 402 defines an axial bore 414 that extends through both the first portion 408 and the second portion 410 that is sized to receive the threaded fastener 406.

The mounting plate 404 of the vibration-isolation member defines a central bore 416 having approximately the diameter D2 in which the second portion 410 of the resilient member is received. The mounting plate 404 also defines fastener openings 418 on each side of the central bore 416 for receiving fasteners 419 that are used to secure the mounting plate 404 to a cab support structure. The central bore 416 defines a longitudinal axis of the resilient member 400.

Each cab mounting structure has a planar mounting surface 420 to which the mounting plate 404 of a vibration-isolation member 400 is secured. The cab mounting structures each define a central bore 422 that extends through the mounting surface 420 having approximately the diameter D2 for receiving the second portion 410 of the resilient member 402, and fastener openings 424 that extend through the mounting surface 420 that are sized and positioned complementary to the fastener openings 418 in the mounting plate 404.

A vibration-isolation member 400 is secured to each cab support structure 392, 394, 396, 398 with the second portion 410 of the resilient members 402 extended through the central bore 422 of the cab mounting structure and the mounting plate 404 positioned in contact with the mounting surface 420 so that the first portion of the resilient member extends generally vertically from the support structure. The fastener openings 418, 424 of the mounting plate and the support structure are aligned, and fasteners 419, such as bolts, are inserted through the aligned fastener openings 418, 424 to secure the mounting plate 404 to the cab support structure.

The cab mounting system 380 also includes frame mounting structures provided on the base support member 426 of the cab 18 for securing the cab to the cab mounting structures. In particular, the base support member 426 of the cab includes a first frame mounting structure 428, a second frame mounting structure 430, a third frame mounting structure 432, and a fourth frame mounting structure 434. Each frame mounting structure includes a planar mounting surface 436 and defines a bore 438 that extends through the planar mounting surface 436. The bores 438 are sized to receive the threaded fastener 406 of the vibration-isolation members.

To mount the cab to the frame, cab 18 is positioned over the frame 14 with the planar mounting surfaces 436 of the frame mounting structures positioned in engagement with the planar end portions 412 of the resilient members 402 and the axial bore 414 of the resilient members 402 aligned with the bores 438 in the frame attachment structures. The fastener 406 is then inserted through the aligned bores until the head of the fastener engages the second end portion resilient member and the longitudinal portion of the fastener protrudes from the bore in the frame mounting structure. The end portion of the fastener 406 is then threaded into a weld nut 439 secured to the frame mounting structure to secure the fastener in the bore 414.

Figure 43:
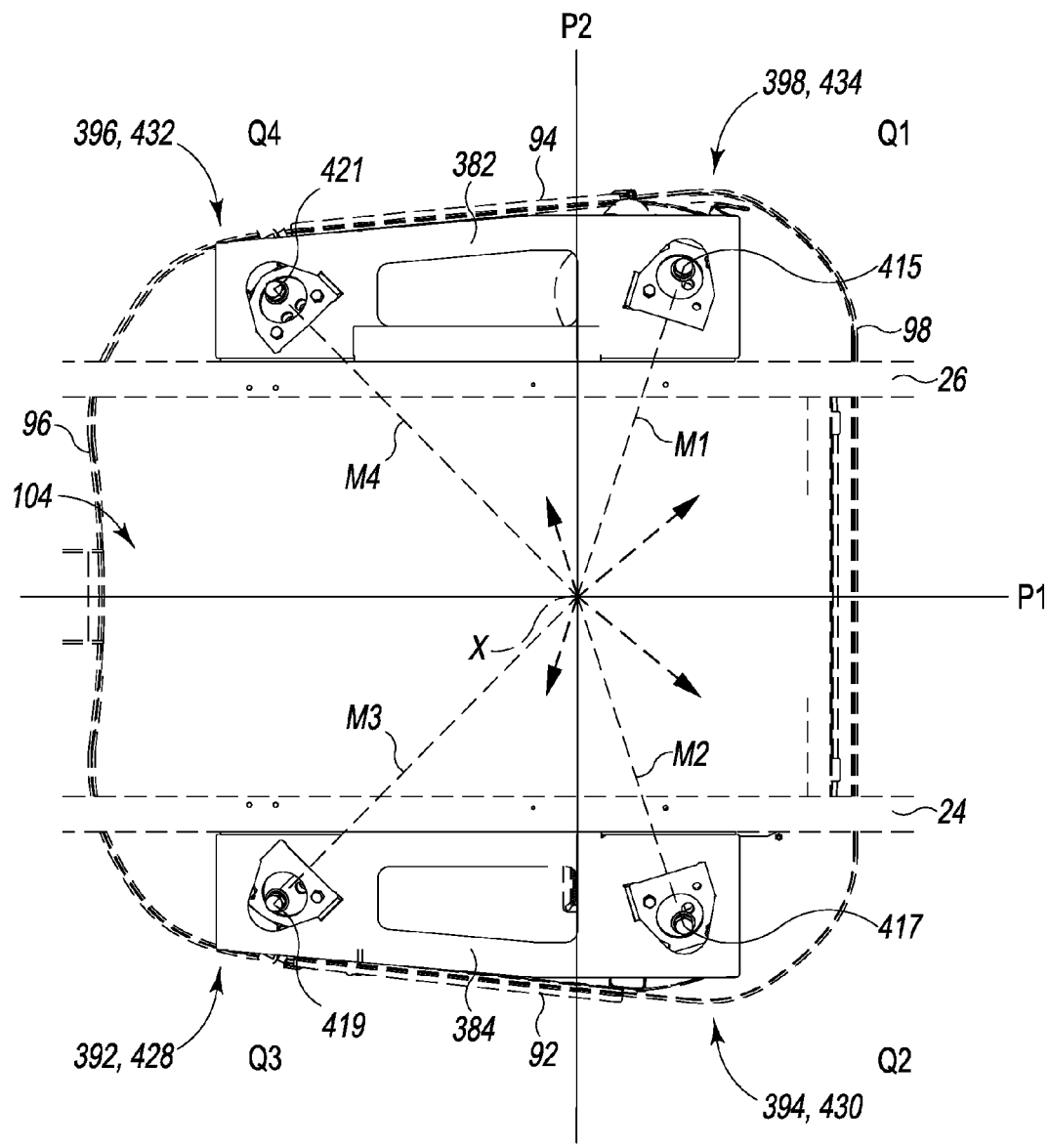
FIG. 43 is a top view of the cab showing the intersection of the rays defined by the mounting structures of the cab mounting assembly.

As depicted in FIG. 43, each cab mounting structure and frame mounting structure pair is located proximate a corner portion of the cab. For example, when a first plane P1 and a second plane P2 perpendicular to the first plane P1 are superimposed over the cab of the crop sprayer as depicted in FIG. 43, the intersecting planes P1, P2 define four corner portions, or quadrants Q1, Q2, Q3, Q4. A cab mounting structure and frame mounting structure pair are positioned in each of the quadrants Q1, Q2, Q3, Q4.

The cab mounting structures and frame mounting structures are angled with respect to horizontal so that the axes of the resilient members are oriented toward a vertical and centered position. For instance, each cab mounting structure and frame mounting structure pair defines an interface plane. More specifically, the planar surface 412 of the resilient member of the cab mounting structure and the planar mounting surface 436 of the frame mounting structure define an interface plane 413. The cab mounting structure 392 and frame mounting structure 428 define a first interface plane, the cab mounting structure 394 and the frame mounting structure 430 define a second interface plane, the cab mounting structure 396 and frame mounting structure 432 define a third interface plane, and the cab mounting structure 398 and the frame mounting structure 434 define a fourth interface plane.

Each cab mounting structure and frame mounting structure pair defines a ray M that originates in the interface plane 413 and extends from the interface plane in a direction perpendicular to the interface plane 413. The cab mounting structure 398 and frame mounting structure 434 define a first ray M1, the cab mounting structure 394 and the frame mounting structure 430 define a second ray M2, the cab mounting structure 392 and frame mounting structure 428 define a third ray M3, and the cab mounting structure 396 and the frame mounting structure 432 define a fourth ray M4.

Each of the first, second, third, and fourth rays originates in the bore interface plane also defines a ray origin, e.g., first ray origin 415, that corresponds to the point where the longitudinal axis 427 of the resilient member 404 intersects the interface plane in the bore 404. Referring to FIG. 43, the first ray M1 has a first ray origin that is located in the first quadrant Q1. The mounting pair 394, 430 define a second ray M2 having a second ray origin 417 located in the second quadrant Q2. The mounting pair 392, 428 define a third ray M3 having a third ray origin 419 located in the third quadrant. The mounting pair 396, 432 define a fourth ray M4 having a fourth ray origin 421 located in the fourth quadrant.

The cab mounting structures and frame mounting structures are tilted such that the first ray M1 extends from the first quadrant Q1 to the third quadrant Q3, the second ray M2 extends from the second quadrant Q2 to the fourth quadrant Q4, the third ray M3 extends from the third quadrant Q3 to the first quadrant Q1, and the fourth ray M4 extends from the fourth quadrant Q4 to the second quadrant Q2.

Figure 44:
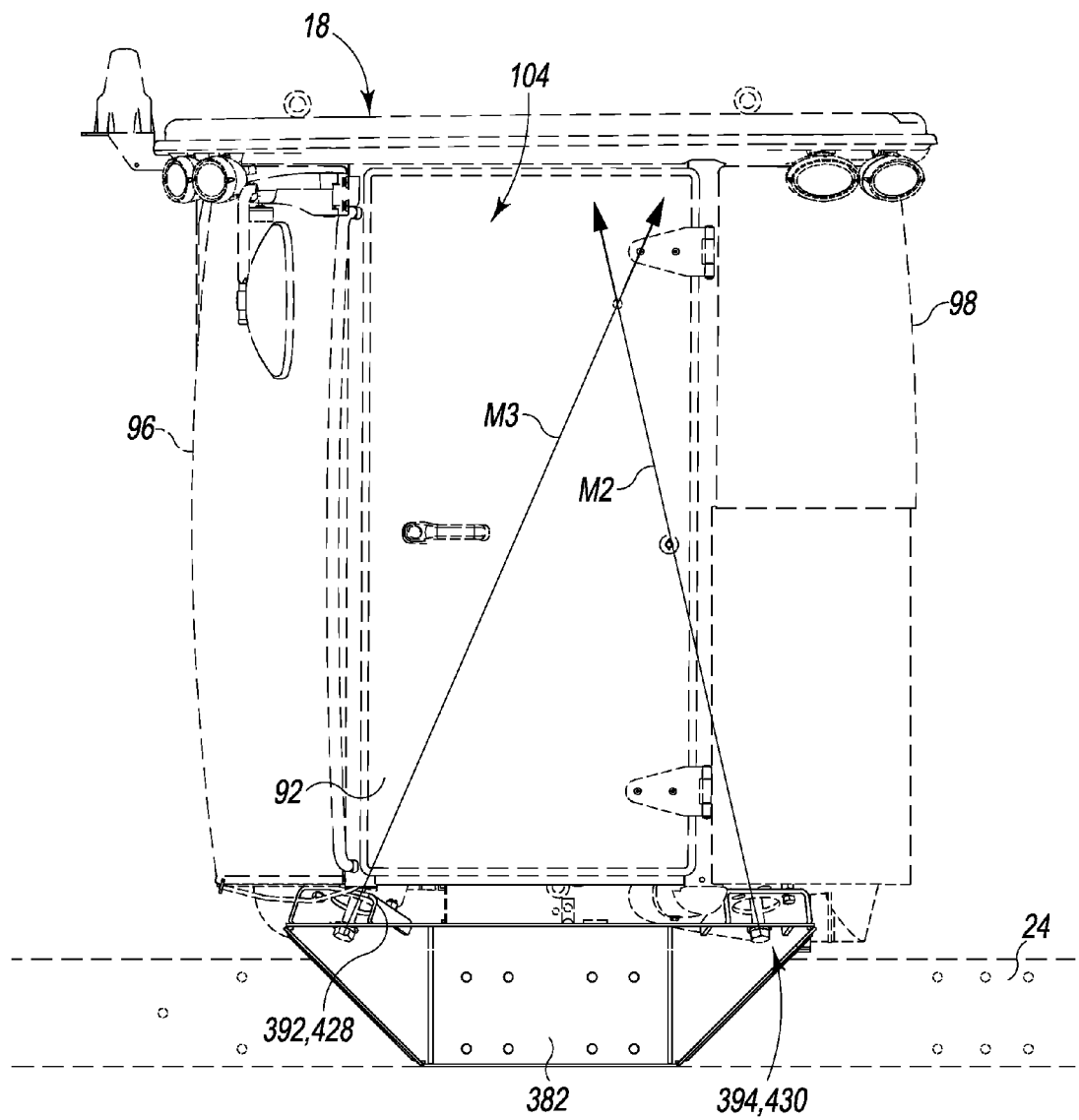
FIG. 44 is a side view of the cab showing the intersection of the rays defined by the mounting structures of the cab mounting assembly.
Figure 45:
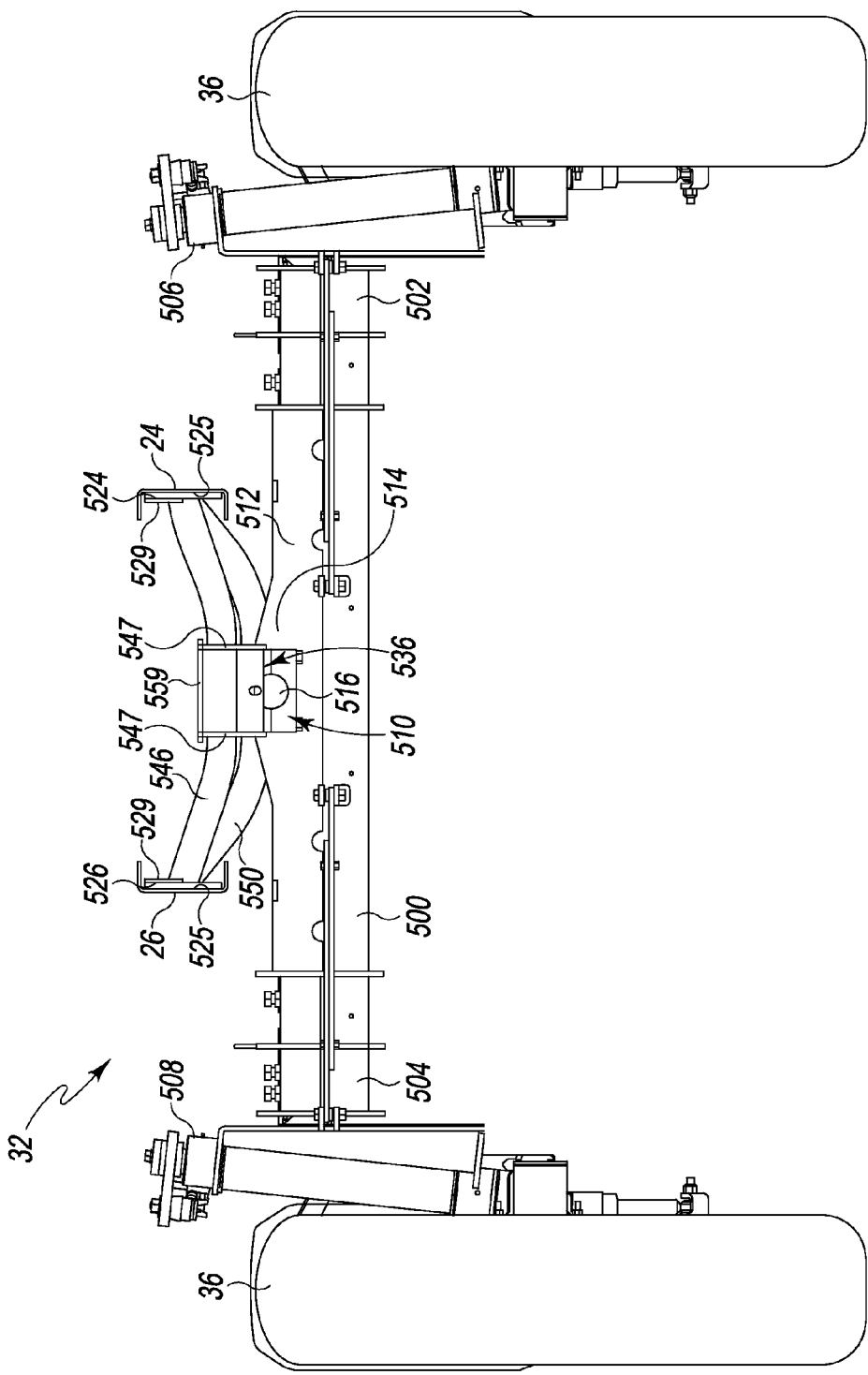
FIG. 45 is a front view of the pivot axle suspension assembly of the crop sprayer of FIG. 1 showing the bolster assembly.
Figure 46:
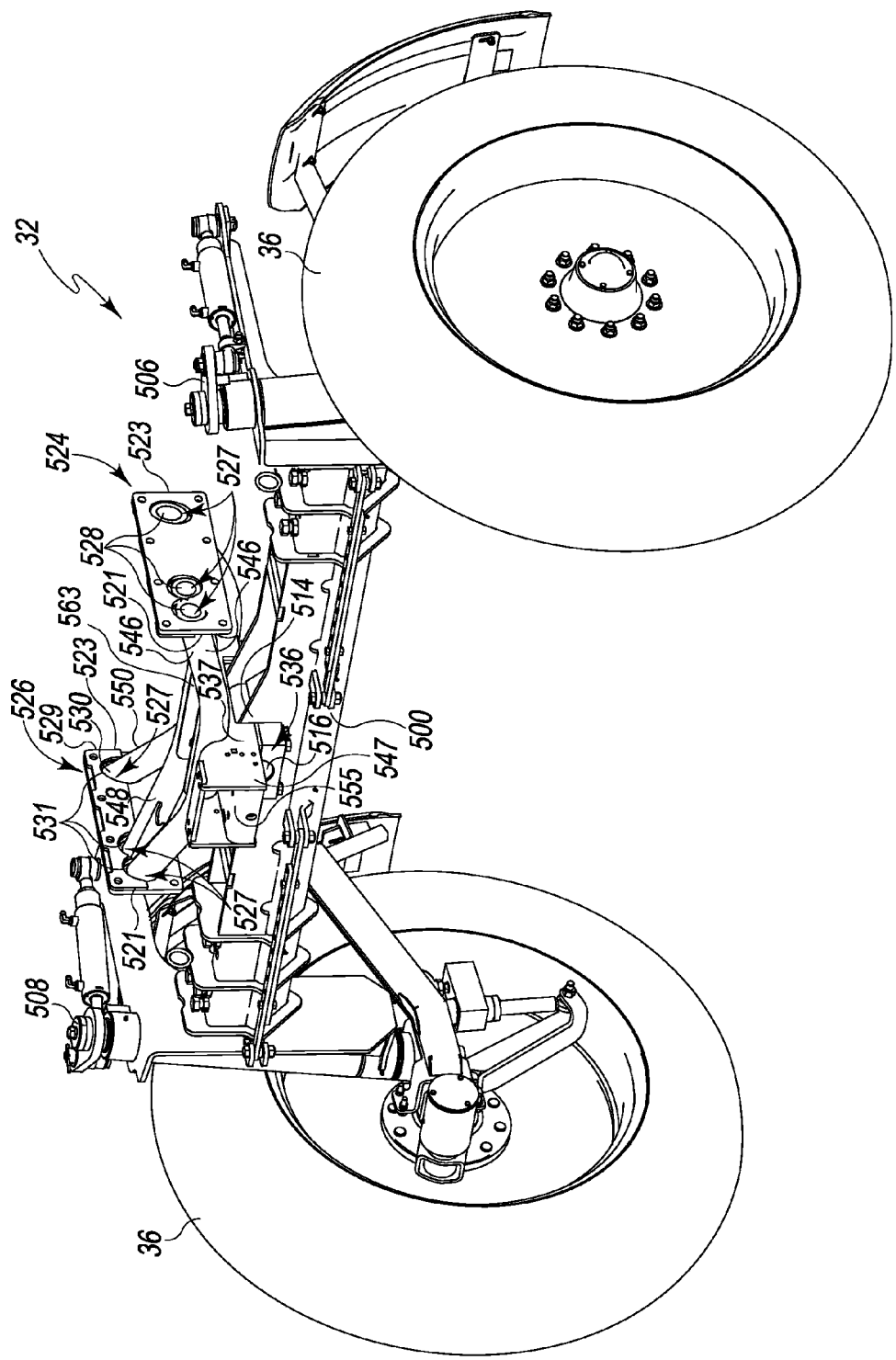
FIG. 46 is a perspective view of the pivot axle and bolster assembly of FIG. 45.
Figure 47:
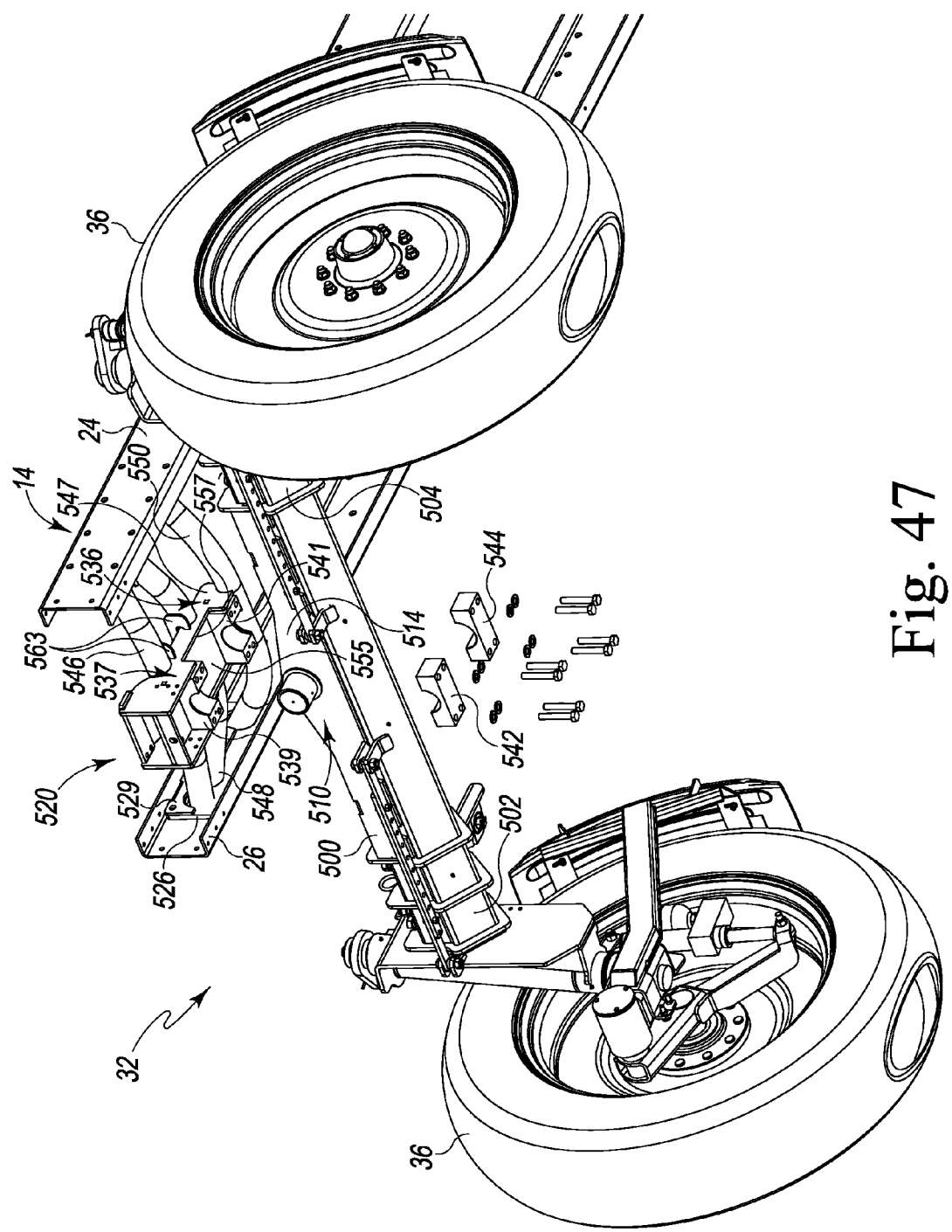
FIG. 47 is a perspective view of the bottom of the pivot axle and bolster assembly of FIG. 45 with the bearing housing caps removed.
Figure 48:
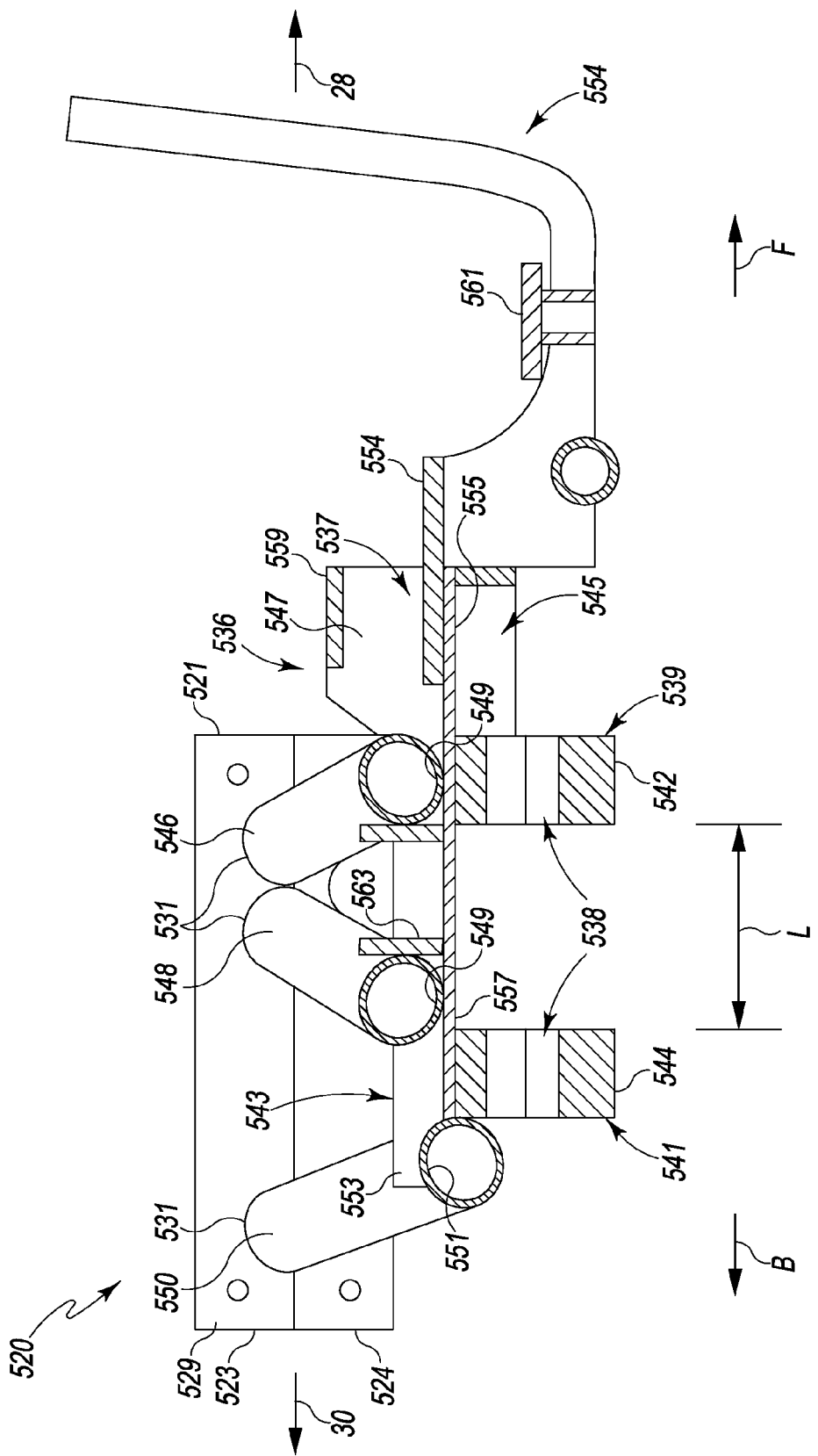
FIG. 48 is a cross-sectional view of the bolster assembly of FIG. 45.
Figure 49:
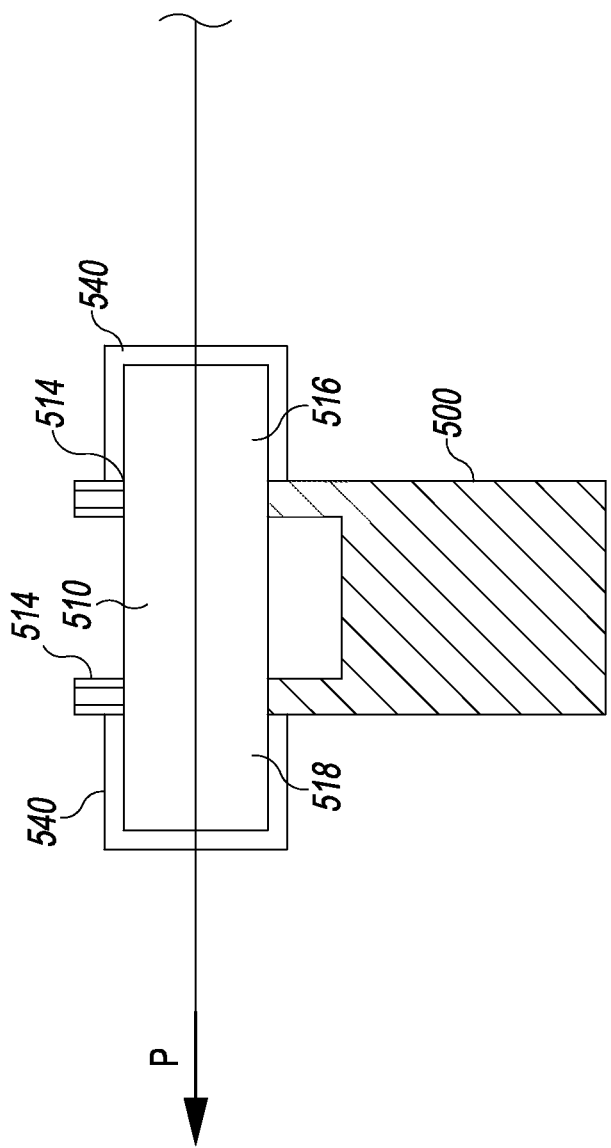
FIG. 49 is a cross-sectional view of the bearing pin of the pivot axle of FIG. 45.
Figure 50:
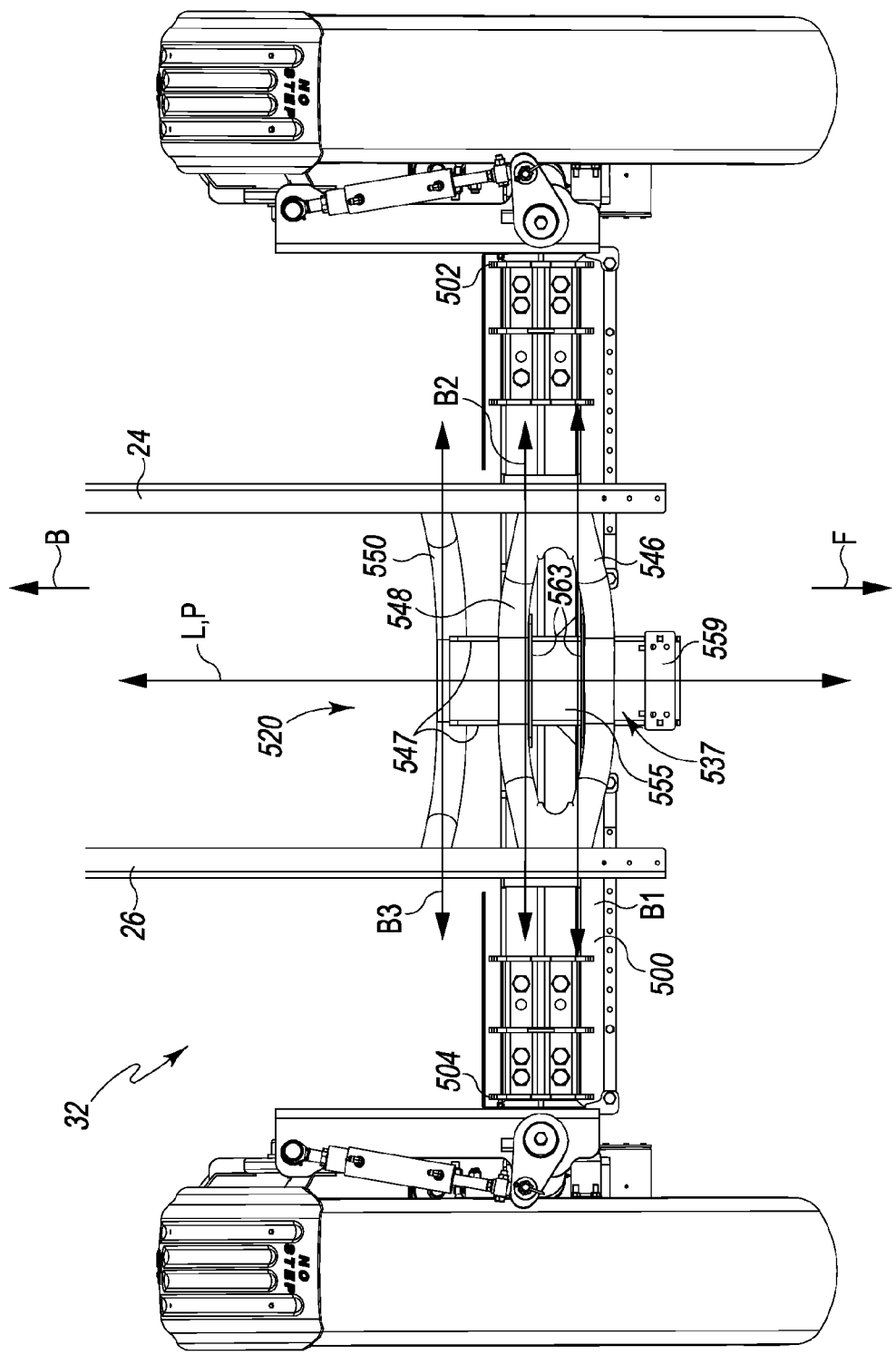
FIG. 50 is a top view of the pivot axle suspension assembly of FIG. 45.
Figure 51:
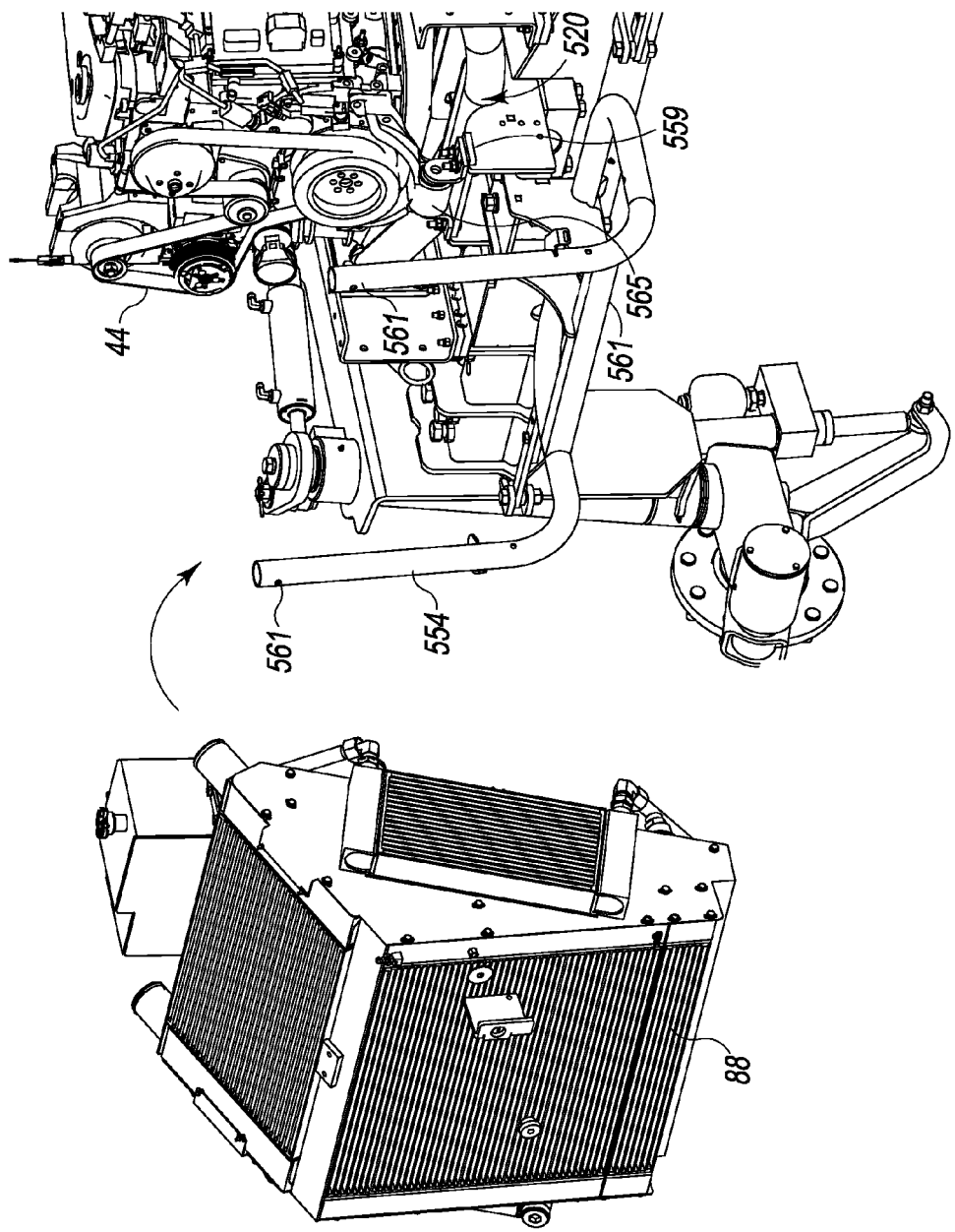
FIG. 51 is a perspective view of the front portion of the crop sprayer showing the engine mounted to the bolster assembly and the cooling system support with the cooling system removed.
Figure 52:
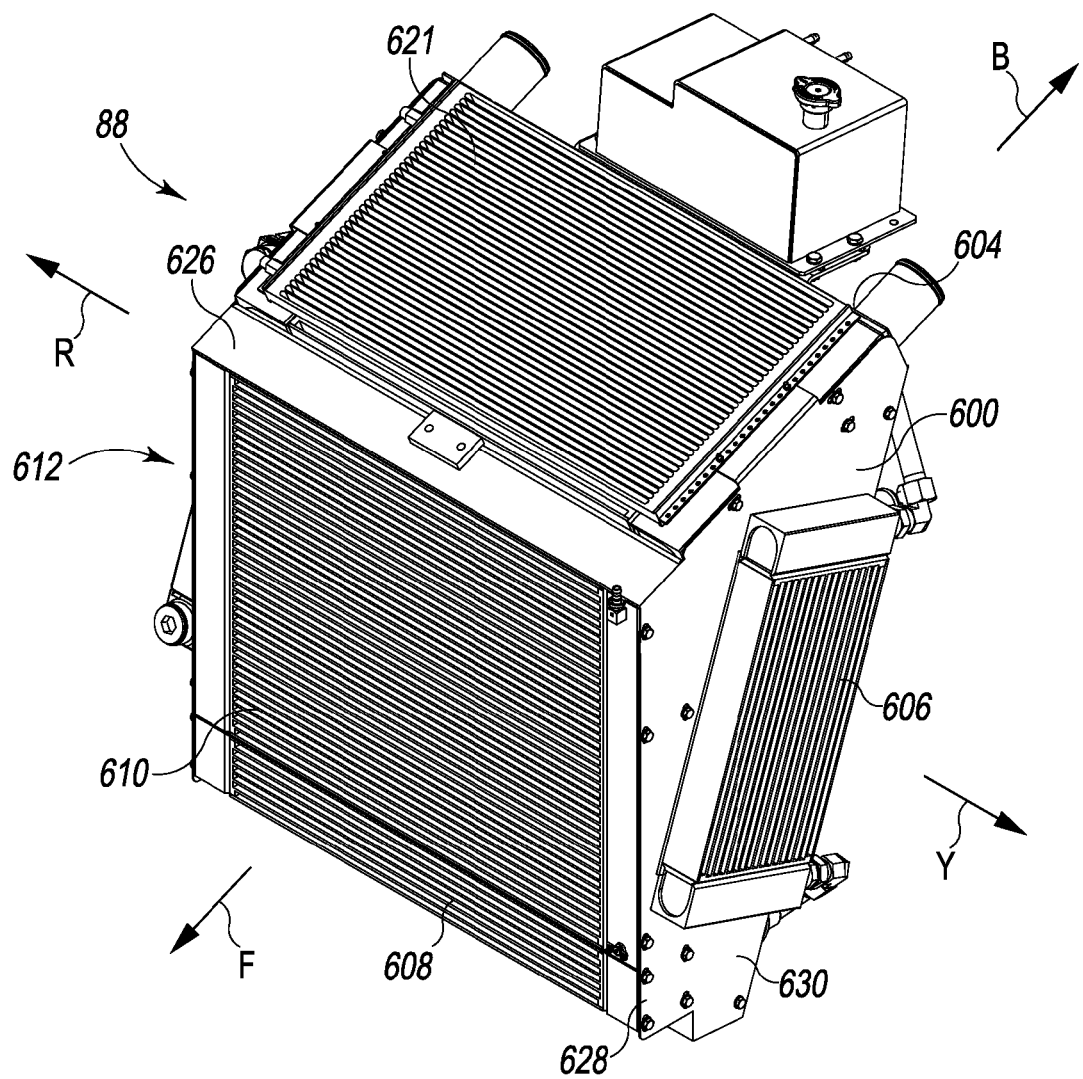
FIG. 52 is a perspective view of the cooling system of the crop sprayer of FIG. 1.
Figure 53:
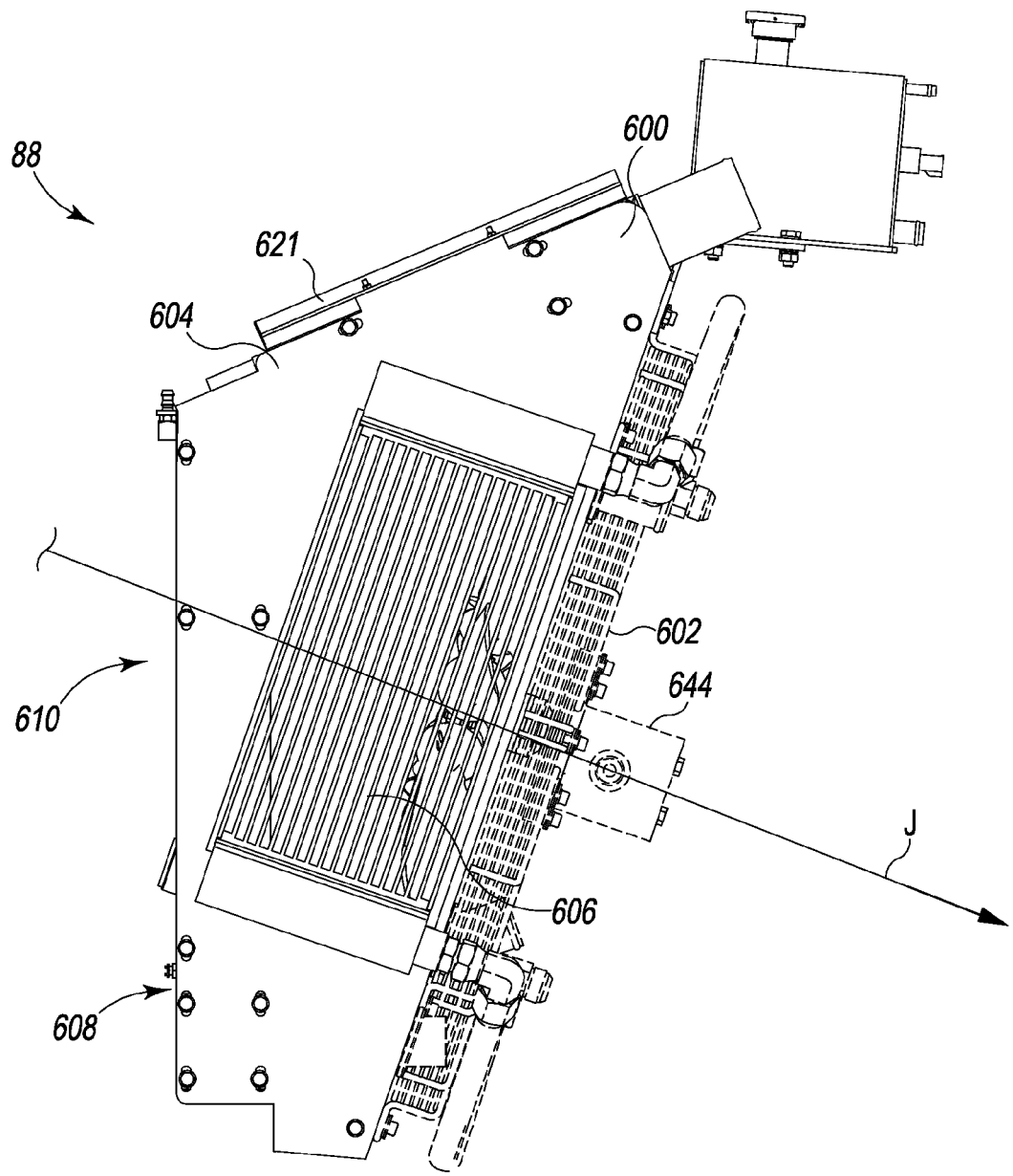
FIG. 53 is a side view of the cooling system of FIG. 52.
Figure 54:
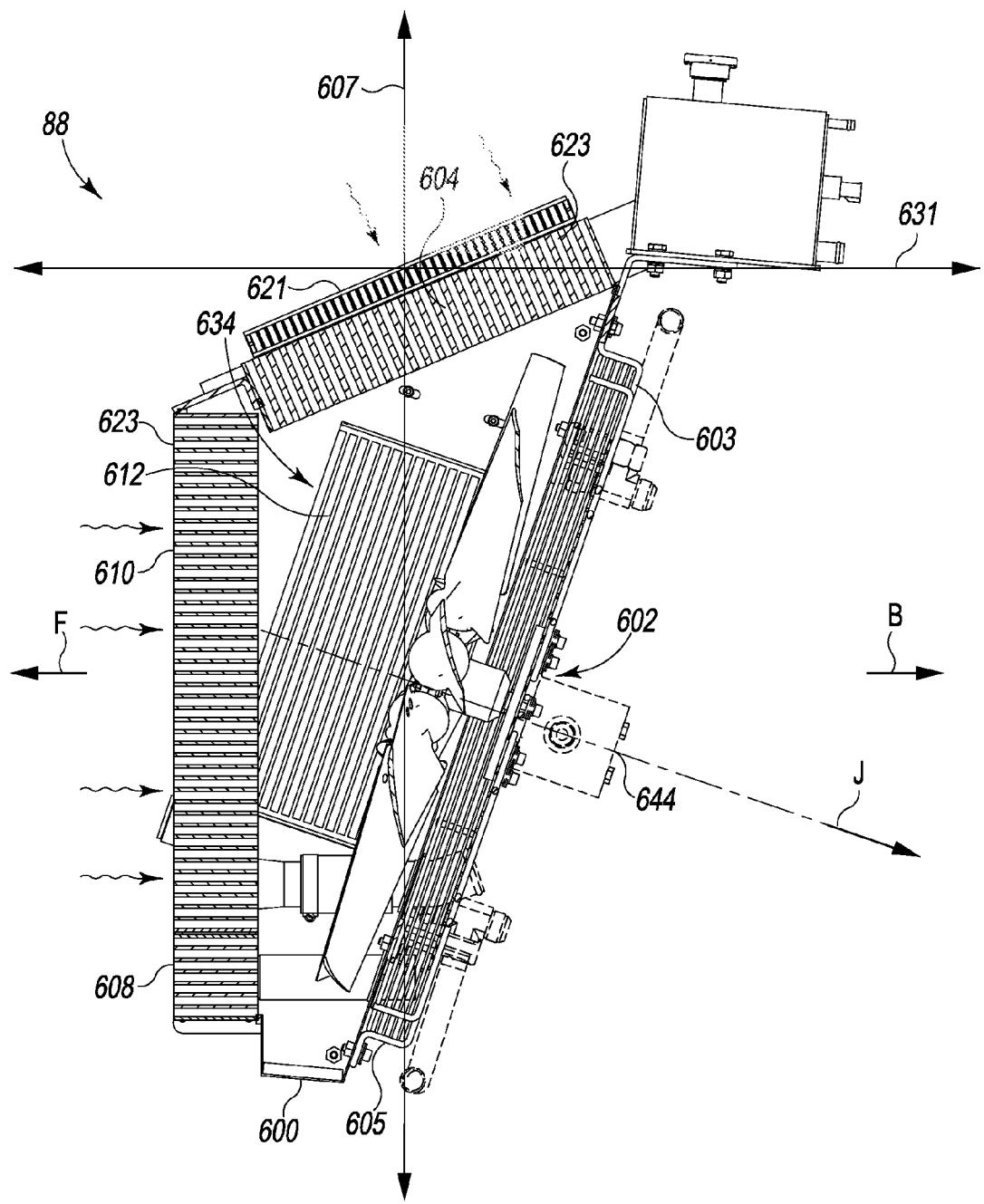
FIG. 54 is a side cross-sectional view of the cooling system of FIG. 53.

As depicted in FIGS. 43 and 44, the first ray, second ray, third ray, and fourth ray all extend through the cab operator space 104 and intersect at a common point X located within the cab. To enable the rays M1, M2, M3, M4 to converge at a vertical and centered position in the cab, each cab support structure 392, 394, 396, 398 protrudes from the cantilevered portion 388 of the support members to form a ramp-like structure to position the mounting surfaces 420 at the appropriate angle and orientation. Similarly, the frame mounting structures 428, 430, 432, 434 protrude from the base support member 426 to form ramp-like structures to position the mounting surfaces 436 at a complementary angle and orientation.

The angled mounting surfaces 420, 436 result in the support axes 427 of the vibration-isolation members 400 and rays M1, M2, M3, and M4 intersecting at a vertical and centered position X within the cab. This centers the cab movement around the operator and reduces the effects of rough terrain. The angled mounting surfaces enable the up and down movement as well as side to side movement of the cab to place the resilient member in compression rather than shear. Reducing the amount of shear the vibration-isolation members 400 are exposed to prolongs the life of the resilient members in addition to creating a softer ride. The support members 382 384 are cantilevered to the main frame which provides further resiliency to aid in the absorption of impacts and jolts.

Pivoting Axle Suspension Assembly

Referring to FIGS. 45-51, the front axle assembly 32 comprises a pivot axle that is configured to oscillate in a plane that is perpendicular to the longitudinal axis L of the crop sprayer. Pivoting the front axle 32 with respect to the main frame 14 can reduce the risk of damage from twisting and torsion of the main frame when traveling over uneven and rough terrain. As depicted, the pivot axle 32 includes an elongated axle component 500 having a first end portion 502 and a second end portion 504. A first wheel attachment assembly 506 is secured to the first end portion 502, and a second wheel attachment structure 508 is secured to the second end portion 504 of the axle component 500.

The pivot axle 32 includes a bearing component 510 that is secured to an upper portion 512 of the elongated axle component 500 at a central location between the first and second end portions 502, 504. The bearing component 510 includes a convex bearing surface. The bolster assembly includes a bearing component 536 includes a concave bearing surface configured to receive the convex bearing surface therein. As depicted, the bearing component 510 comprises a cylindrical bearing rod or pin. The longitudinal axis P of the bearing pin 510 corresponds to the pivot axis for the pivot axle 32. The upper portion 512 of the elongated axle component 500 includes a bearing pin retaining structure 514 in which the bearing pin 510 is secured. The end portions 516, 518 of the bearing pin 510 protrude from each side of the pin retaining structure 514 in a trunnion-like configuration.

The pivot axle 32 is suspended from the main frame 14 by a bolster assembly 520. The bolster assembly 520 comprises a first frame attachment member 524, a second frame attachment member 526, a plurality of tubular support members 546, 548, 550, and a bearing assembly 536. The first frame attachment member 524 is secured to the first main rail 24, and the second frame attachment member 526 is secured to the second main rail 26 at the leading end of the main frame 14. As depicted, the first and second frame attachment members 524, 526 each comprise metal plates bolted to the inner facing surfaces 525 of the first main rail 24 and second main rail 26, respectively.

The tubular support members 546, 548, 550 each include a first end portion 528, a second end portion 530, and an intermediate tube segment interposed therebetween. The first end portions and second end portions 528, 530 are secured, such as by welding, to the first frame attachment member 524 and the second frame attachment member 526, respectively. The frame attachment members 524, 526 define openings 527 in which the end portions 528, 530 of the tubular support members 546, 548, 550 are received. In addition, each of the first and second frame attachment members 524, 526 includes a stabilizing plate 529 secured to an upper portion of the plates. The lower portions of each of the stabilizing plates 529 define grooves 531 that are aligned with upper portions of each of the openings 527. The grooves 531 conform to the shape of the upper portions of the tubular support members 546, 548, 550 and serve to further restrain the end portions 528, 530 of the tubular support members from upward movement relative to the frame attachment members 524, 526.

The intermediate segments of the tubular support members 546, 548, 550 extend generally longitudinally between the first and second frame attachment members 524, 526. The first tubular support member 546 extends between the frame attachment members 524, 526 proximate the leading end portion 521 of each frame attachment member 524, 526. The axle component 500 is supported substantially below the first and second tubular support members 546, 548. The third tubular support member, or supplemental tubular member, 550 is spaced apart from the first and second tubular support members and extends between the frame attachment members proximate the trailing end portion 523 of each frame attachment member. The second tubular support member extends between the frame attachment members 524, 526 intermediate the first and third tubular support members 546, 550.

The bearing assembly 536 includes a bearing support 537, a first bearing housing 539, and a second bearing housing 541. The bearing support 537 includes an upper portion 543 and a lower portion 545. The upper portion 543 of the bearing support 537 is secured to each of the tubular support members 546, 548, 550. The first and second bearing housings 539, 541 are secured to the lower portion 545 of the bearing support 537 such that the bearing housings 539, 541 extend below the tubular support members.

The first bearing housing 539 and second bearing housing 541 each include a concave bearing surface. The concave bearing surfaces define a cylindrical opening configured to receive the respective end portions 516, 518 of the bearing pin 510. The bearing housings 539, 541 are positioned such that the bores 538 are aligned with each other and with the central longitudinal axis L of the crop sprayer. The first bearing housing 539 and the second bearing housing 541 are spaced apart from each other so that the first end portion 516 of the bearing pin is received in the bore 538 of the first bearing housing 539, and the second end portion 518 is received in the bore 538 of the second bearing housing 548. The end portions 516, 518 of the bearing pin each include bushings 540 to enable the end portions 516, 518 to rotate or pivot in the bores 538 of bearing housings 539, 541. As depicted, the bearing housings each have a split design with removable housing caps 542, 544 that provide access to the bores 538. The housing caps 542, 544 are removed from the housings 539, 541 to position the end portions 516, 518 in the bores 538. The housing caps 542, 544 are then bolted onto the housings 539, 541 to secure the end portions 516, 518 in the bores 538.

The tubular support members 546, 548, 550 must be able to withstand the weight of the main frame 14 and components mounted on the main frame 14 while being supported on the pivot axle 32 at a single point on the axle. The support members 546, 548, 550 of the bolster assembly 520 comprise formed steel tubes bent into an arcuate shape. The tubular members 546, 548, 550 are secured to the frame attachment members 524, 526 with the curves extending generally downwardly in an inverted arch configuration. The use of arched tubing allows the weight of the main frame 14 to be distributed along substantially the entire length of the tube members between the main rails 24, 26. The main rails 24, 26 serve as abutments that prevent the end portions 528, 530 of the tubular members from spreading apart under the weight of the main frame 14. The strength of the bolster also enables a slim, contoured design that allows the engine to be mounted lower and at a power angle. This angle increases driveline efficiencies.

The bearing support 537 is secured to the tubular members 546, 548, 550 at substantially the lowest extending portions of the tubular support members, i.e., the crown portions of the arches. As depicted, the bearing support 537 includes a pair of vertically oriented plate members 547 arranged spaced apart and parallel to each other and spanning the tubular support members. The upper portions of the vertical plate members 547 define notches or grooves 549 in which the lower portions of the first and second tubular support members 546, 548 are secured. The trailing portions of the vertical plate members 547 define grooves 551 in which the third tubular support member is secured. The trailing portions of the vertical plates 547 each include a flange 553 that sits on top of the third tubular support member 550. As depicted, the third tubular support member 550 extends downwardly from the main frame 14 farther than the first and second tubular support members 546, 548 which enables the flanges 553 of the vertical plate members 547 to extend over the third tubular support member 550.

A horizontal plate member 555 is secured between the pair of vertical plate members 537. The tubular support members 546, 548, 550 are secured to an upper surface of the horizontal plate member 555. The first and second bearing housings extend from the bottom surface of the horizontal plate member 555. The lower portions of the vertical plate members each define a notch 557 located between the bearing housings 539, 541 for receiving the bearing pin retaining portion 514 of the pivot axle.

The tubular members 546, 548, 550 may be arranged with their curves at different orientations to enhance the ability of the bolster assembly 520 to withstand forces and direct strength in different directions. For example, referring to FIG. 50, a first line B1 intersects the first and second end portions of the first tubular member 546. The first tubular member 546 is mounted to the bolster assembly 520 such that the intermediate tube segment extends forwardly and downwardly in relation to the first line B1. A second line intersects the end portions of the second tubular member 548. The second tubular member is mounted to the bolster assembly 520 with the curved intermediate tube segment extending rearwardly and downwardly in relation to the second line B2. A third line B3 intersects the end portions of the third tubular member 550. The third tubular member is secured to the bolster assembly with the curved intermediate tube segment extending forwardly and downwardly in relation to the third line B3.

In this configuration, the angled orientation of the first tubular support member 548 strengthens the bolster assembly against horizontal forces that act on the pivot axle in the rearward direction B. The angled orientation of the second tubular support member 548 strengthens the bolster assembly against horizontal forces that act on the pivot axle in the forward direction F. The angled orientation of the third tubular support member 550 strengthens the bolster assembly against horizontal forces that act on the pivot axle in the rearward direction B. The third tubular support member 550 also stabilizes the bearing support against pivotal movement with respect to the tubular members 546, 548, 550. The bearing support includes brace members 563 that are secured to the bearing support 537 between and adjacent to the first tubular member 546 and second tubular member 548.

The strength of the bolster assembly 520 enables the bolster assembly 520 to be used to support other components of the crop sprayer. For example, the bolster assembly 520 includes an engine support structure 559 positioned at the leading portion of the bearing support 537. The leading portion of the engine 44 includes a frame attachment structure 565 that is secured to the engine support structure 559. The bolster assembly 520 provides the sole support for the leading portion of the engine 44 via the engine support structure 559. The bolster assembly also includes a cooling system support member 554 for supporting the cooling system 88 at the front of the main frame 14. The cooling system support 554 is secured to the bearing support 537 extending in the forward direction F and includes mounting structures 561 for mounting the cooling system 88.

Cooling System Assembly

Referring now to FIGS. 52-59, the crop sprayer includes a cooling system 88. The cooling system 88 includes cooler housing 600, a fan assembly 602, and a plurality of heat exchange units 604, 606, 608, 610, 612, 624 sometimes referred to as coolers. In the embodiment of FIGS. 52-59, the cooling system 88 comprises six heat exchange units including a charge air heat exchange unit 604 for the charge air system, a first transmission heat exchange unit 606 for the transmission, a hydraulic fluid heat exchange unit 608, a en engine fluid heat exchange unit 610 for the engine, a condenser unit 621, and a second transmission heat exchange unit 612 for the transmission.

Both transmission exchange units 606, 612 are linked via crossover tubes 625, so while separated they work as a single unit. There is only one supply and return for both cores. The transmission cooler also includes a temperature bypass (not shown) which keeps the fluid in one unit to bring the temperature of the oil up to operating temp quicker. Once at this temp, the bypass opens to allowing both coolers to fill thereby increasing the cooling efficiency.

The heat exchange units 604, 606, 608, 610, 612, 621 are mounted to a heat exchange unit housing 600 that defines an air chamber 614. The fan assembly 602 is mounted to the housing 600 to draw air into the air chamber through the heat exchange units 604, 606, 608, 610, and 612 to cool the fluid traveling therethrough. The fan assembly 602 also forces air over the external components of the engine, creating addition cooling in the engine compartment 16.

Figure 55:
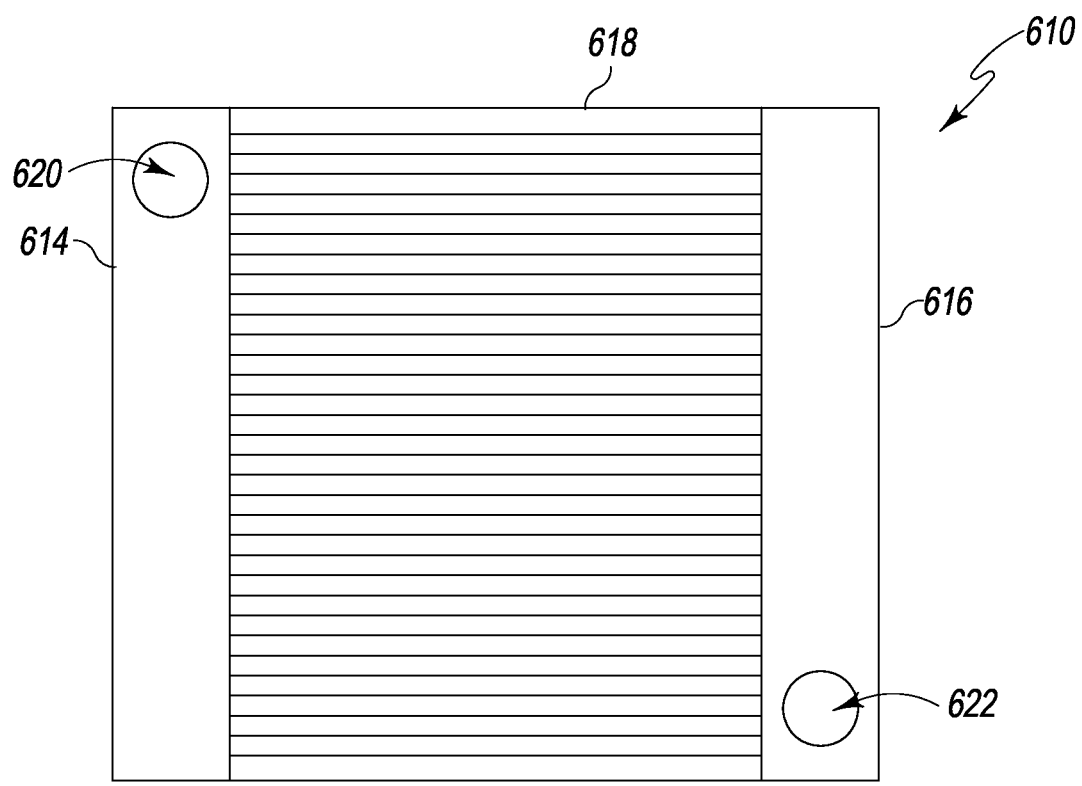
FIG. 55 is a view of a heat exchange unit of the cooling system of FIG. 52.
Figure 56:
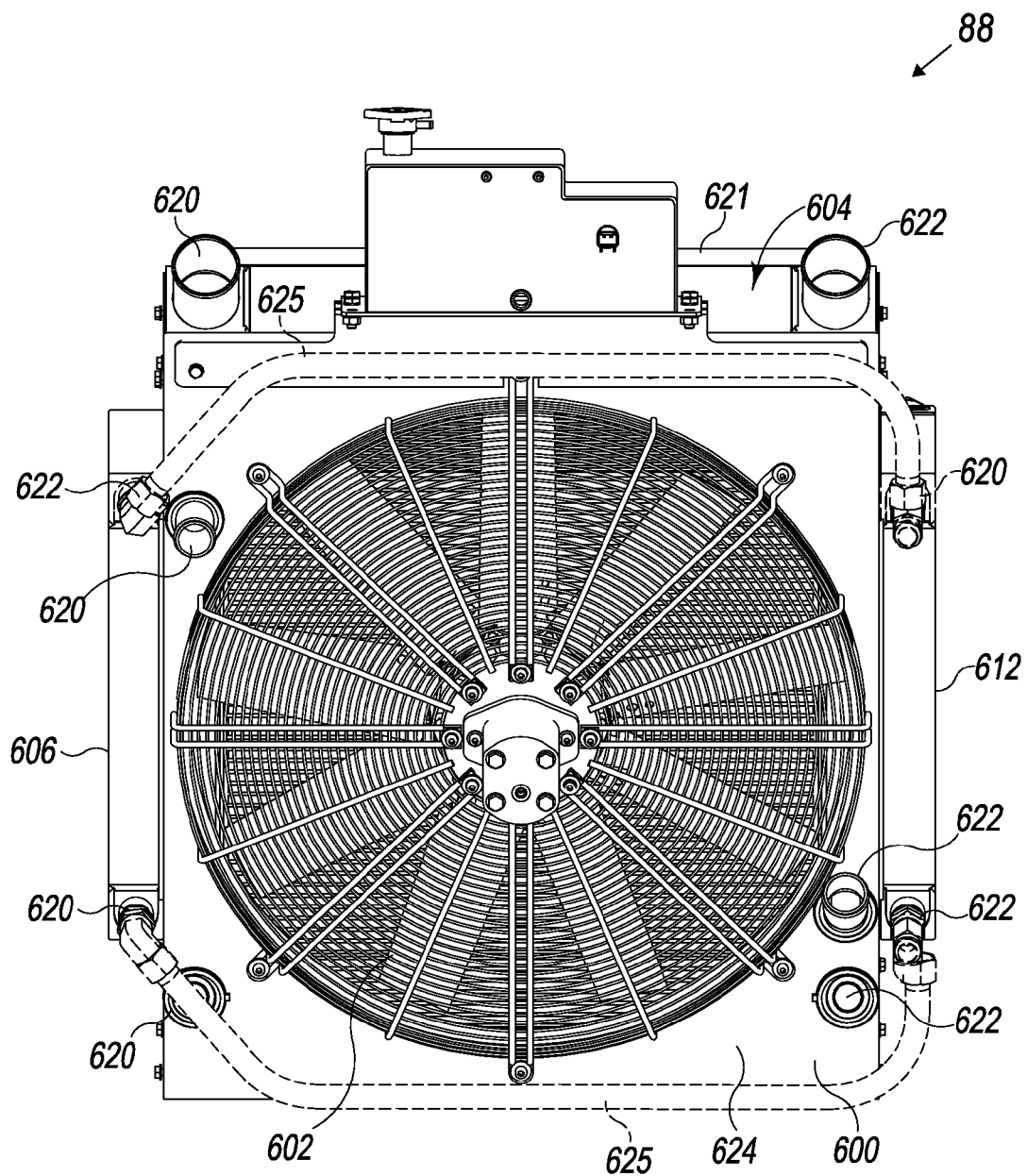
FIG. 56 is a rear elevational view of the cooling system of FIG. 52.
Figure 57:
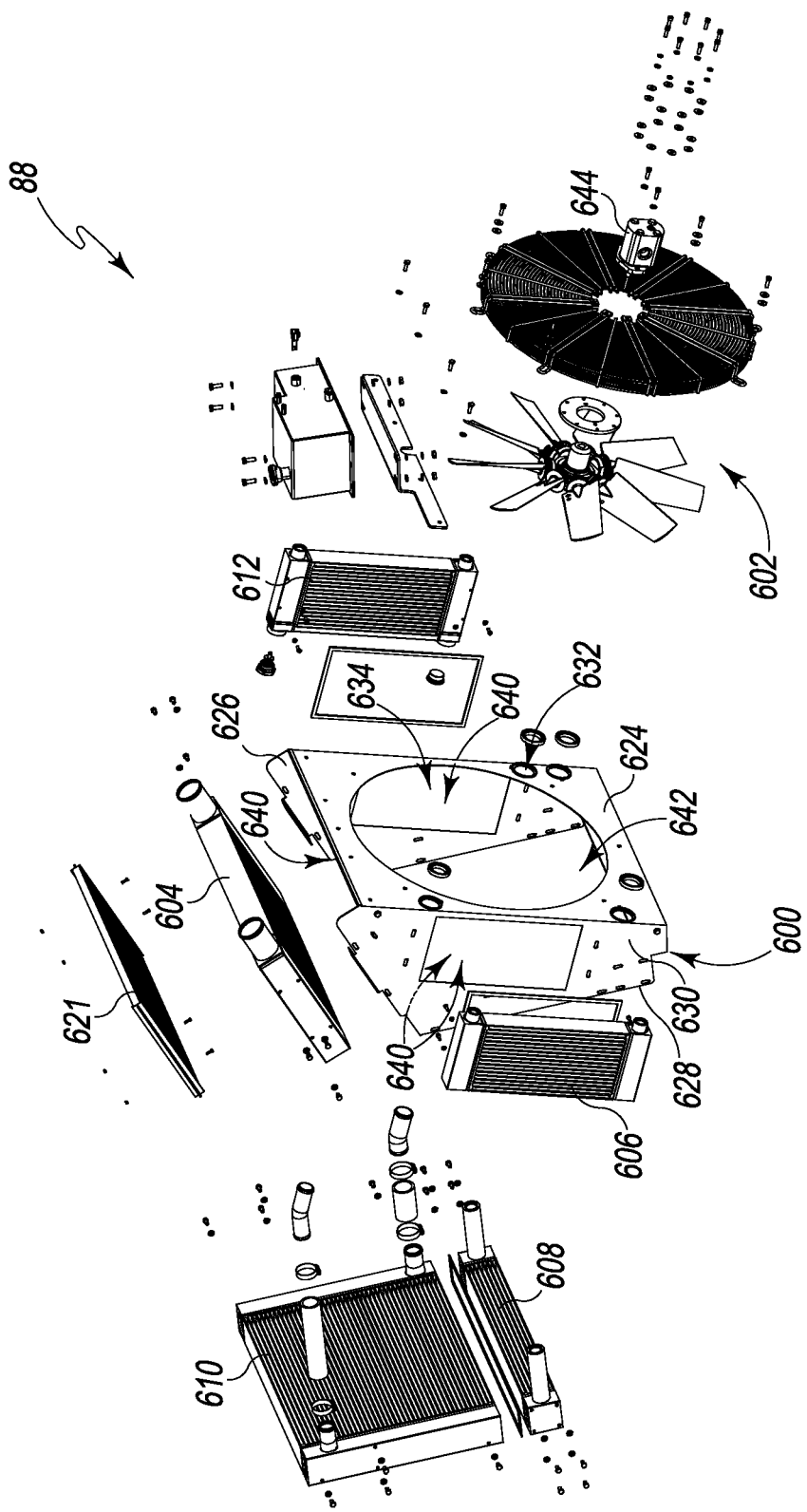
FIG. 57 is an exploded view of the cooling system of FIG. 52.

An exemplary embodiment of a heat exchange unit (e.g., heat exchange unit 610) is depicted in FIG. 55. Each heat exchange unit comprises a pair of header tanks 614, 616 linked by a cooling core 618. A first header tank 614 is attached to one side of the cooling core 618, and a second header tank 616 is attached to an opposing side of the cooling core 618. The first header tank 614 defines an interior fluid passage (not shown) that runs the length of the header tank 614 and an inlet opening 620 through which the fluid to be cooled is introduced into the fluid passage. The second header tank 616 defines an interior fluid passage (not shown) that runs the length of the header tank 616 and an outlet opening 622 through which the fluid in the header tank is discharged. The cooling core 618 includes a plurality of narrow tubes or conduits (not shown) that extend between and fluidly couple the interior passage of the first header tank 514 to the interior passage of the second header tank 516. The narrow tubes are spaced apart to allow the air to pass between the tubes and cool the fluid flowing through the tubes. Each heat exchange unit includes an air receiving surface 623 (FIG. 54) that arranged facing and generally perpendicular to the direction of air flow through the core 618.

The heat exchange unit housing 600 includes a rear housing portion 624, an upper front housing portion 626, a lower front housing portion 628, and a pair of lateral side housing portions 630, 632 that collectively surround and define a cooling chamber 634. The upper front and lower front housing portions 626, 628 are each oriented generally in the forward direction F. The rear housing portion 624 is oriented generally in the rearward direction B. The first lateral housing portion 630 is oriented in the first lateral direction Y, and the second lateral housing portion 632 is oriented in the second lateral direction R.

Each of the upper front, lower front, and lateral side housing portions 626, 628, 630, and 632 is generally planar and defines a heat exchange unit opening 640, or window, that communicates with the chamber 634. The rear housing portion 624 defines a fan opening 642 that also communicates with the air chamber 634. A heat exchange unit is secured to each of the upper front, lower front, and lateral side housing portions 626, 628, 630, and 632 over the corresponding heat exchange unit opening 640. The heat exchange units 608, 610 are both secured over the opening 640 defined in the lower front portion 628 of the housing with the heat exchange unit 608 being mounted over a lower portion of the opening and the heat exchange unit 610 mounted over an upper portion of the opening 640. The condenser heat exchange unit 621 is a thin unit that is mounted over the charge air heat exchange unit 604 over the opening defined in the upper front portion 626 of the housing.

The fan assembly 602 is secured to the rear housing portion 624 over the fan opening 642. As depicted, the fan 602 comprises an axial fan that is configured to create a vacuum in the cooling chamber to draw air from the chamber 634 along fan axis J and create a pressure drop in front of the heat exchange units 604, 606, 608, 610, and 612 in the chamber 634 that causes air to be drawn through the heat exchange units and into the chamber 634. In this embodiment, the fan 602 includes a hydraulic fan motor 644 that is fluidly coupled to the hydraulic drive system.

The cooling system 88 is mounted to the main frame 14 directly in front of the engine 44 in the engine compartment 16 in order to receive clean air that enters the engine compartment 16 through the grill structures 84 included in the hood panels 74, 76, 78, 80 of the hood assembly 72. The grill structures 84 direct air into the engine compartment 16. The top hood panel 74 includes two grill structures 84 that are arranged proximate the upper front housing portion 626, the front hood panel 76 includes three grill structures 84 that are arranged proximate the lower front housing portion 628, the first side hood panel 78 includes a grill structure 84 (FIG. 1) arranged proximate the first lateral side housing portion 630, and the second side hood panel 80 includes a grill structure 84 (FIG. 18) arranged proximate the second lateral side housing portion 632 of the heat exchange unit housing 600.

Figure 58:
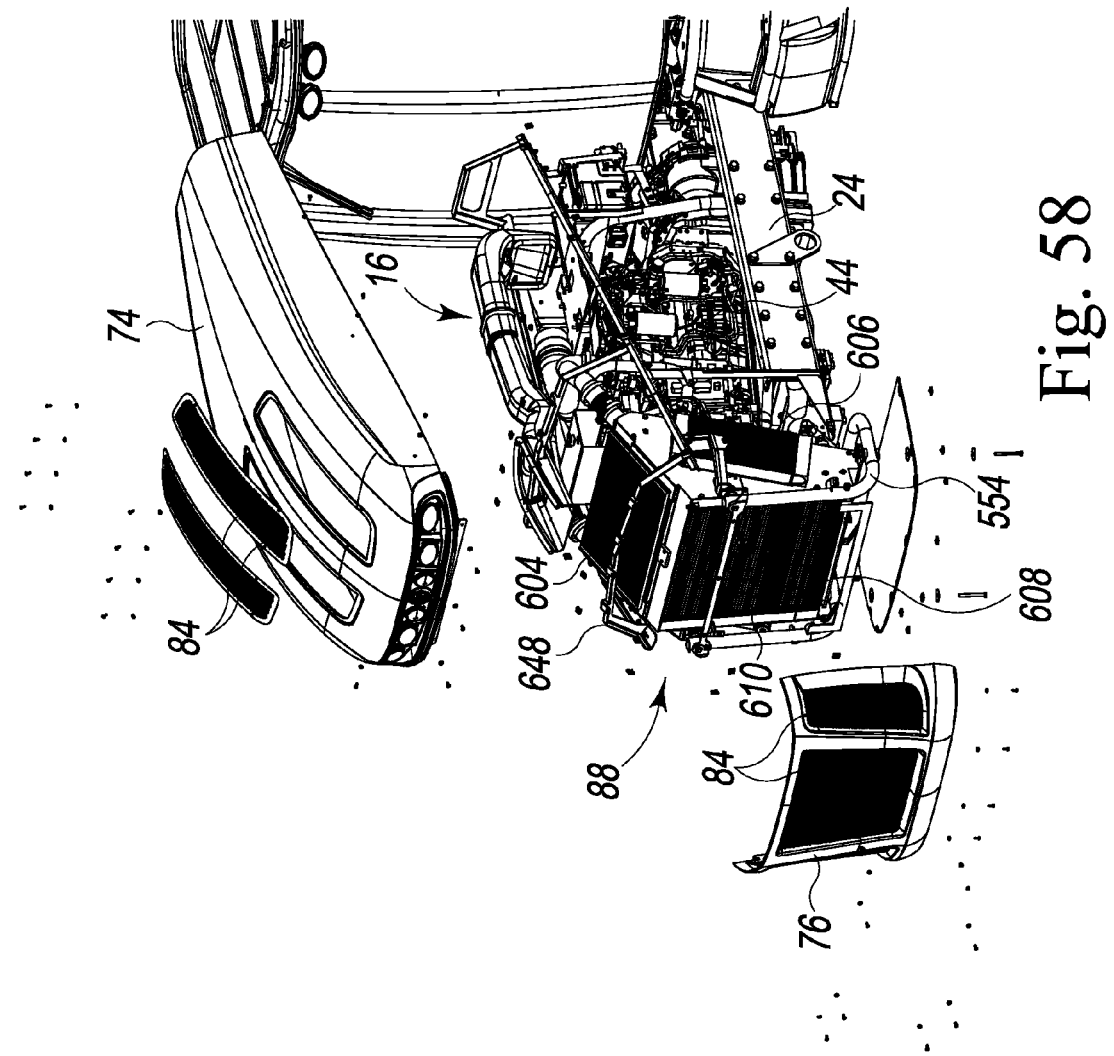
FIG. 58 is a perspective view showing the cooling system of FIG. 52 mounted at the front of the engine compartment in the crop sprayer.
Figure 59:
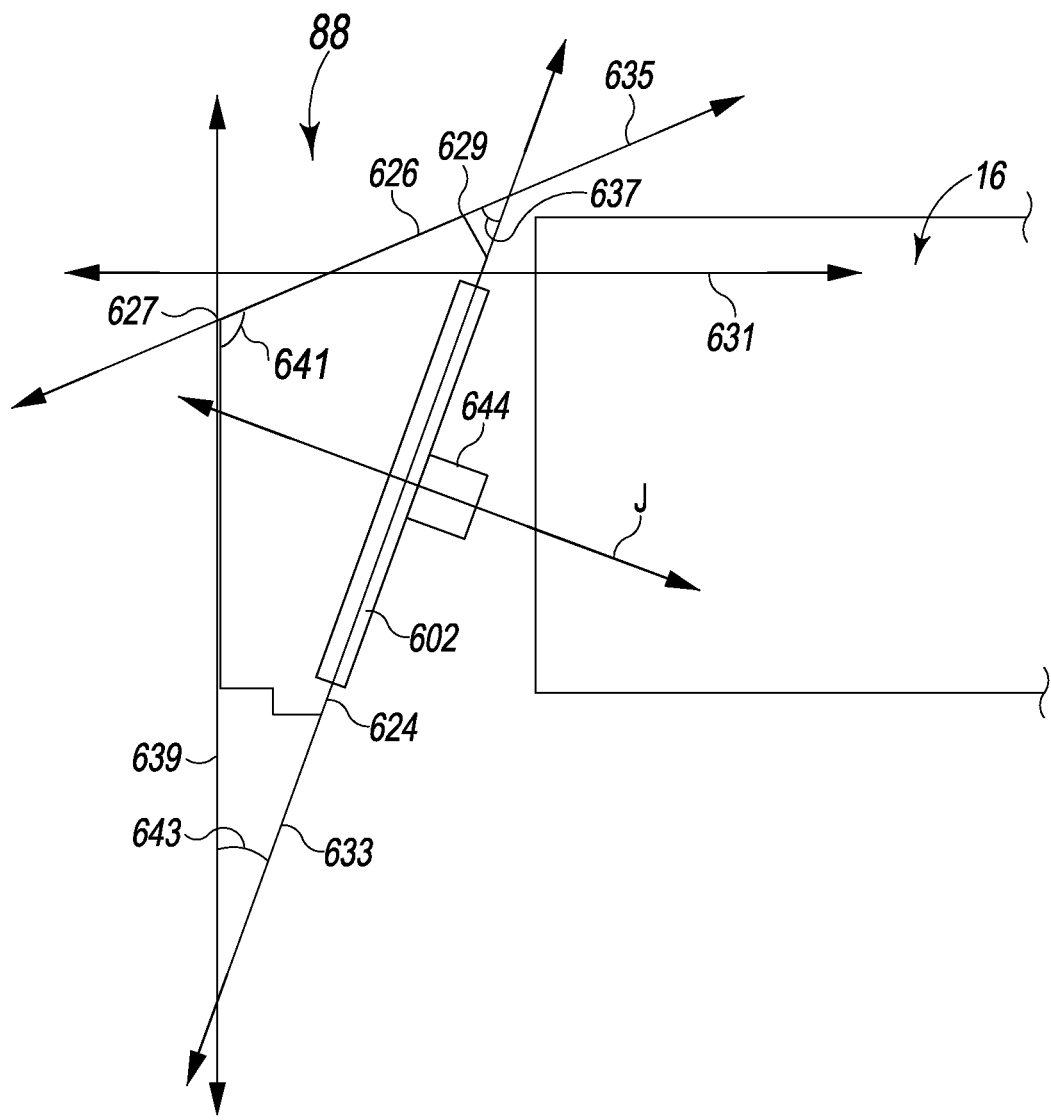
FIG. 59 is a schematic view of the cooling system of FIG. 52 in relation to the engine compartment of the crop sprayer.

As depicted in FIG. 58, the hood assembly 72 is attached over the engine compartment by a skeletal substructure 648. The substructure is arranged to closely conform to components of the engine compartment 16 to minimize the height and width of the hood assembly particularly at the front portion 28 of the crop sprayer. The cooling system 88 is mounted to the main frame 14 by a cooling system support member 554. The cooling system support 554 comprises a yoke-like bracket secured to the bolster assembly 520 at the front of the main frame 14. This mounting configuration allows the cooling system 88 to sit low in front of the engine 44 to allow the hood assembly 72 to slope downwardly toward the front portion 28 of the crop sprayer thereby minimizing the height of the hood assembly at the front of the crop sprayer so that the field of view of the operator is not adversely impacted. In addition, the tightly conforming hood panels position the grill structures and heat exchange units in close proximity which facilitates each heat exchange unit 604, 606, 608, 610, and 612 being exposed to a supply of clean, fresh air.

When the heat exchange units are mounted onto the heat exchange unit housing 600, the fluid inlets 620 and fluid outlets 622 of each of the heat exchange units are oriented in the same direction, i.e., toward the rear housing portion 624 which simplifies installation and service of the cooling system 88. The cooling system 88 can be accessed for service by removing one or more of the hood panels of the hood assembly 72 from the engine compartment 16. In addition, the box design of the heat exchange unit housing 500 allows all of the heat exchange units to be accessed separately without having to remove one heat exchange unit to access another heat exchange unit.

The cooling system is secured to the main frame 14 of the crop sprayer 10 with the lower front portion 628 arranged generally vertically. As a result, the upper front housing portion 626 slopes downwardly toward the front portion 28 of the crop sprayer and therefore has a minimal impact on the height of the hood assembly 72 at the front of the vehicle. In addition, the lower portion of the rear housing portion 624 is spaced farther apart from the engine compartment 16 which provides clearance for the fan assembly 602 to extend from the rear housing portion 624 in front of the engine compartment 16. For example, the fan assembly 602 includes an upper portion 603 and a lower portion 605. The upper portion of the fan assembly 602 is positioned completely rearward of a vertical plane 607, and the lower portion of the fan assembly is positioned completely forward of the vertical plane.

The heat exchange unit housing 600 has a configuration that helps to minimize the impact of the cooling system 88 on the size and dimensions of the hood assembly 72. For example, the upper front housing portion 626 is angled downwardly from the top portion of the rear housing portion 624. The upper front housing portion 626 includes a leading portion 627 and a trailing portion 629. The top heat exchange unit 604 and upper front housing portion 626 are configured and arranged so that the leading portion of the heat exchange unit and the front housing portion 626 are positioned below a horizontal plane 631, and the trailing portion 629 of the heat exchange unit 604 is positioned completely above the horizontal plane 631.

The rear housing portion 624 resides primarily in a plane 633, and the upper front housing portion 626 resides primarily in a plane 635. The upper front housing portion 626 is arranged with respect to the rear housing portion 624 such that plane 633 and plane 635 intersect to form an acute angle 637 with respect to each other. The lower front housing portion 628 is angled toward the rear housing portion 624 from the bottom portion of the upper front housing portion 626. The lower front housing portion 628 resides primarily in a vertical plane 639. The lower front housing portion 628 is arranged with respect to the upper front housing portion 626 such that the plane 635 and plane 637 form an obtuse angle 641 with respect to each other. In addition, the rear housing portion 624 and the lower front housing portion are arranged with respect to each other such that the plane 633 and the plane 639 intersect to form an acute angle 643 with respect to each other.

While the invention has been illustrated and described in detail in the drawings and foregoing description, the same should be considered as illustrative and not restrictive in character. It is understood that only the preferred embodiments have been presented and that all changes, modifications and further applications that come within the spirit of the invention are desired to be protected.

What is claimed is:

1. A crop sprayer, comprising:
    a main frame;
    a product tank supported by said main frame, said product tank configured to contain a first quantity of fluid therein;
    a cab supported by said main frame, said cab having a leading wall structure including a window, a trailing wall structure positioned in relation to said product tank so as to define a reservoir space therebetween, a left lateral wall structure including a first door, and a right lateral wall structure including a second door, and further said leading wall structure, said trailing wall structure, said left lateral wall structure, and said right lateral wall structure collectively define an operator space;
    a first platform having a first generally horizontally oriented foot support positioned adjacent to said first door;
    a second platform having a second generally horizontally oriented foot support positioned adjacent to said second door; and
    a hydraulic reservoir assembly positioned in said reservoir space and configured to contain a second quantity of fluid therein.
    wherein said hydraulic reservoir assembly includes i) a container configured to contain said second quantity of fluid therein, and ii) a third generally horizontally oriented foot support supported by said container in said reservoir space, and
        said hydraulic reservoir assembly further includes a strap i) positioned around said container, and ii) secured in relation to said main frame, and
        said strap is interposed between said container and said third generally horizontally oriented foot support.

2. The crop sprayer of claim 1, wherein said hydraulic reservoir assembly includes i) a container configured to contain said second quantity of fluid therein, and ii) a third generally horizontally oriented foot support supported by said container in said reservoir space.

3. The crop sprayer of claim 2, wherein:
    said first generally horizontally oriented foot support is located at a first vertical height in relation to said main frame;
    said second generally horizontally oriented foot support is located at a second vertical height in relation to said main frame,
    said third generally horizontally oriented foot support is located at a third vertical height in relation to said main frame,
    said third vertical height is greater than said first vertical height, and
    said third vertical height is greater than said second vertical height.

4. The crop sprayer of claim 3, wherein said first vertical height is approximately equal to said second vertical height.

5. The crop sprayer of claim 2, wherein each of said first generally horizontally oriented foot support, said second generally horizontally oriented foot support, said third generally horizontally oriented foot support includes a tread plate.

6. The crop sprayer of claim 1, wherein:
    said container has defined therein an exterior groove defined in at least an upper surface thereof,
    said third generally horizontally oriented foot support is supported on said upper surface thereof so as to define a gap therebetween, and
    said strap extends through said gap.

7. A crop sprayer, comprising:
a main frame;
a product tank supported by said main frame, said product tank configured to contain a first quantity of fluid therein;
a cab supported by said main frame, said cab having a leading wall structure including a window, a trailing wall structure positioned in relation to said product tank so as to define a reservoir space therebetween, a left lateral wall structure including a first door, and a right lateral wall structure including a second door, and further said leading wall structure, said trailing wall structure, said left lateral wall structure, and said right lateral wall structure collectively define an operator space;
a first platform having a first generally horizontally oriented foot support positioned adjacent to said first door;
a second platform having a second generally horizontally oriented foot support positioned adjacent to said second door; and
a hydraulic reservoir assembly positioned in said reservoir space and configured to contain a second quantity of fluid therein,
wherein said hydraulic reservoir assembly includes i) a container configured to contain said second quantity of fluid therein, and ii) a third generally horizontally oriented foot support supported by said container in said reservoir space,
wherein:
said first generally horizontally oriented foot support is located at a first vertical height in relation to said main frame;
said second generally horizontally oriented foot support is located at a second vertical height in relation to said main frame,
said third generally horizontally oriented foot support is located at a third vertical height in relation to said main frame,
said third vertical height is greater than said first vertical height, and
said third vertical height is greater than said second vertical height, and
wherein:
said product tank defines an access opening on an upper surface thereof through which fluid may be advanced,
said access opening is located at a fourth vertical height in relation to said main frame, and
said fourth vertical height is greater than said third vertical height.

8. The crop sprayer of claim 7, wherein:
said hydraulic reservoir assembly includes a container configured to contain said second quantity of fluid therein,
said container includes a leading wall structure, and
said leading wall structure is configured to conform to said cab.

9. The crop sprayer of claim 8, wherein said container is made from molded cross-linked polyethylene.

10. A crop sprayer, comprising:
a main frame;
a product tank supported by said main frame, said product tank configured to contain a first quantity of fluid therein;
a cab supported by said main frame, said cab having a leading wall structure including a window, a trailing wall structure positioned in relation to said product tank so as to define a reservoir space therebetween, a left lateral wall structure including a first door, and a right lateral wall structure including a second door, and further said leading wall structure, said trailing wall structure, said left lateral wall structure, and said right lateral wall structure collectively define an operator space;
a first platform having a first generally horizontally oriented foot support positioned adjacent to said first door;
a second platform having a second generally horizontally oriented foot support positioned adjacent to said second door; and
a hydraulic reservoir assembly positioned in said reservoir space and configured to contain a second quantity of fluid therein,
wherein:
said main frame includes i) a first main rail and a second main rail that are spaced apart from each other, and ii) a plurality of cross-members interconnecting said first main rail and said second main rail,
said hydraulic reservoir assembly includes a container configured to contain said second quantity of fluid therein,
said container includes i) an upper container portion including an upper left lateral part, an upper right lateral part, and an upper central part interposed therebetween, and ii) a lower container portion including a lower central part extending from said upper central part so as to be located below said upper central part,
said upper left lateral part is positioned above said first main rail,
said upper right lateral part is positioned above said second main rail, and
said lower central part is interposed between said first main rail and said second main rail.

* * * * *